United States Patent [19]
Cockburn

[11] Patent Number: 5,506,959
[45] Date of Patent: Apr. 9, 1996

[54] METHOD AND APPARATUS FOR TESTING ELECTRONIC MEMORIES FOR THE PRESENCE OF MULTIPLE CELL COUPLING FAULTS

[75] Inventor: Bruce F. Cockburn, Edmonton, Canada

[73] Assignee: Telecommunication Research Laboratories, Edmonton, Canada

[21] Appl. No.: 284,997

[22] Filed: Aug. 4, 1994

[51] Int. Cl.$^6$ .................................................. G11C 29/00
[52] U.S. Cl. .................................... 395/183.18; 365/201
[58] Field of Search .............................. 371/21.1, 21.2, 371/21.3, 10.1, 51.1; 364/265.3; 395/183.18; 365/201

[56] References Cited

U.S. PATENT DOCUMENTS

| | | | |
|---|---|---|---|
| 4,195,770 | 1/1980 | Benton et al. | 371/21 |
| 4,402,081 | 8/1983 | Ichimiya et al. | 371/21 |
| 4,404,519 | 9/1983 | Westcott | 324/73 |
| 4,414,665 | 11/1983 | Kimura et al. | 371/21 |
| 4,782,487 | 11/1988 | Smelser | 371/21 |
| 4,788,684 | 11/1988 | Kawaguchi et al. | 371/21 |
| 4,797,886 | 1/1989 | Imada | 371/27 |
| 4,827,476 | 5/1989 | Garcia | 371/25 |
| 4,872,168 | 10/1989 | Aadsen et al. | 371/21.3 |
| 5,033,048 | 7/1991 | Pierce et al. | 371/21.2 |
| 5,051,997 | 9/1991 | Sakashita et al. | 371/22.4 |
| 5,101,409 | 3/1992 | Hack | 371/21.3 |
| 5,138,619 | 8/1992 | Fasang et al. | 371/21.1 |
| 5,170,398 | 12/1992 | Fujieda et al. | 371/27 |
| 5,173,906 | 12/1992 | Dreibelbis et al. | 371/22.5 |
| 5,185,722 | 2/1993 | Ota et al. | 371/21.1 |
| 5,214,654 | 5/1993 | Oosawa | 371/21.1 |
| 5,224,101 | 6/1993 | Popyack, Jr. | 371/21.1 |
| 5,224,107 | 6/1993 | Mattes | 371/51.1 |
| 5,289,475 | 2/1994 | Slemmer | 371/21.1 |
| 5,377,148 | 12/1994 | Rajsuman | 371/21.2 |

OTHER PUBLICATIONS

Franklin et al. "An Algorithm to test reconfigured RAMS" 1994 IEEE pp. 359–364.

Chang et al. "Diagnosis and Repair of Memory with Coupling Faults" IEEE 1989 pp. 493–500.

Transparent Bist for Rams, M. Nicolaidis, International Test Conference 1992 Proceedings, "Discover the New World of (List continued on next page.)

*Primary Examiner*—Robert W. Beausoliel, Jr.
*Assistant Examiner*—Albert Décady
*Attorney, Agent, or Firm*—Anthony R. Lambert

[57] ABSTRACT

A method of testing a random access memory (RAM) for single V-coupling faults by establishing a first current value for each cell, for each cell and for each of m data backgrounds, generating a data bit corresponding to an element of an (n, V−1)-exhaustive matrix, and for each of m data backgrounds: (1) applying a read write sequence to each cell; and (2) for each background except the mth background, updating the current value of all cells according to the data bits corresponding to that cell; reading each cell of the RAM; and discarding or repairing the RAM if a cell coupling fault is apparent from the series of values read from the cells of the RAM. Data bits are generated by a matrix reconstruction method or a pseudo-random generator using a hashing of the address of the cell to which the data bit is to be applied. The logical function may be the element of the (n, V−1)-exhaustive matrix irrespective of the current of the cell or an exclusive-or of the complement of the background code logic bit and the first current value of the cell. Apparatus for testing a random access memory (RAM) has a PROM containing background code logic bits corresponding to an $(n_0, V−1)$-exhaustive matrix where $n_0 \leq n$, the matrix having $n_0$ rows and $m_0$ columns; and a data bit generator for generating data bits from the matrix stored in the PROM. A built in apparatus for testing a random access memory (RAM) having n cells includes a data bit generator that generates pseudo-random data bits from a hashing of the address of the RAM cell to which the data bit is to be applied.

27 Claims, 69 Drawing Sheets

OTHER PUBLICATIONS

Test and Design", Sep. 20–24, 1992, Baltimore, MD, U.S.A., Paper 31.1, pp. 598–607.

Deterministic Tests for Detecting Single V–Coupling Faults in RAMs*, B. F. Cockburn, Fifth Technical Workshop, "New Directions for Testing" Working Papers, Ottawa, Aug. 1–2, 1991, 21 pages.

A Test Generator IC for Testing Large CMOS–RAMs, Wilfried Daehn, Josef Gross, Proc. 1986 International Test Conference, Sep. 8–11, Washington, D.C. (IEEE Comp. Soc., 1986), Paper 1.2, pp. 18–24.

Iterative Exhaustive Pattern Generation for Logic Testing, D. T. Tang, C. L. Chen, IBM J. Res. Develop., vol. 28, No. 2, Mar., 1984, pp. 212–219.

Exhaustive Test Pattern Generation with Constant Weight Vectors, Donald T. Tang, Lin S. Woo, IEEE Transactions on Computers, vol. C–32, No. 12, Dec. 1983, pp. 1145–1150.

A 20 MHz Test Vector Generator for Producing Tests that Detect Single 4–and 5–Coupling Faults in RAMs*, Bruce F. Cockburn, from Records of the 1993 IEEE International Workshop on Memory Testing, San Jose, CA, U.S.A., Aug. 9–10, 1993, 5 pages.

A Transparent Built–In Self–Test Scheme for Detecting Single V–Coupling Faults in RAMs*, Bruce F. Cockburn and Y.–F. Nicole Sat, Manuscript submitted Jan. 16, 1994 IEEE International Workshop on Memory Technology, Design and Testing, helf Aug. 8–9, 1994, in San Jose, CA, U.S.A., 6 pages, unpublished.

Deterministic Tests for Detecting Single V–Coupling Faults in RAMs by B. F. Cockburn, Computer Engineering Technical Report CETR–92–200, Jul. 24, 1992, 23 pages.

Tutorial on the Design and Testing of Semiconductor Memory, Computer Engineering Technical Report CETR–93–201, Division of Computer Engineering, University of Alberta, Nov. 17, 1993.

A Transparent Built–In Self–Test Scheme for Detecting Single V–Coupling Faualts in RAMs*, Bruce F. Cockburn and Y.–F. Nicole Sat, included in the 1994 IEEE International Workshop on Memory Technology, Design and Testing, held Aug. 8–9, 1994, in San Jose, CA, U.S.A., 6 pages, published.

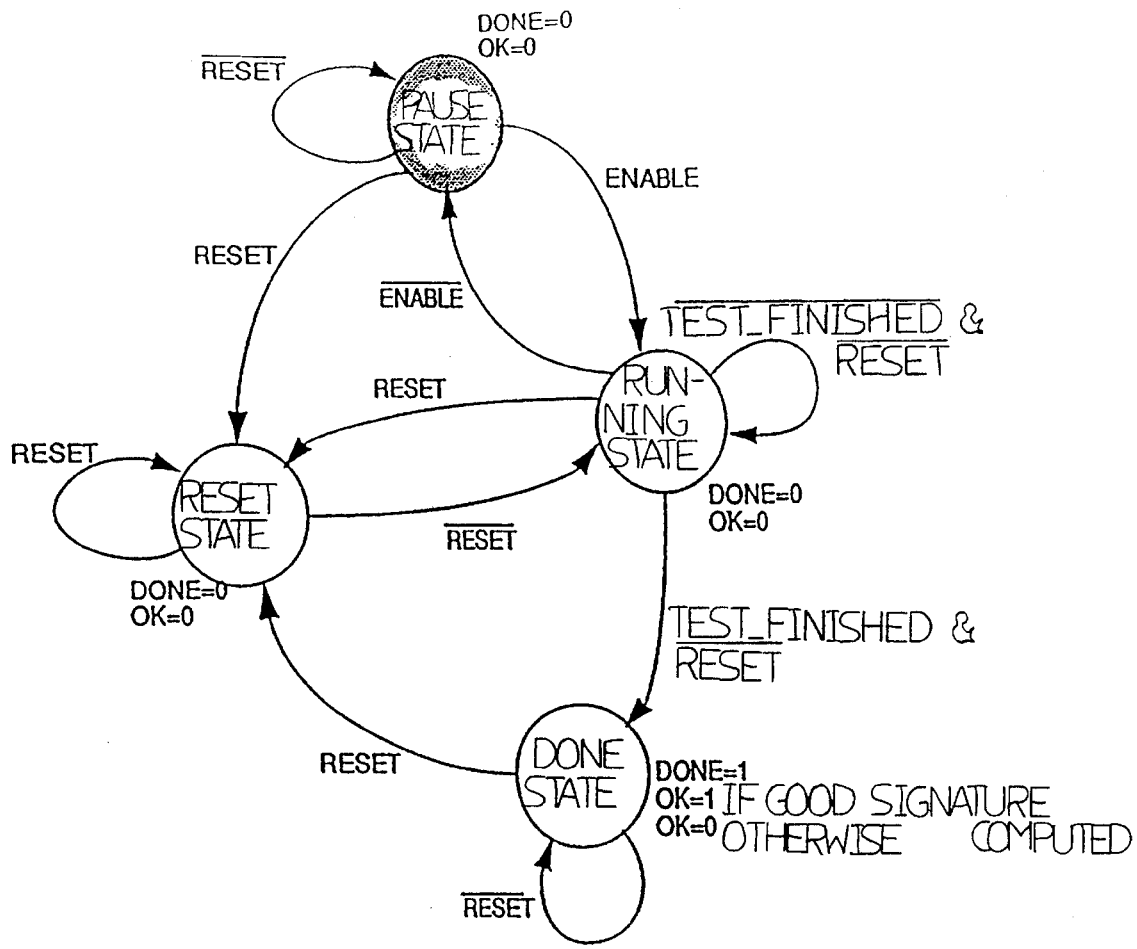
FIGURE 2: NORMAL MODE STATE DIAGRAM (TMODE=0)
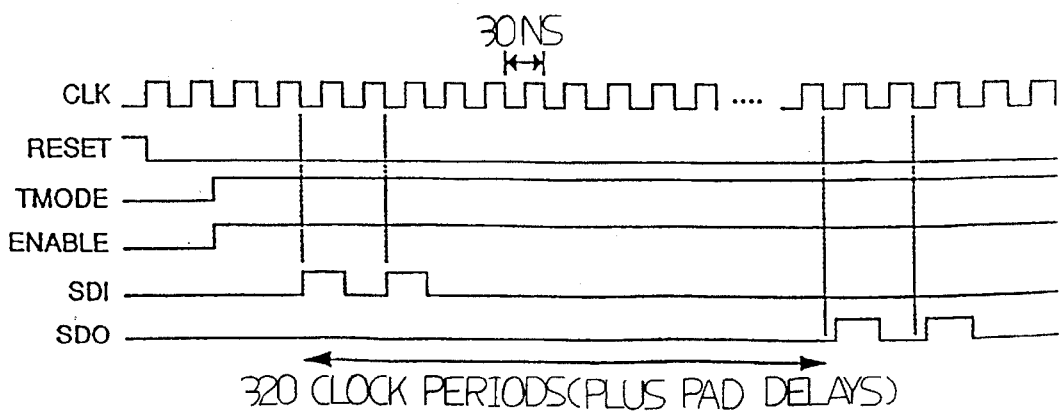
FIGURE 3

|  | Zone 0 | Zone 1 | Zone 2 | Zone 3 | Zone 4 |
|---|---|---|---|---|---|
|  | A | A | A | A | A |
|  | B | B | B | B | B |
|  | C | C | C | C | C |
|  | D | D | D | D | D |
|  | E | E | E | E | E |
|  | A | B | C | D | E |
|  | B | C | D | E | A |
|  | C | D | E | A | B |
|  | D | E | A | B | C |
|  | E | A | B | C | D |
|  | A | C | E | B | D |
|  | B | D | A | C | E |
|  | C | E | B | D | A |
|  | D | A | C | E | B |
|  | E | B | D | A | C |
|  | A | D | B | E | C |
|  | B | E | C | A | D |
|  | C | A | D | B | E |
|  | D | B | E | C | A |
|  | E | C | A | D | B |
|  | A | E | D | C | B |
|  | B | A | E | D | C |
|  | C | B | A | E | D |
|  | D | C | B | A | E |
|  | E | D | C | B | A |

| Row A |
|---|
| B |
| C |
| D |
| E |

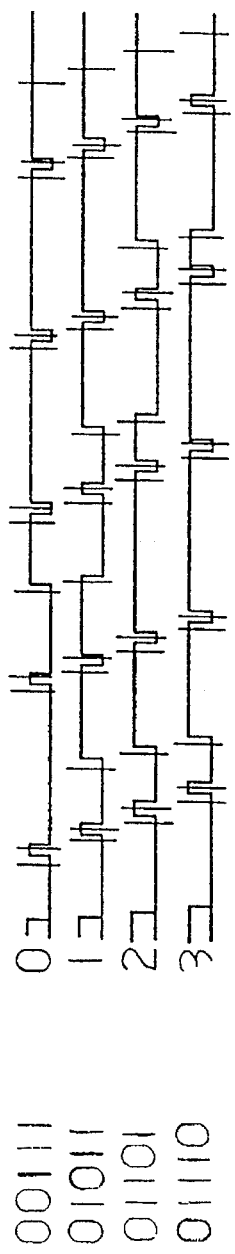
FIGURE 17A
00111
01011
01101
01110
FIGURE 17B
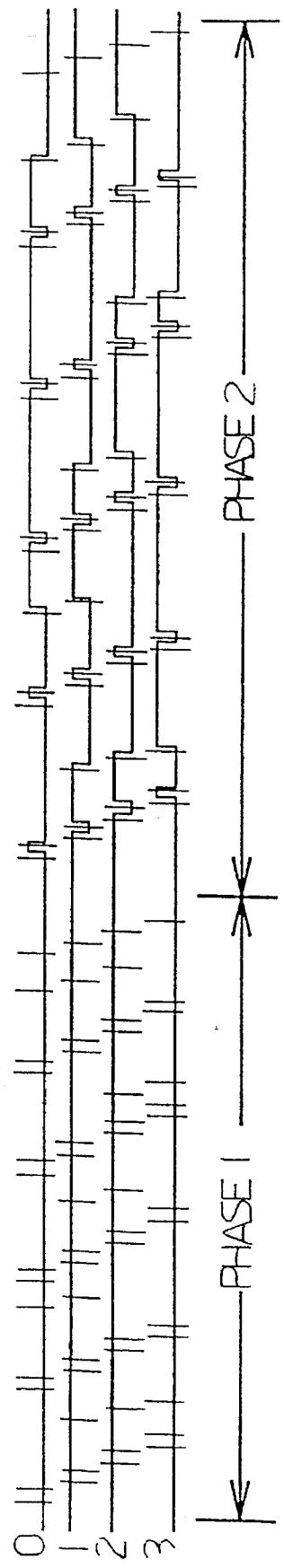
FIGURE 17C

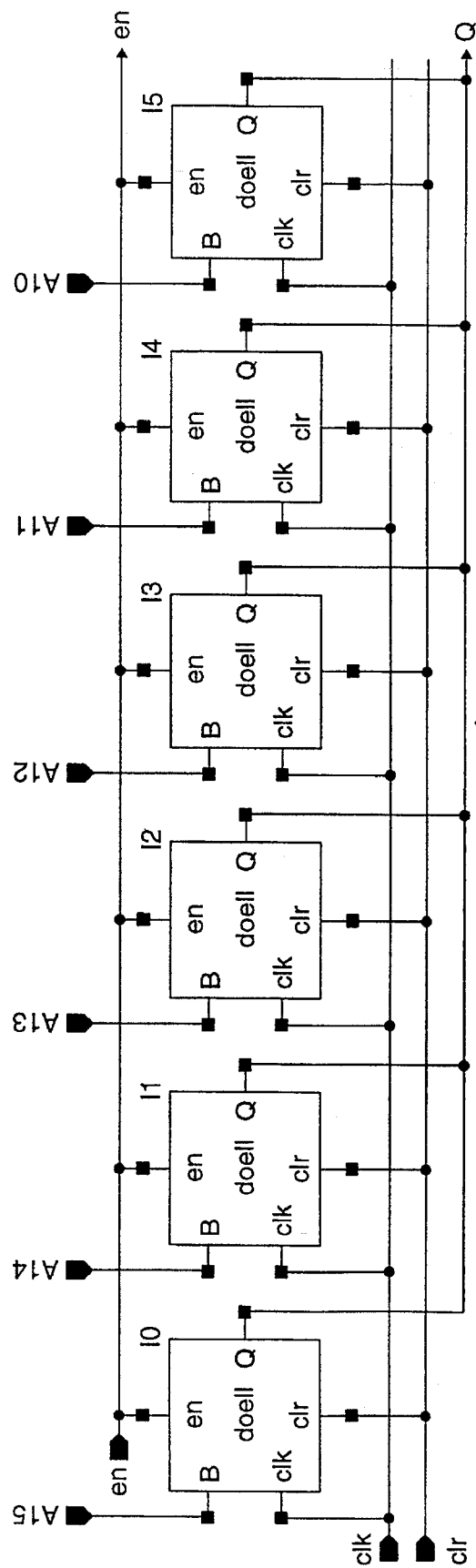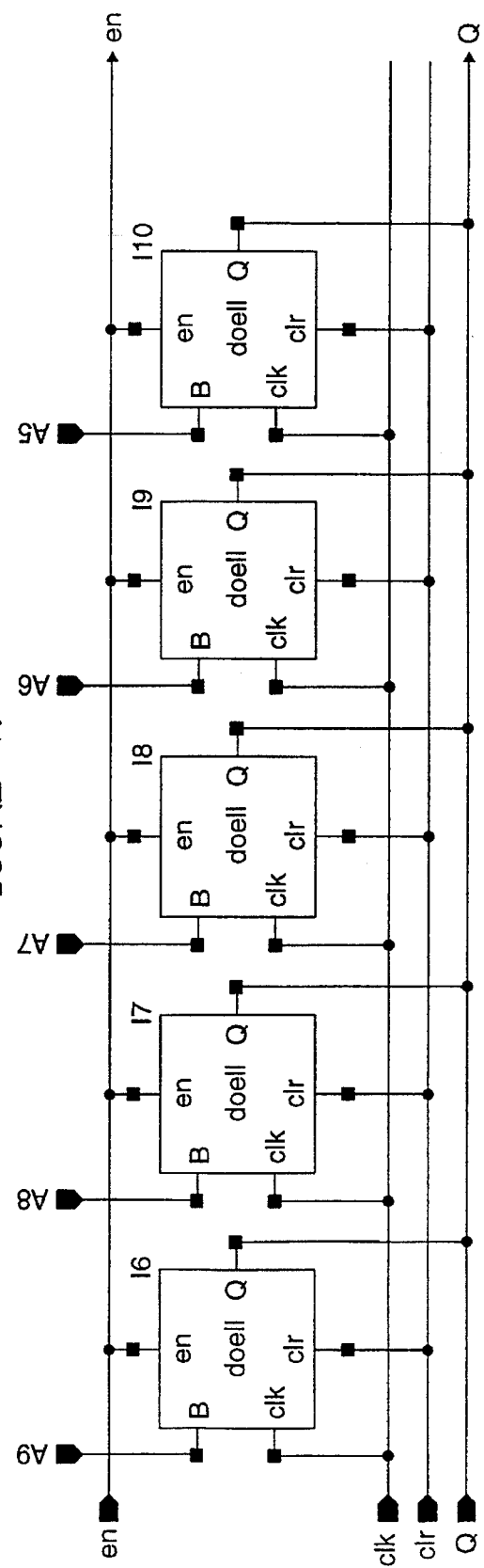
FIGURE 43A
FIGURE 43B

TABLE 1 PIN DESCRIPTIONS

| SYMBOL, PIN TYPE | NAME AND FUNCTION |
|---|---|
| ADDR0-23, OUTPUT | RAM UNDER TEST (RUT) ADDRESS: THE RUT ADDRESS LINES ARE OUTPUT FROM THESE PINS. AN ADDRESS IS VALID ONLY WHEN THE WAIT SIGNAL IS LOW. |
| PADDR0-17, 0 | PROM ADDRESS: THE PRESENT LOOK-UP PROM ADDRESS IS SELECTED BY THESE LINES. |
| PDATA0-15, INPUT | PROM DATA: THE 16-BIT PROM DATA IS RETURNED TO THE CHIP VIA THESE LINES. |
| TEST0-4, 1 | TEST SELECTION: ONE OF 32 POSSIBLE TESTS IS SELECTED BY SETTING THESE LINES TO THE CORRECT STATE UPON TEST START-UP. |
| CLOCK, 1 | SYSTEM CLOCK: ALL INTERNAL CLOCKING IN THE SEQUENCER CHIP IS DERIVED FROM THIS SIGNAL. THE CLOCK SIGNAL SHOULD BE A 50% DUTY CYCLE FREE-RUNNING SIGNAL. A MAXIMUM FREQUENCY OF 36 MHZ IS ALLOWED. |
| TMODE, 1 | TEST MODE SELECT: WHEN ASSERTED THIS PIN PLACES THE CHIP IN SELF-TEST MODE. IN TEST MODE, SCAN CHAIN DATA CAN BE SHIFTED OUT OF THE CHIP, AS NEW DATA IS SCANNED IN. THIS PIN DISABLES THE NORMAL CLOCKING OF THE CHIP, AND ENABLES THE INTERNAL TEST CLOCK. |
| ENABLE, 1 | CHIP ENABLE (PAUSE): WHILE THIS PIN IS ASSERTED (HIGH), THE CHIP IS OPERATIONAL. IF THE PIN IS SET LOW, CHIP OPERATION IS HALTED AT THE NEXT FALLING EDGE OF THE CLOCK LINE. OPERATION CAN BE RESTARTED BY REASSERTING ENABLE. |

FIGURE 51

TABLE 1 PIN DESCRIPTIONS

| SYMBOL, PIN TYPE | NAME AND FUNCTION |
|---|---|
| RESET, 1 | CHIP RESET: THIS SIGNAL PLACES THE CHIP IN ITS INITIAL START-UP MODE. THE RESET PROCEDURE IS DESCRIBED LATER IN THIS DOCUMENT. |
| SDI, 1 | SERIAL TEST DATA INPUT: SCAN CHAIN DATA IS SERIALLY READ IN FROM THIS PIN. |
| SDO, 0 | SERIAL TEST DATA OUTPUT: SCAN CHAIN DATA IS SERIALLY DRIVEN OUT FROM THIS PIN. |
| DATA, 0 | RUT DATA BIT: THE DATA WHICH IS TO BE COMPARED TO THE DATA OUTPUT FROM THE RUT OR WRITTEN TO THE RUT IS OUTPUT ON THIS PIN. DATA IS ONLY VALID WHEN THE WAIT LINE IS LOW. |
| OK, 0 | CHIP OK: WHEN THE CHIP COMPLETES A TEST, OK IS ASSERTED (HIGH) IF THE INTERNAL SIGNATURE REGISTER VALUE MATCHES THE EXPECTED VALUE AS STORED IN THE PROM LOOK-UP TABLE. OTHERWISE, OK REMAINS DEASSERTED. |
| DONE, 0 | TEST DONE: WHEN THE CHIP HAS FINISHED SENDING TEST DATA, THIS LINE IS ASSERTED. AT THIS POINT, THE CHIP REMAINS IN A WAIT STATE UNTIL IT IS RESET IN PREPARATION FOR THE NEXT TEST. |
| R/W, 0 | RUT R/W: THIS LINE IS HIGH WHEN THE RUT IS TO BE READ, AND IS LOW WHEN THE RUT IS TO BE WRITTEN. THE VALUE OF THIS PIN IS ONLY VALID WHEN THE WAIT LINE IS ACTIVE. |

FIGURE 52

TABLE 1 PIN DESCRIPTIONS

| SYMBOL, PIN TYPE | NAME AND FUNCTION |
|---|---|
| WAIT, 0 | IGNORE CURRENT RUT DATA/ADDRESS: THIS PIN INFORMS THE REST OF THE TESTER SYSTEM THAT THE SEQUENCER CHIP RUT OUTPUTS ARE CURRENTLY INVALID. THIS IS EITHER CAUSED BY CHIP RESET AND START-UP, BY THE END OF A TEST SEQUENCE, OR IF THE CHIP IS UNABLE TO PROVIDE AN RUT OPERATION FOR THAT CLOCK CYCLE. |
| VDDCORE, 1 | CHIP CORE POWER |
| GNDCORE, 1 | CHIP CORE GROUND |
| VDDRING, 1 | CHIP RING POWER: THE RING POWER SUPPLIES TO THE CHIP PADS. THESE ARE INDEPENDENT OF THE CORE POWER. |
| GNDRING, 1 | CHIP RING GROUND: THE RING GROUND SUPPLIES TO THE CHIP PADS. THESE ARE INDEPENDENT OF THE CORE GROUND. |

FIGURE 53

TABLE 2: DESCRIPTION OF CODE LOCATION RECORD FIELDS

| FIELD NAME | DESCRIPTION |
| --- | --- |
| MAXRUTADDR0-23 | THIS FIELD CONTAINS THE LARGEST RUT ADDRESS; I.E., ONE LESS THAN THE NUMBER OF WORDS IN THE RUT'S ADDRESS SPACE. |
| STARTADDR0-17 | THIS FIELD CONTAINS THE PROM ADDRESS OF THE FIRST WORD OF THE CODE TO BE USED AS THE BASIS OF TEST I. THIS IS THE STARTING ADDRESS OF THE BASE MATRIX. |
| MAXBGNUM0-10 | THIS FIELD CONTAINS THE VALUE OF THE LARGEST BACKGROUND NUMBER, WHICH IS EQUAL TO ONE LESS THAN THE LENGTH OF THE CODE. THIS VALUE WILL BE USED TO DETERMINE HOW MANY BACKGROUNDS ARE IN EACH ZONE OF THE FINAL TEST SEQUENCE. |
| BLKSIZE0-10 | THE BLKSIZE IS THE DIFFERENCE IN THE PROM ADDRESSES OF ADJACENT BITS WITHIN A CODEWORD. |
| OFFSET0-10 | THIS FIELD HOLDS THE VALUE OF THE OFFSET INTO THE CODE USED WHEN THE CHIP IS USED IN PARALLEL MODE. IF THE SEQUENCER CHIP IS USED IN STAND-ALONE MODE (AS OPPOSED TO PARALLEL MODE) THIS FIELD IS ALL ZEROS.* |
| MAXWORD0-10 | THIS IS THE LARGEST WORD OFFSET FROM THE STARTADDR THAT IS TO BE USED IN THE CODE.** |

FIGURE 54

TABLE 2: DESCRIPTION OF CODE LOCATION RECORD FIELDS

| FIELD NAME | DESCRIPTION |
| --- | --- |
| VBIT | IF THE VBIT IS SET TO ZERO, THEN THE TEST WILL CONTAIN 3 ZONES (WHEN TESTS FOR 4-COUPLING FAULTS ARE BEING GENERATED). OTHERWISE, IF VBIT IS SET TO ONE, THEN THE TEST WILL CONTAIN 5 ZONES (WHEN TESTS FOR 5-COUPLING FAULTS ARE BEING GENERATED). |
| MAXBITNUM0-4 | THE IS THE MAXIMUM BIT NUMBER IN A WORD (1,2,...,31 WHICH IS ALWAYS ONE LESS THAN THE TOTAL NUMBER OF BITS PER WORD) OF THE RAM UNDER TEST. THIS FIELD IS NOT USED IN STAND-ALONE MODE. |
| SIGNATURE0-15 | THE SIGNATURE REGISTER VALUE CORRESPONDING TO AN ERROR-FREE GENERATION OF THE STORED TEST IS KEPT IN THIS FIELD. THIS VALUE IS COMPARED TO THE RESULTING SIGNATURE AFTER A TEST IS COMPLETED TO HELP DETERMINE IF THE SEQUENCER CHIP IS PERFORMING PROPERLY. |
| MYBITNUM0-4 | THIS FIELD CONTAINS THE BIT NUMBER IN THE WORD SPACE OF THE RUT THAT IS BEING TESTED BY THIS CHIP. THAT IS, IF THERE ARE 8 BITS PER RUT WORD, THIS CHIP COULD BE TESTING ANY OF THE BITS BETWEEN 0 AND 7. SEVEN OTHER CHIPS WOULD ALSO BE NEEDED TO TEST THE OTHER BITS IN PARALLEL. THIS FIELD IS ONLY USED IN PARALLEL MODE. |

FIGURE 55

TABLE 2: DESCRIPTION OF CODE LOCATION RECORD FIELDS

\* THE OFFSET FIELD IS USED TO DETERMINE THE BEGINNING OFFSET ADDRESS INTO A BLOCK WHICH IS TO BE USED BY THE CHIP. CONSIDER THE EXAMPLE SHOWN BELOW IN FIGURE 9. THE EXAMPLE SHOWS LOCATIONS FOR OFFSET AND MAXWORD FOR A PROM THAT IS FOR THE BIT 1 SEQUENCER CHIP. A SINGLE BLOCK MUST BE LONG ENOUGH TO BE DIVIDED EQUALLY INTO K PARTS, WITH NO OVERLAPPING OF SUB-BLOCKS. THE OFFSET FIELD DEFINES THE BEGINNING OF THE SUB-BLOCK THAT IS TO BE USED BY THE CHIP IN QUESTION.

\*\* THE MAXWORD FIELD DEFINES THE END OF THE SUB-BLOCK THAT IS TO BE USED BY THE CHIP. THE SUB-BLOCK SIZE SHOULD BE THE SAME FOR EACH GENERATOR IN THE PARALLEL SYSTEM.

FIGURE 56

TABLE 3: MAIN CONTROLLER SIGNAL DESCRIPTIONS

| SYMBOL | TYPE | NAME AND FUNCTION |
|---|---|---|
| SDI, CLOCK, TMODE, ENABLE, RESET, PDATA0-15 | INPUTS FROM PADS | SEE TABLE 1. |
| STARTINIT | OUTPUT TO PAG | START INITIALIZE: SIGNALS THE PAG TO BEGIN INITIALIZING ITS REGISTERS. |
| TOPPRESCOL | OUTPUT TO PAG | TOP OF PRESENT COLUMN: SIGNAL TO THE PAG THAT IT IS TO FETCH THE DATA FOR THE TOP OF THE PRESENT COLUMN IN THE TEST MATRIX. |
| TOPNEXTCOL | OUTPUT TO PAG | TOP OF NEXT COLUMN: SIGNAL TO THE PAG THAT IT IS TO FETCH THE DATA FOR THE TOP OF THE NEXT COLUMN IN THE TEST MATRIX. |
| TOPFIRSTCOL | OUTPUT TO PAG | TOP OF FIRST COLUMN: SIGNAL TO THE PAG THAT IT IS TO FETCH THE DATA FOR THE TOP OF THE FIRST COLUMN OF THE CURRENT ZONE IN THE TEST MATRIX. |
| LASTZONECOL | INPUT FROM PAG | LAST ZONE COLUMN: STATUS SIGNAL FROM THE PAG INDICATING THAT IT IS IN THE LAST COLUMN OF THE CURRENT ZONE. |
| FIRSTZONECOL | INPUT FROM PAG | FIRST ZONE COLUMN: STATUS SIGNAL FROM THE PAG INDICATING THAT IT IS IN THE FIRST COLUMN OF THE CURRENT ZONE. |

FIGURE 57

TABLE 3: MAIN CONTROLLER SIGNAL DESCRIPTIONS

| SYMBOL | TYPE | NAME AND FUNCTION |
|---|---|---|
| LASTCOL | INPUT FROM PAG | LAST COLUMN: STATUS SIGNAL FROM THE PAG INDICATING THAT IT IS IN THE LAST COLUMN OF THE TEST MATRIX. |
| TESTOUT | OUTPUT TO PAG | SERIAL TEST DATA OUTPUT: SCAN CHAIN DATA IS SERIALLY OUTPUT FROM THIS LINE. |
| INIT | OUTPUT TO PAG | INITIALIZE: INDICATES THAT THE PAG IS TO GENERATE THE ADDRESSES OF THE CODE LOCATION RECORD INFORMATION POINTED TO BE THE TEST LINES. |
| RDY | INPUT FROM PAG | READY: STATUS SIGNAL FROM THE PAG INDICATING THAT THE PROM DATA CAN BE LATCHED, AND THAT THE PAG CAN BE REQUESTED TO GENERATE ANOTHER PROM ADDRESS. |
| QRDY | INPUT FROM DQ | QUEUE READY: STATUS SIGNAL FROM THE DQ INDICATING THAT IT IS READY TO GENERATE ANOTHER BIT OF RUT DATA. |
| N | OUTPUT FROM DQ | NEXT BIT: WHEN THIS LINE IS ASSERTED BY THE MC, THE DQ WILL TRY TO GENERATE ANOTHER DATA BIT FOR THE RAG, ALONG WITH THE CORRESPONDING AMOUNT TO INCREMENT THE RUT ADDRESS. |

FIGURE 58

TABLE 3: MAIN CONTROLLER SIGNAL DESCRIPTIONS

| SYMBOL | TYPE | NAME AND FUNCTION |
|---|---|---|
| DIFF | INPUT FROM DQ | DIFFERENT: STATUS SIGNAL FROM THE DQ THAT INDICATES WHETHER THE CURRENT DATA BIT IS DIFFERENT FROM THE SAME BIT IN THE PREVIOUS BACKGROUND. |
| INV | OUTPUT TO DQ | INVERT DATA BIT: OUTPUT TELLS THE DQ TO INVERT THE PRESENT DATA BIT. |
| SKIP | OUTPUT TO DQ | SKIP MODE: OUTPUT THAT ENABLES SKIPPING IN THE DQ. |
| R/W | OUTPUT TO RAG | READ/WRITE: THIS LINE INDICATES TO THE RAG WHAT TYPE OF TEST VECTOR OPERATION TO OUTPUT, EITHER A READ OR A WRITE. |
| ALLONES | OUTPUT TO RAG | INITIALIZE RUT ADDRESS: ASSERTED TO REQUEST THAT THE RAG RESET THE RUT ADDRESS COUNTER. |
| LASTRUTADDR | INPUT FROM RAG | LAST RUT ADDRESS: IF THE RAG HAS LOADED AN ADDRESS WHICH IS GREATER THAN OR EQUAL TO THE LARGEST RUT ADDRESS, THIS STATUS LINE IS ASSERTED. |
| WAIT | OUTPUT TO RAG | WAIT:THIS SIGNAL IS ASSERTED WHEN THE MC VOTES FOR THE EXTERNAL WAIT* SIGNAL TO BE ASSERTED. THE MC'S REQUEST FOR A WAIT STATE CAN BE OVERRIDDEN BY THE RAG. |

FIGURE 59

TABLE 3: MAIN CONTROLLER SIGNAL DESCRIPTIONS

| SYMBOL | TYPE | NAME AND FUNCTION |
|---|---|---|
| DONE | OUTPUT TO RAG | TEST DONE: WHEN THE MC FINDS THAT THE CURRENT TEST IS COMPLETED, THIS SIGNAL IS ASSERTED AND LEFT FOR THE RAG TO OUTPUT TO THE PADS. |
| LDREG0-7 | OUTPUT TO RAG, DQ, PAG | LOAD PROM REGISTER: THESE EIGHT LINES ARE SIGNALS THAT INDICATE WHICH CODE LOCATION RECORD ADDRESS IS VALID ON THE PDATA LINES. FOR EXAMPLE, WHEN LDREG0 IS HIGH, DATA FROM THE FIRST LOCATION IN THE CODE LOCATION RECORD CAN BE LOADED DURING THAT CLOCK PERIOD. |
| TCLK! | FROM CLK GEN | TEST CLOCK:GLOBAL NETWORK OUTPUT FOR THE TEST MODE CLOCK. |
| CLK! | FROM CLK GEN | GLOBAL SYSTEM CLOCK: GLOBAL NETWORK OUTPUT FOR CLOCK. (SINGLE EDGE CLOCKING SCHEME) |
| CLR! | GLOBAL NET | GLOBAL CLEAR: GLOBAL NETWORK SIGNAL TO CLEAR ALL REGISTERS (ALL CLEAR OPERATIONS DONE SYNCHRONOUSLY). |

FIGURE 60

TABLE 4: PROM ADDRESS GENERATOR SIGNAL DESCRIPTIONS

| SYMBOL | TYPE | NAME AND FUNCTION |
|---|---|---|
| GO | INPUT FROM DQ | FETCH NEXT ADDRESS: THE DQ ASSERTS THIS LINE WHEN IT HAS LATCHED THE CURRENT WORD AND IS REQUESTING ANOTHER TO BE FETCHED BY THE PAG. |
| STOPBIT0-3 | OUTPUTS TO DQ | STOP BIT LOCATION: THESE LINES INDICATE TO THE DQ WHICH BIT IN THE CURRENT WORD IS THE LAST VALID BIT OF THE WORD. |
| BITOFFSET0-2 | OUTPUTS TO DQ | BIT OFFSET VALUE: THESE LINES INDICATE TO THE DQ WHICH BIT IN THE CURRENT WORD IS THE FIRST VALID BIT OF THE WORD. |
| FLUSH | OUTPUT TO DQ | FLUSH QUEUE: WHEN THE PAG SHIFTS TO TOP OF A COLUMN, OR IS INITIALIZED, IT ASSERTS THE FLUSH SIGNAL WHICH INDICATES THAT THE DQ SHOULD JUMP TO ITS INITIAL STATE. |
| TEST0-4 PDATA0-15, PADDR0-17 | INPUTS FROM PADS | SEE TABLE 1. |
| ZONE0-4 | OUTPUTS TO RAG | ZONE: STATUS LINES WHICH INDICATE TO THE RAG WHICH ZONE OF THE TEST MATRIX THAT THE PAG IS IN. |

FIGURE 61

TABLE 5: DATA QUEUE SIGNAL DESCRIPTIONS.

| SYMBOL | TYPE | NAME AND FUNCTION |
| --- | --- | --- |
| RUTINC | OUTPUT TO RAG | RUT ADDRESS COUNTER INCREMENT: THIS SIGNAL IS ASSERTED WHEN THE RAG IS TO INCREMENT ITS RUT ADDRESS COUNTER BY THE AMOUNT INDICATED BY THE RUTADDRINC LINES. |
| RUTADDRINC0-2 | OUTPUT TO RAG | RUT ADDRESS INCREMENT VALUE: THESE LINES HOLD THE AMOUNT THAT THE RUT ADDRESS COUNTER IS TO BE INCREMENTED BY. |
| PDATABIT | OUTPUT TO RAG | PROM DATA BIT: THIS LINE IS USED TO SEND THAT DATA BIT FOR THE CURRENT TEST VECTOR BEING REFERRED TO BY THE DQ. THE RAG USES THIS INFORMATION WHEN IT OUTPUTS THE TEST VECTOR TO THE PADS. |

FIGURE 62

TABLE 6: RUT ADDRESS GENERATOR
INTERNAL SIGNAL DESCRIPTIONS

| SYMBOL | TYPE | NAME AND FUNCTION |
| --- | --- | --- |
| ADDR0-23*, WAIT*, R/W*, PDATABIT* | OUTPUTS TO PADS | SEE TABLE 1. |
| OK,DONE,SDO | OUTPUTS TO PADS | SEE TABLE 1. |

\* THESE SIGNALS ARE COMBINED TO FORM CURRENT THE TEST VECTOR.

FIGURE 63

METHOD AND APPARATUS FOR TESTING ELECTRONIC MEMORIES FOR THE PRESENCE OF MULTIPLE CELL COUPLING FAULTS

FIELD OF THE INVENTION

This invention relates to methods and apparatus for testing electronic memories.

BACKGROUND OF THE INVENTION

Electronic memories suffer several types of faults when data is written to them. Testing for these faults is very difficult, and particularly poses a problem when it is desired to build testing capability into the electronic memory itself.

A very general fault type that can model most of the reported erroneous interactions involving $V \geq 2$ arbitrary RAM storage cells is the single V-coupling fault defined by Nair, Thatte, and Abraham ("Efficient Algorithms for Testing Semiconductor Random-Access Memories," IEEE Trans. on Comp., v. C-27, no. 6, pp. 572–576, June 1978). Nair, Thatte, and Abraham defined the single V-coupling fault to represent the situation when $V \geq 2$ cells, say cells $i_1$, . . . ,$i_v$, interact erroneously as follows: if cells $i_1, \ldots, i_v$ contain V particular values $b_1, \ldots, b_v$, and if cell $i_1$ is written to $-b_1$, then the contents of both cells $i_1$ and $i_2$ are changed. A particular case, the 5-coupling fault, can be used to model active neighborhood pattern-sensitive faults (ANPSFs) as defined by Suk and Reddy ("Test Procedures for a Class of Pattern-Sensitive Faults in Semiconductor Random-Access Memories," IEEE Trans. on Comp., v. C-29, no. 6, pp. 419–429, June 1980); this follows because every ANPSF is also a 5-coupling fault. Testing for 5-coupling faults is in fact equivalent to testing for ANPSFs when there is no knowledge of the mapping from logical cell addresses to physical cell locations.

Efficient tests for detecting ANPSFs, such as Suk and Reddy's TANPSF1, presuppose knowledge of the address mapping. However, the mapping is often not readily available due to vendor secrecy and unannounced layout changes. A further complication is that the widespread use of redundant rows and/or columns to repair defective RAMs disturbs the address mapping in different ways for each RAM die. Indeed, in RAMs with multiple sub-arrays, the address mapping is likely to be different in each sub-array. Testing for V-coupling faults avoids the address mapping problem altogether because the fault model is independent of the physical arrangement of the cells.

In addition, RAMs are often embedded in larger integrated circuits (ICs) such as microprocessors and digital communications ICs; this practice can cause problems at test time because access to the RAM inputs and outputs for testing purposes is often difficult or impractical. RAMs provided with built-in self-test (BIST) such as the design proposed by Dekker et al (R. Dekker, F. Beenker, and L. Thijssen, "A Realistic Self-Test Machine for Static Random Access Memories," Proc. 1988 Int. Test Conf., Sept. 12–14, 1988, pp. 353–361, Washington, D.C., U.S.A., (IEEE Comp. Soc.)), tackle this problem by avoiding the necessity of routing test data to and from the RAM through intervening logic. A second RAM testing challenge is that it is often desirable to increase a system's effective reliability by periodically testing its memory while the system is in service. Nicolaidis ("Transparent BIST for RAMs," Proc. 1992 Int. Test. Conf., Baltimore, Md., U.S.A., Sept. 20–24, (IEEE Comp. Soc., Washington,1992), pp. 598–607) tackled this additional problem by developing a method whereby the self-test routine produced by a BIST RAM is made transparent, that is, the contents of the RAM initially present when the self-test was started are restored, if the RAM is fault-free, by the end of the test. RAMs with transparent BIST can thus be tested periodically in a running system, without requiring that the stored data be first copied out and stored elsewhere for the duration of the test, and then rewritten back to the RAM once the test has completed.

Nicolaidis' method requires that a proposed RAM self-test be first transformed in a series of steps. Essentially these steps ensure that the data in each RAM cell is complemented an even number of times during the application of the test. The transformed test is applied in two phases: In the first phase, only read operations are applied to the RAM as a first data-dependent signature is computed. In the second phase, both read and write operations are applied while a second signature is computed. The RAM is deemed fault-free if the two signatures agree. The scheme is vulnerable to the small but finite chance of aliasing, when the two signatures are the same in the presence of a fault. Aliasing is possible even if the original memory test is deterministic, i.e., has 100% fault coverage over the assumed fault universe. However, the probability of aliasing can always be reduced by using longer signatures. When a deterministic test is used to construct a transparent test, we call the resulting test near-deterministic. By a probabilistic test we will mean either a nontransparent test that has less than 100% fault coverage, or a transparent test based on such a nontransparent test.

SUMMARY OF THE INVENTION

In this patent disclosure is described an apparatus and method for test vector generation, the apparatus being suitable for embedding in a conventional memory tester, that produces both deterministic tests for detecting single 2-, 3-, 4- and 5-coupling faults, and probabilistic tests for detecting single V-coupling faults of arbitrary multiplicity $V \geq 2$. The generator according to one aspect of the invention comprises a 6400 cell semi-custom test sequencer and a read-only memory (ROM) for storing compressed code data used by the sequencer to construct the tests on-the-fly. Although the test generator is capable of producing the shortest known deterministic tests for detecting single 4- and 5-coupling faults, it is too bulky to be used directly in a BIST design. The BIST RAM design also proposed in this patent disclosure overcomes this limitation by using alternative codes that can be generated using compact circuitry; in addition, the proposed design can generate transparent tests.

While some individual process steps carried out by the apparatus described here are known in the art, there has not been proposed a complete device or method with the entire function of the invention made by the inventor.

There is therefore provided in one aspect of the invention a method of testing a random access memory (RAM) having n cells, each cell being identified by an address, for single V-coupling faults where $n \geq V \geq 2$, the method comprising the steps of:

establishing a first current value for each cell;

for each cell and for each of m data backgrounds, generating a background code logic bit corresponding to an element of an (n, V−1)-exhaustive matrix;

for each of m data backgrounds;

(1) applying a sequence to each cell as follows:

(a) reading the current value of the cell, (b) writing to the cell a logical function of the background code logic bit and the first current value of the cell;

(c) reading the cell to determine the value of the cell after the writing operation in step b;

(d) writing the complement of the value of the cell determined in step b to the cell; and (2) for each background except the mth background, updating the current value of all cells according to the background code logic bits corresponding to that cell;

reading each cell of the RAM; and discarding or repairing the RAM if a cell coupling fault is apparent from the series of values read from the cells of the RAM.

According to one aspect of the invention, the background code logic bit is generated by initially constructing an ($n_0$, V–1)-exhaustive matrix where $n_0 \leq n$, the matrix having $n_0$ rows and $m_0$ columns; and constructing at least a portion of the (n, V–1)-exhaustive matrix from the ($n_0$, V–1)-exhaustive matrix. Generating a bit corresponding to an element of an (n, V–1)-exhaustive matrix may include row rotating the stored ($n_0$, V–1)-exhaustive matrix according to the background and cell address, or integer dividing the background by $m_0$ to produce a value i; integer dividing the cell address by $n_0$ to produce a value j; and row rotating the ($n_0$, V–1) matrix by the product of i and j modulo $n_0$.

According to a further aspect of the invention, generating a background code logic bit may include pseudo-randomly selecting a background code logic bit from the address of the cell, in particular by a hashing of the cell address, as well as from logical zero and one. The hashing function may include selection of the bit under control of the data background value.

According to another aspect of the invention, the logical function may be the complement of the element of the (n, V–1)-exhaustive matrix irrespective of the current background code logic bit of the cell or an exclusive-or of the complement of the background code logic bit and the first current value of the cell.

According to further aspects of the invention, hashing the address of the cell may include summing bits in the address, or forming the XOR of at least two address bits. Forming the XOR of at least two address bits may include generating bit pairs in the address of the cell, each bit pair including a left bit and a right bit; applying the left bit, logical 0 and the cell address to a first multiplexer having a first output; applying the right bit, logical 0 and the cell address to a second multiplexer having a second output; and applying the first output and the second output to an XOR gate. The first and second multiplexers may be controlled by the data background, and a hashing of the data background may also be applied to the XOR gate.

Detection of cell coupling faults may be carried out by comparison of the read cell content with the cell content of a known perfect RAM, or by comparing values read from the cell at different parts of the test where the same value should be returned in a good memory.

According to a further aspect of the invention there is provided apparatus for carrying out the method of the invention. In one aspect there is provided apparatus for testing a random access memory (RAM) having n cells, each cell being identified by an address, for V-coupling faults where $n \geq V \geq 2$, the apparatus comprising: a PROM containing background code logic bits corresponding to an ($n_0$, V–1)-exhaustive matrix where $n_0 \leq n$, the matrix having $n_0$ rows and $m_0$ columns; and generator means to generate a background code logic bit corresponding to an element of an (n, V–1)-exhaustive matrix on-the-fly from the background code logic bits in the PROM and to selectively apply the generated background code logic bit to the RAM.

The generator means may include means to row rotate the stored ($n_0$, V–1)-exhaustive matrix according to the cell address, and means to integer divide the background by $m_0$ to produce a value i; integer divide the cell address by $n_0$ to produce a value j; and row rotate the ($n_0$, V–1) matrix by the product of i and j modulo $n_0$.

In a still further aspect of the apparatus according to the invention, there is provided a built-in apparatus for testing a random access memory (RAM) having n cells, each cell being identified by an address, for single V-coupling faults where $n \geq V \geq 2$, the apparatus comprising a RAM, a RAM address generator, a background code logic generator connected to receive RAM addresses from the address generator and having pseudo-random background code logic bit output; a test pattern generator connected to receive RAM addresses from the RAM address generator and connected to receive output from the background code logic generator and having test pattern output forming an (n, V–1)-exhaustive code including m data backgrounds for each cell of the RAM; a controller for sequentially writing the test pattern output to the RAM and reading the cells of the RAM; and a response analyzer connected to receive the read content of the cells of the RAM.

The background code logic generator may include means to select the background code logic bit for application to a cell from a hashing of the RAM address of the cell, which may be responsive to the value of the data background, and may include means to form an XOR of at least two address bits.

In a still further aspect of the invention, the means to select the background code logic bit may include an all bit pair generator for generating all bit pairs in the address of the cell, each bit pair including a left bit and a right bit; a first multiplexer having a first output, the first multiplexer being connected to receive the left bit, logical 0 and the cell address; a second multiplexer having a second output, the second multiplexer being connected to receive the right bit, logical 0 and the cell address; and an XOR gate connected to receive the first output and the second output.

The first and second multiplexers may be controlled by the data background, and a hashing of the data background may be applied to the XOR gate.

These and other aspects of the invention are described in the detailed description and claimed in the claims that follow the detailed description.

BRIEF DESCRIPTION OF THE DRAWINGS

There will now be described preferred embodiments of the invention, with reference to the drawings, by way of illustration, in which like numerals denote like elements and in which:

FIG. 2 is a normal mode state diagram for the apparatus of FIG. 1;

FIG. 3 is a timing diagram for the test mode of the apparatus of FIG. 1;

FIGS. 5A and 5B are diagrams showing the structure and mode of operation of a PROM for reconstructing an (n, V–1)-exhaustive matrix for application to a RAM;

FIG. 10 shows storage of (n, V–1)-exhaustive matrices (codes) in the PROM of FIG. 1;

FIG. 11 shows the storage format for the code data in the PROM of FIG. 1;

FIG. 17A shows an exemplary (n=4, m=5) test matrix formed of background code logic bits for application to a RAM;

FIG. 17B shows a timing diagram corresponding to the test matrix of FIG. 17A;

FIG. 17C shows the corresponding timing diagram after an exclusive-or transformation of the test from FIG. 17B when it is assumed that cells 0, 1, 2 and 3 of an exemplary RAM initially contain data values 0, 1, 1 and 0, respectively;

FIG. 51 is a table (Table 1, first one-third) showing pin descriptions for a chip made in accordance with the invention;

FIG. 52 is a table (Table 1, second one-third) showing additional pin descriptions for a chip made in accordance with the invention;

FIG. 53 is a table (Table 1, third one-third) showing additional pin descriptions for a chip made in accordance with the invention;

FIG. 54 is a table (Table 2, first one-third) showing code location field records for a chip made in accordance with the invention;

FIG. 55 is a table (Table 2, second one-third) showing code location field records for a chip made in accordance with the invention;

FIG. 56 is a table (Table 2, third one-third) showing code location field records for a chip made in accordance with the invention;

FIG. 57 is a table (Table 3, first one-quarter) showing main controller signal descriptions for a chip made in accordance with the invention;

FIG. 58 is a table (Table 3, second one-quarter) showing main controller signal descriptions for a chip made in accordance with the invention;

FIG. 59 is a table (Table 3, third one-quarter) showing main controller signal descriptions for a chip made in accordance with the invention;

FIG. 60 is a table (Table 3, fourth one-quarter) showing main controller signal descriptions for a chip made in accordance with the invention;

FIG. 61 is a table (Table 4) showing PROM address generator signal descriptions for a chip made in accordance with the invention;

FIG. 62 is a table (Table 5) showing data queue signal descriptions for a chip made in accordance with the invention; and FIG. 63 is a table (Table 6) showing RUT address generator internal signal descriptions for a chip made in accordance with the invention.

DETAILED DESCRIPTION OF PREFERRED EMBODIMENTS

Figure 1:
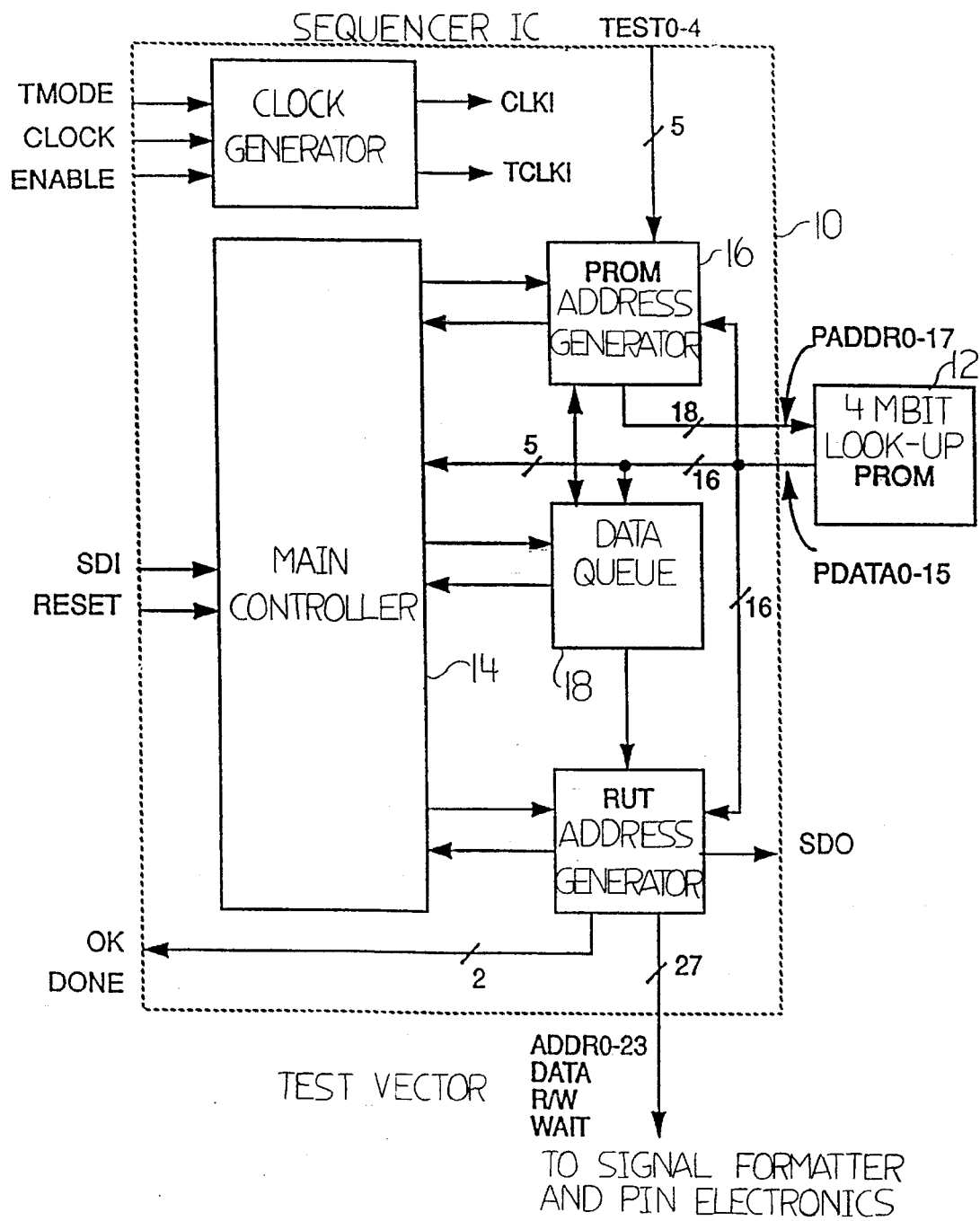
FIG. 1 is a system block diagram for a deterministic fault test apparatus according to the invention.

Referring firstly to FIGS. 1–17B there is described a first embodiment of the invention in which there is described an on-the-fly generator of a deterministic family of tests for detecting single V-coupling faults, for $V \geq 2$. The structure of each of the generated tests is determined by an n×m binary matrix, where n is the number of words in the RAM under test (RUT) and m is the number of data backgrounds used in the test. For example, FIG. 17A is a matrix in which n=4 and m=5, and FIG. 17B is the timing diagram for the corresponding test. The short vertical bars in the diagram denote read operations.

For the application of the test, a background code logic bit (data bit) must be generated for each cell and for each of m data backgrounds. Each of the background code logic bits corresponds to an element of an (n, V−1)-exhaustive matrix. Generation of proper background code logic bits is not easy and is described in detail in this disclosure. However, firstly, a brief description of the test procedure is given.

The test begins by initializing the RUT with the first background, that is, according to the first matrix column, to establish a first current value for each cell of the RUT. In this disclosure and in the claims, the current value of a cell referred to during execution of a step of the process is the value of the cell at the time the step is carried out. The first current value is the value of the cell at the commencement of execution of the steps in the process. After the first current value is established, a $\uparrow(r_b, w_b, r_b, w_b)$ march is applied; that is, in ascending address order (or in any other exhaustive address order), each cell is read, then written with the complementary value, read a second time, and then written again with the original value. Next the second background is loaded according to the second matrix column, taking care to read each location that needs to be changed before writing the new value. Loading the second background updates the current value of all cells. The same 4n march is then run through the second background. The process of loading a new background and then applying the 4n march is repeated until all matrix columns have been considered (that is, the same sequence has been applied to each cell for m backgrounds). As a final sequence, each cell is read one last time. The test length corresponding to a relatively random matrix of width m will be approximately (5m+1)n.

A deterministic test with the structure described above will detect all single V-coupling faults in an n×1 RAM if the rows of the underlying matrix form an (n,V−1)-exhaustive code. The rows of an n×m matrix A form an (n, V−1)-exhaustive code if (1) $n \geq V-1$ and (2) for all possible projections of A onto V−1 rows, all $2^{v-1}$ possible binary (V−1)-tuples will appear as column vectors. For example, the set of rows {01,01,01,01} is a (4,1)-exhaustive code because both 0 and 1 appear in every codeword. The corresponding 48 operation test therefore detects all single 2-coupling faults in a 4-cell RAM. As another example, consider the matrix in FIG. 17A. This matrix is (4,2)-exhaustive because, for all of the six possible choices of two rows, all four binary combinations (00, 01, 10, 11) appear in the columns. Thus the 106 operation test in FIG. 17B detects all single 3-coupling faults in a 4-cell RAM.

Deterministic tests of approximate length $11.7(\log_2 n)^{1.585}$ and $18.6(\log_2 n)^{2.322}$ that detect all single 4- and 5-coupling faults, respectively, can be constructed using the (n,k)-exhaustive codes described by Tang and Chen ("Iterative Exhaustive Pattern Generation for Logic Testing," IBM J. Res. Develop., v. 28, no. 2, pp. 212–219, Mar. 1984).

These codes are generated using an iterative procedure. First, an $(n_0, k)$-exhaustive base code, where typically $n_0 \ll n$, must be constructed by any means. Tang and Woo's ("Exhaustive Test Pattern Generation with Constant Weight Vectors," IEEE Trans. Comp., v. C-32, no. 12, pp. 1145–1150, Dec. 1983) method could be used, for example, to generate the base code. The size $n_0$ of the base code, typically much smaller than the size n of the desired code, must be chosen so that $n_0 = m^i$, where m is a prime number, $i \geq 1$, $n_0 \geq k$, and $m \geq \lfloor k^2/4 \rfloor$. Next, a "growing" step is applied as many times as is necessary to obtain the necessary number n of codewords. Each growth operation squares the number of codewords and extends their length by a factor of approximately $q = \lfloor k^2/4 \rfloor + 1$. In Tang and Chen it is shown that the length m of the resulting (n,k)-exhaustive codes grows according to the formula $$m \approx m_0 \left( \frac{\log_2 n}{\log_2 n_0} \right)^{\log_2 q}$$

where $m_0$ is the length of the $(n_0, k)$-exhaustive base code.

RAM tests are composed of a series of test patterns. Each code element is applied to a RAM under test (RUT) sequentially as part of a test pattern. Each test pattern contains a RAM address, a read or write command and a data bit (background code logic bit) derived from a code element. Apparatus for generating the test pattern is shown in FIG. 1, which shows the general internal structure of the sequencer 10 along with the connections to the look-up PROM 12. There are four subsystems: the main controller 14 is responsible for overseeing the operation of the sequencer 10, controlling the functions of each of the other three submodules. The PROM address generator 16 generates PROM addresses that fetch the code location records and the code matrices. The data queue 18 takes the raw PROM code data and outputs data bits with a corresponding increment request to the RUT address generator 20. The RUT address generator 20 assembles the complete test vectors, ensuring that they are correctly output. A clock generator 22 provides clock signals for use elsewhere in the sequencer 10.

The test generator as illustrated in FIG. 1 is partitioned across two integrated circuits: one standard 256 Kbit×16 PROM 12 and one semi-custom sequencer integrated circuit 10. The lowest 256 words of the PROM 12 are used to store control parameters for 32 different pre-defined tests; the remaining locations are used to store matrix data. The sequencer 10 is responsible for reconstructing the full-sized matrix on-the-fly from the PROM data and then producing the corresponding unformatted test vectors. Approximately one new test vector can generated in every clock cycle (occasionally the sequencer is unable to maintain this pace).

The code matrices are stored in the PROM 12 in a compressed form which exploits the theorem underlying Tang and Chen's construction. Instead of storing the final full matrix, it is the matrix corresponding to the preceding growth iteration that is stored. For example, a (1024,3)-exhaustive code rather than a (1048576, 3)-exhaustive code is stored when 1 Mbit RAMs are tested for single 4-coupling faults. The storage requirements in this case are reduced by a factor of approximately $\overline{\sqrt{n}} \times q = 3072$. A PROM size of 4 Mbit precludes deterministic testing for 5-coupling faults in RAMs larger than 1 Mbit. Probabilistic testing for these faults is still possible, however, for multi-megabit RAMs. The 32 control parameter records are used to define the characteristics of 32 different tests. Tests can share matrix data. Also, deterministic and probabilistic tests can be freely intermixed since they are treated identically by the sequencer. The PROM 12 can be easily replaced if a different selection of tests is desired, or if improved (n,k)-exhaustive codes are to be installed.

The electrical interface for the sequencer 10 includes 72 signal pins, one serial input and one serial output for the scan chain (included for testing purposes), and 16 power supply pins. As shown in FIG. 1, the sequencer comprises four major subsystems. Overall control rests with the main controller 14. During initialization, the PROM address generator 16 fetches one of 32 test control parameter records from the PROM 12 so that various sequencer registers can be initialized. The PROM address generator 16 then enters a semi-autonomous mode in which it prefetches matrix data from the PROM 12. Retrieved PROM words enter a four-stage pipeline contained in the data queue 18 (DQ) and RUT address generator (RAG) 20. The data queue 18 converts the matrix data from 16-bit words to code bits that are synchronized to the RUT addresses. This task is complicated during background changes because the addresses of RUT cells that do not need to be modified are skipped. This optimization decreases the test time by approximately 17%. The RUT address generator 20 is responsible for assembling the 27 bit wide test vectors. Each vector contains 24 address bits (ADDR0-23), a read/write bit (R/W), a data bit (DATA), and a wait signal (WAIT). The wait signal is used to flag the occasional times when the sequencer is unable to generate a new test vector for the current clock cycle. When wait is active, the remaining 26 test vector bits are repeated from the previous clock cycle.

In order to assure test integrity, a signature is recomputed by the RUT address generator 20 as each test is generated. When the done signal is asserted to signal the end of the test, the OK signal indicates whether or not the freshly recomputed signature matches the expected signature that was stored in the test's control parameter record.

The test generator could be used to test n×k RAMs, where k> 1, by using the same data bit stream for all k data lines. Such an approach, however, would not detect interactions among bits of the same data word. To deal with this problem, the generator has been provided with a parallel testing mode that is configured by data in the test control parameter records. Essentially, k different test generators can be synchronized to generate a modified version of the test in which the k generators use k disjoint subsets of the same matrix data. Several techniques are used within the sequencer 10 to obtain higher performance. One such technique is to use the PROM address generator 16 to prefetch data from the PROM 12 to anticipate the next data required by the data queue 18. In this way the PROM address generator 16 assumes it must generate the next address for the PROM 12, and goes ahead and does so. Then when the data queue 18 requests another word of data, it is already waiting to be latched, Another speed optimization allows the sequencer to skip unnecessary read and write operations during background changes. This feature enables the total number of operations performed by the sequencer 10 upon the RUT to be reduced by roughly 17%. When the sequencer 10 is generating test vectors occasionally it must assert the WAIT line indicating it was unable to generate a test vector for that clock period. The number of WAIT states is typically ½ of one percent of the total number of test vectors.

It is preferred that the sequencer 10 uses a basic single phase, edge triggered clocking strategy throughout the design. With this clocking method, both internal control type signals and data registers are latched on the same edge of the clock, allowing for both control and data signals to settle during the same time.

The sequencer package is connected to its environment via 72 signal pins, 2 serial test lines, and 16 power supply pins. The 16 power supply pins are necessary for powering the high current drive output pads. All of the pins are connected to either a signal source/sink, power, or ground. The signal names and functions are given in table 1.

The sequencer 10 preferably has two basic modes of operation: test mode and normal mode. The mode is selected using a TMODE input line on the sequencer 10. When TMODE is asserted, i.e. in test mode, every flip-flop in the sequencer 10 is switched to scan mode, forming a single long scan chain (every flip-flop is connected serially as a single shift register). Also, when in this mode, the internal clocking is altered to enable the test clock (which is derived in the clock generator 22 from the main CLOCK input). As the CLOCK runs, scan chain data is shifted in from the SDI line, and out the SDO line. One bit is read in/out every clock cycle. When the TMODE line is released, normal operation of the sequencer resumes. In this way, the state of every flip-flop in the sequencer can be checked at any time during the operation of the sequencer 10, and the sequencer 10 can be placed in any desired state.

When TMODE is deasserted, the sequencer 10 is in normal mode. In this mode, the sequencer 10 preferably generates test vectors at a rate of nearly one vector per clock period. The basic state diagram in FIG. 2 illustrates the normal mode of operation.

When RESET is asserted, TEST0-4 are set to select which of 32 tests stored in the PROM 12 is to be executed. The TEST signals are latched by the sequencer 10 upon start-up (when the RESET signal is deasserted), and multiplied by 16 to produce the base address of the corresponding code location record stored in the PROM look-up table.

The sequencer 10 is in the running state when RESET is deasserted and ENABLE is asserted. During the running state, test vectors are generated and output from the chip. The 27 bit test vectors should only be considered valid when the WAIT signal is low. The WAIT signal is the sequencer's means of stating whether or not a valid test vector is available to be used on the RUT.

After the sequencer 10 has output all test vectors for a particular test, the DONE line is asserted, informing the environment that it is in the "done state" awaiting further instructions. During this state the OK line should be checked to see whether it indicates that the freshly recomputed signature matches the expected signature stored in the PROM 12. In this way test integrity is assured. The signature is a 16 bit number generated using a multiple input feedback shift register (MISR) using the test vector outputs as inputs to the MISR. Using 16 register bits and several logic gates a unique number is generated in the MISR from a series of test operations. Providing the test operations for a given test are identical to the expected output, the signature will match that which is loaded in the PROM 12.

If, at any time during the normal operation of the sequencer 10, it becomes necessary to temporarily stop the output of the test vectors, the ENABLE signal is deasserted. The clock period in which the ENABLE signal is dropped will continue to completion, then the generation of new test vectors will stop. Normal operation is then resumed at the start of the next whole clock cycle when the ENABLE signal is asserted.

During test mode, the sequencer 10 shifts an input bit (from SDI) through 320 register bits. Thus, as is shown in FIG. 3, the data input on the SDI line is not output until 320 clock periods later (plus pad delays which should be less than one clock period long) on the SDO line. Note that the input SDI bits must shift through the entire scan chain of 320 flip-flops, but the exact amount of time until the bit input into the chain appears on the SDO line depends on when the SDI bit was entered relative to the clock signal. Since the system is falling edge clocked, there is a larger time delay between when the clock signal reaches the flip-flops than direct pad inputs. FIG. 3 shows an example of how the chip could be forced into any specific state.

When an n×K RAM is being tested, then K test vector generators can be run in parallel. Each generator chip is responsible for testing one bit of the word in the RUT. During changes in the RUT "background" a K-fold speed-up is achieved. Thus, the test time can be reduced by a factor of K from 1/3 of the total test time.

Figure 4:
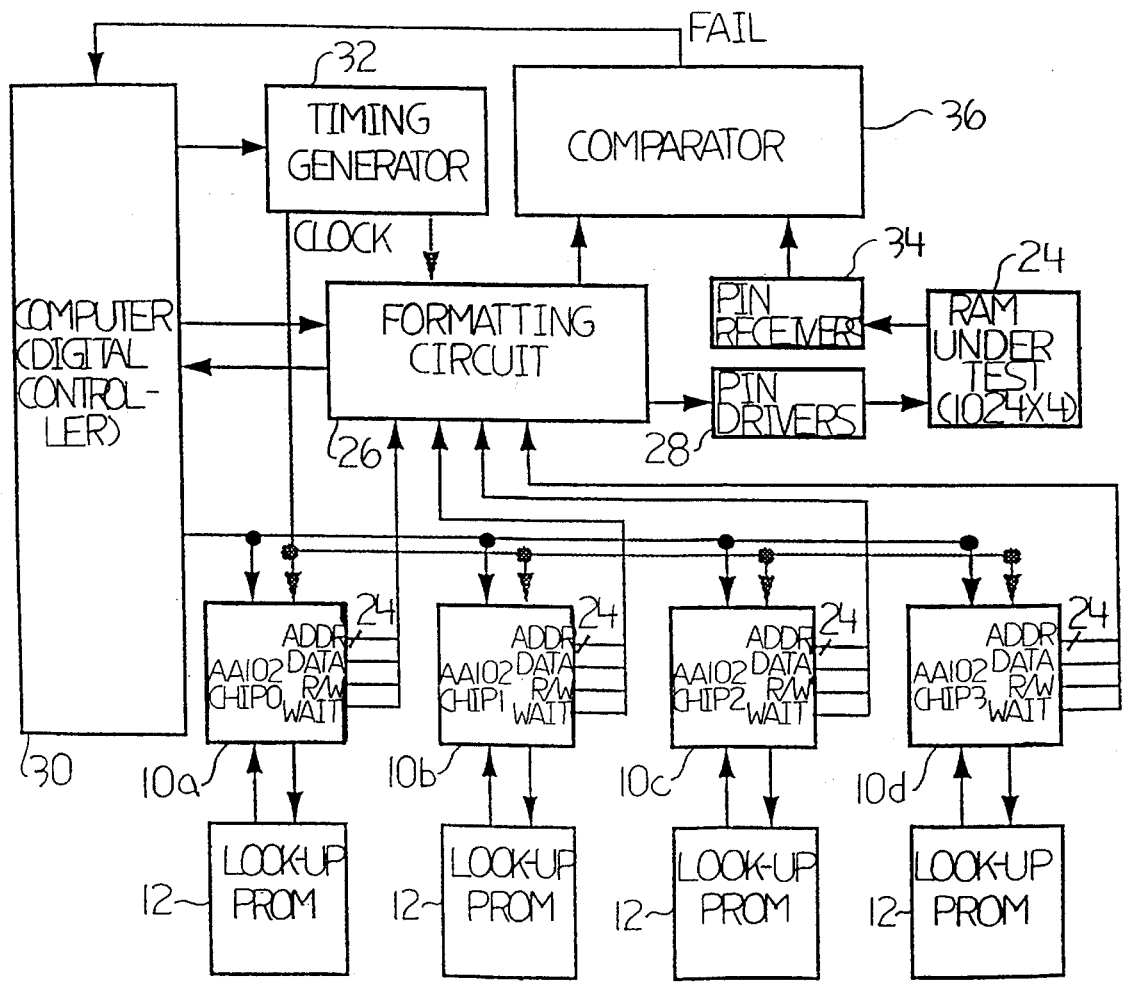
FIG. 4 is a diagram showing parallel mode operation of an apparatus according to the invention.

For example, consider an RUT that contains 1024 words, with 4 bits per word. In this case 4 sequencers 10a, 10b, 10c and 10d must be connected in parallel to the RUT. Total speed-up is about 25% over a single sequencer test system. FIG. 4 illustrates the arrangement.

Each sequencer 10a, 10b, 10c and 10d supplies test vectors (including ADDR, DATA, R/W and WAIT bits) to the RAM under test 24 through a formatting circuit 26 and pin drivers 28. Overall control of functions is provided by digital controller 30, with clock (timing) generator 32 supply clock signals to the formatting circuit 26. Test results are produced through pin receivers 34 and a decision is made on the effect of the test in comparator 36.

Parallel mode operation is enabled by a bit in code location record in the PROMs 12. All of the PROMs 12 in this case should be nearly identical. The only difference will lie in some of the fields of the code location records. The control signals to the sequencers 10a, 10b, 10c and 10d should also be identical. The base matrices for each PROM 12 will be identical, as will the number of code location records. For this RAM size, the code size must be at least 64 (the square root of 1024×4). The code length depends upon the code matrix used.

FIGS. 5A and 5B illustrate a growth step in which a 25-row code (FIG. 5B) is constructed from a 5-row code (FIG. 5A). If the code in FIG. 5A is (5, 5)-exhaustive, then the code in FIG. 5B will be (25, 5)-exhaustive. A growth step "glues" together possibly row-rotated copies of the original code to get the next code. More precisely, consider an $(n_i,k)$-exhaustive code A of length $m_0$ that is to be grown into an $(n_i^2, k)$-exhaustive code A'. As before, let $q=\lfloor k^2/4 \rfloor$. An r-rotated copy of a code $\{v_0, v_1, \ldots, v_{n-1}\}$ is the code $\{v_{r \bmod n}, v_{(r+1) \bmod n}, \ldots, v_{(r+n-1) \bmod n}\}$. A growth iteration proceeds in four steps: First, $n_i \times q$ copies of A are arranged in $n_i$ rows of q copies each. The copies are labelled according to their horizontal position, from 0 to q−1, and their vertical position, from 0 to $n_0 -1$ (as in FIG. 5B). Second, the copies are row-rotated so that the copy at position (i, j) is $((i \times j) \bmod n_0)$-rotated. Third, the codes are attached together to form a code containing $n_0^2$ codewords of length $q \times m_0$. Finally, if A contained columns containing all 0s or all 1s, then duplicate columns in the new code A' (containing all 0s or all 1s) may be removed. A zone is a set of columns in the grown matrix corresponding to one width of the underlying matrix. Thus the quantity q specifies the number of zones required in each growth iteration.

For $2^{10} \leq n \leq 2^{34}$, this procedure leads to (n,3)-exhaustive codes whose length lies within 20% of $2.34(\log_2 n)^{1.585}$ and to (n,4)-exhaustive codes whose length lies within 40% of $3.72(\log_2 n)^{2.322}$. These codes can be used to construct tests of approximate length $11.7(\log_2 n)^{1.585}$ and $18.6(\log_2 n)^{2.322}$ that detect all single 4-and 5-coupling faults, respectively.

The test matrix for complete detection of 5-coupling faults is larger than the test matrix for detection of 4-coupling faults. A test for 4-coupling faults will also detect at least 50% of the 5-coupling faults. The total number of rows in the test matrix corresponds to the RUT size. The number of columns in the test matrix corresponds to the number of "backgrounds" which are to be applied to the RUT. Effectively, the number of backgrounds is proportional to the number of operations which are applied to each bit in the RUT.

Figure 6:
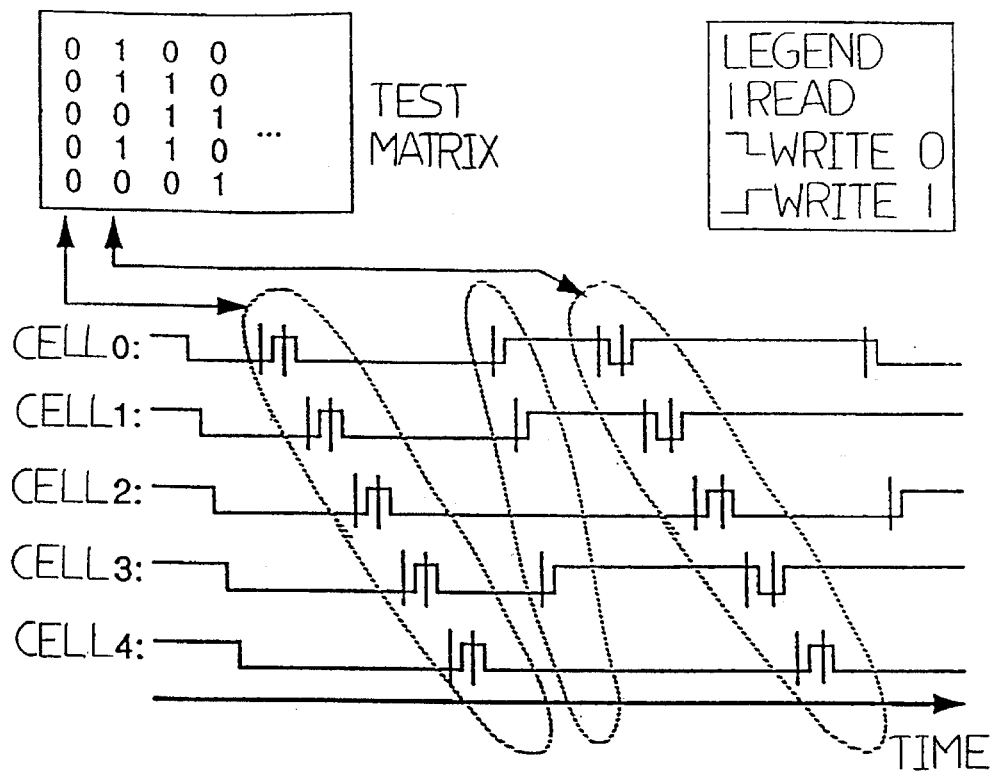
FIG. 6 is a diagram showing how a test is formed from a test matrix.

The sequencer 10 produces test vectors as it reconstructs the test matrix on the fly. The way in which RUT test operations are generated is illustrated by FIG. 6. The figure shows a small test matrix that is transformed into test operations (reads and writes). The legend describes the syntax of the graphical representation of the test operations.

The first sequence writes the first background to the RUT. The entire first column of the test matrix is written to the RUT. In subsequent background sequences, the cell values are read to ensure that they are correct before being written. The next sequence of operations is called a "march" through the background state. These operations are performed using the same column of data as the background writes. A march involves first reading the contents of a cell to ensure that it is correct, and then writing to that cell the inverse of its original value, reading the cell again, and then writing the cell back to its original value. That way, the value of the cell should be the same as when the previous background operation was performed and can be checked at the beginning of the next background operation. This pattern of background-march-background- . . . is continued until the entire test matrix is exhausted.

Figure 7:
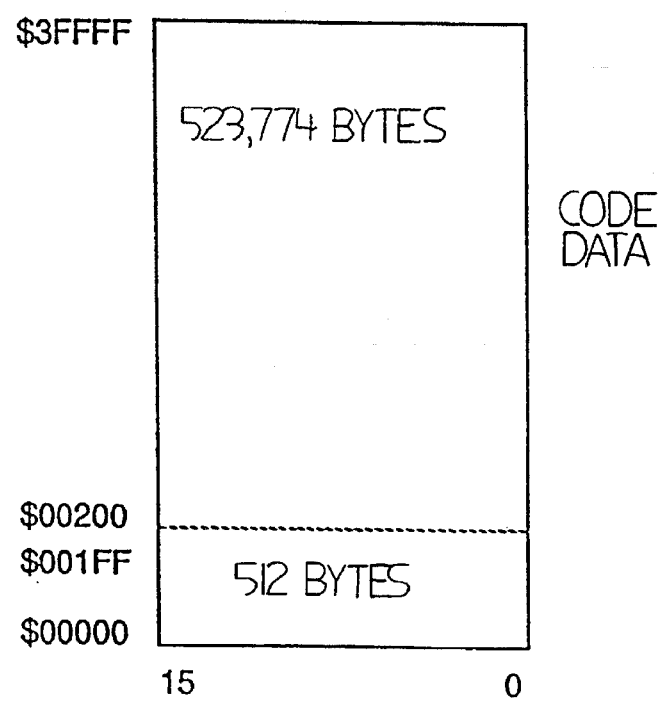
FIG. 7 is a diagram showing a PROM address map for use in the apparatus of FIG. 1.

The 256K×16 look-up PROM 12 contains information that is required to construct each of the 32 possible different tests. The lower 512 bytes of PROM 12 memory are used to store each of 32 code location records. Each record specifies a different test. The remaining 523,774 bytes of memory in the address space of the PROM 12 are used to store the code matrices which are to be reconstructed into full test matrices by the sequencer chip. The address map of the PROM 12 address space is shown in FIG. 7.

Figures 8, 9:
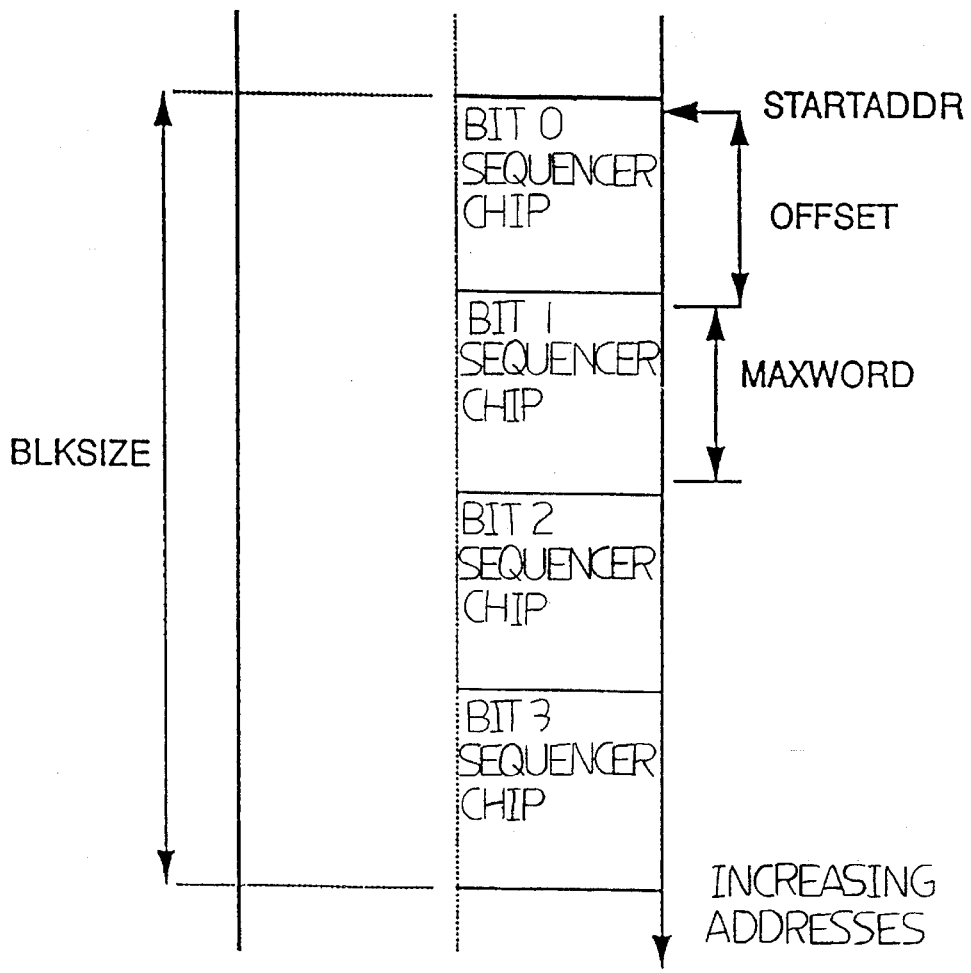
FIG. 8 is a diagram showing the format for a code location record for use with the apparatus of FIG. 1.
FIG. 9 is a diagram showing how sample elements in FIG. 8 are used.

FIG. 8 shows the format of each 8×16 bit code location record. It is not necessary to completely store 32 different code location records to use a PROM 12 with the sequencer 10. Only those tests which will be performed need to be described by a record. The shaded area in the diagram shows bits in the record which are not used by the sequencer 10. These bits may be set to any value, but should be padded with zeros. All of the bits in the record that are not used must be set to zeros. Table 2 describes each field of the code location records.

The upper address space of the PROM 12 stores the code matrices that are used to generate the tests. The special mapping format which must be used to load the codes into the PROM 12 is described by example in FIGS. 10 and 11.

Figures 10, 11:
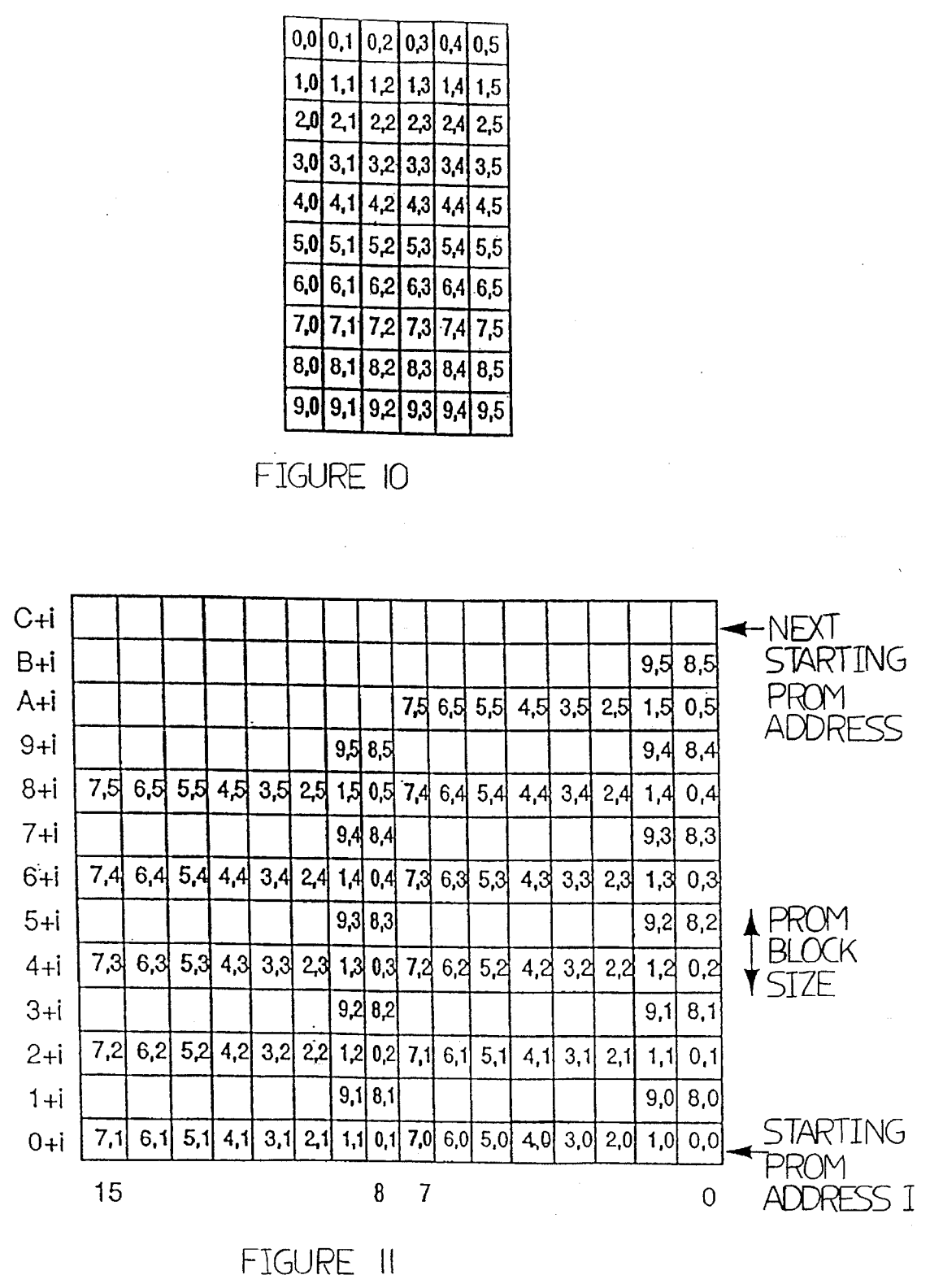
Figure 12:
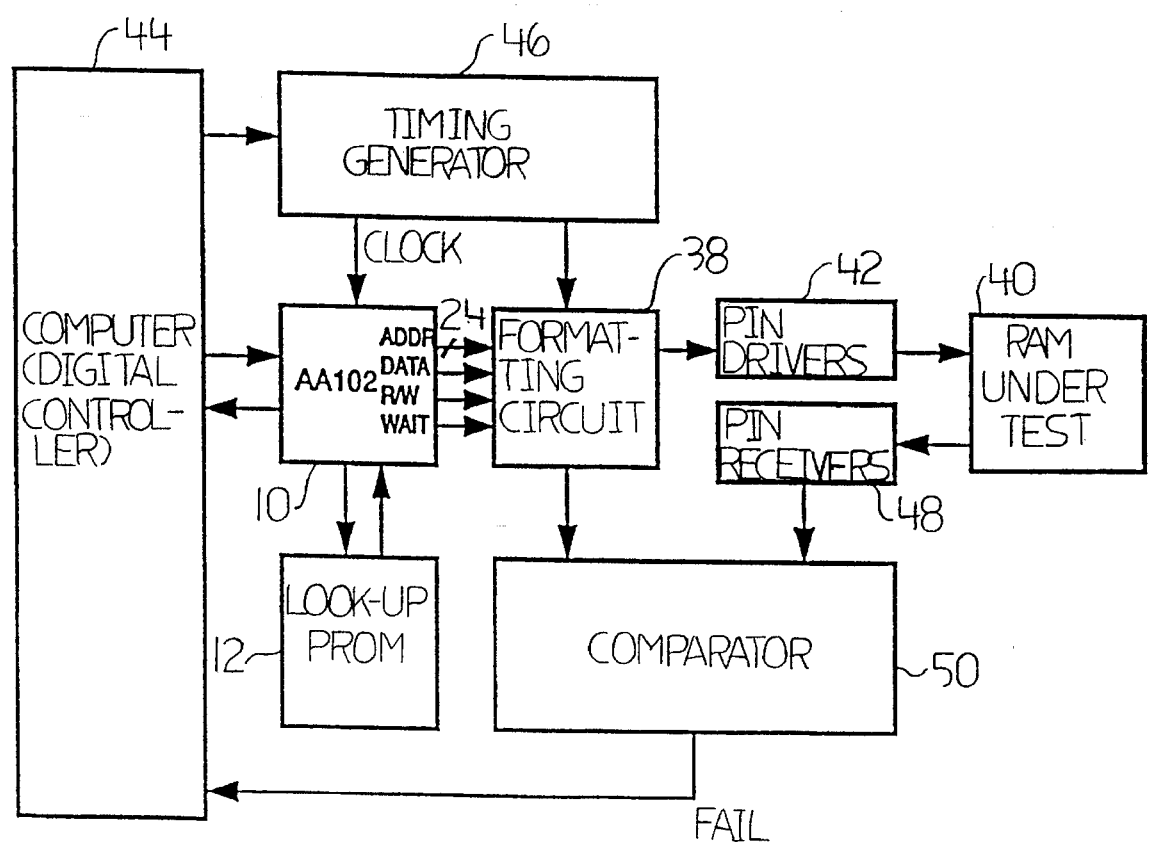
FIG. 12 shows an exemplary RAM tester system architecture according to the invention.

The sequencer 10 should be operable in parallel or stand alone mode by setting MAXBITNUM to a non-zero value (parallel mode) or zero value (stand alone mode). FIG. 10 shows the code matrix that is to be stored in the PROM 12 upper address space. Each cell in the diagram corresponds to one bit of the matrix. The numbers which appear in the cells are for identification purposes only. In FIG. 12 the mapping of the code matrix into the PROM 12 is shown. FIG. 11 shows duplication of the information stored in the PROM 12. Each PROM word stores up to 8 bits for the current background and the corresponding bits in the next background. This duplication of data reduces the number of PROM 12 accesses by a factor of two at the cost of doubling the required PROM capacity.

The sequencer 10 is designed to be used within a larger RAM testing system. The diagram in FIG. 12 shows the architecture of such a testing system that employs the sequencer 10. Sequencer 10 provides test vectors to formatting circuit 38, which are then applied to the RAM 40 through pin drivers 42. The background code logic bit DATA is provided by PROM 12. The PROM functions as generator means to generate a background code logic bit corresponding to an element of an (n, V–1)- exhaustive matrix on-the-fly from the background code logic bits in the PROM 12 and to selectively apply the generated background code logic bit to the RAM using the output of the address generator. Control of the system is provided by computer 44 with timing generator 46. Test results are provided by pin receivers 48 to comparator 50, which provides a signal to the computer 44 as to whether a fault was detected. The RAM may then be repaired or discarded or kept according to the result of the test.

The computer 44 initializes the sequencer 10, and controls the timing generator 46. The computer 44 only is involved in the operation of the sequencer 10 during the start-up and end phases of a test. A single error found by the comparator 50 should be cause for the computer to terminate the current test, and record the RUT 40 as flawed.

The following is a typical sequence of events to set up a test.
1. Set-up the TEST0-4 signals to the desired state.
2. Assert the ENABLE signal.
3. Assert the RESET signal.
4. Deassert RESET when the system is ready to run the test.
5. Use the ENABLE signal to halt the test when desired.
6. When the DONE signal is asserted check the OK line.
7. Sequence of events can now be repeated from (1).

The sequencer 10 employs a single-phase, edge-triggered clocking scheme. Internal global network names such as CLK in the figures are characterized by the exclamation mark (!). There are three such nets which are named CLK!, TCLK!, and CLR!.

Referring now to FIGS. 1–16, the clock generator 22 takes the inputs CLK, ENABLE, and TMODE, and uses them to develop the global clock nets CLK!, and TCLK!. Preferably, the clock signals are driven through on-chip amplifiers before they reach the global networks.

Figure 13:
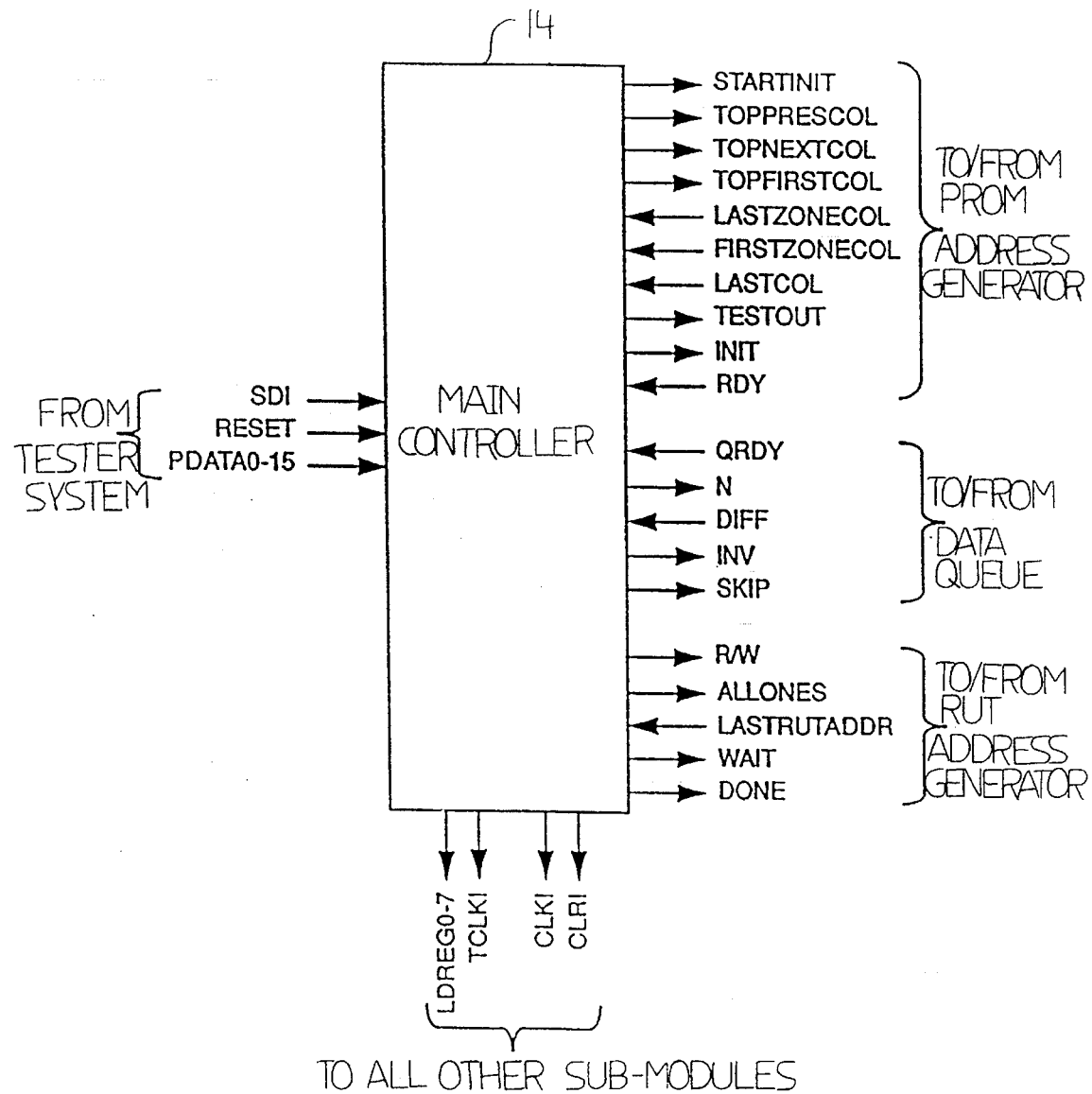
FIG. 13 shows a main controller connection diagram for use with the apparatus of FIG. 1.

The main controller 14 sub-module supervises the entire sequencer operation. Each of the other three sub-modules (PROM address generator 16, data queue 18, RUT address generator 20) operate under their own direction. However, the main controller 14 is responsible for the coordination of the other sub-modules so as to lead to the formation of a set of test vectors. The main controller 14 sub-module is shown in FIG. 13.

The main controller 14 communicates with the PROM address generator 16 by sending it signals indicating when it is to point to the top of a column in the test matrix (using the TOPPRESCOL, TOPNEXTCOL, and TOPFIRSTCOL lines). In return, the PROM address generator 16 keeps the main controller 14 informed of the particular type of column it is pointing to, with respect to the current zone. The FIRSTZONECOL line is asserted when the PROM address generator 16 is pointing to the first column in the current zone. The LASTZONECOL line is asserted when the PROM address generator 16 is pointing to the last column in the current zone. The LASCOL line is asserted during the last column of the entire test matrix. When the main controller 14 detects that either of these two signals is being asserted, it modifies its background operation.

The main controller L4 requests two different initialization procedures from the PROM address generator 16. They are STARTINIT and INIT. STARTINIT is asserted at the very beginning of the initialization procedure, and requests the PROM address generator 16 to initialize all of its internal registers to their starting value, and latch in the current test number (TEST0-4). Then, the INIT line is asserted for 8 clock cycles, during which time the code location record pointed to by the current test number is loaded by the PROM address generator 16 from the PROM 12.

Sequencer testability and diagnosability are assured by a scan chain that is formed by linking all of the internal register bits together in a continuous chain. The TESTOUT line is used for this purpose. This line is the scan chain output from the main controller 14 sub-module, and is connected to the scan chain input (I) of the PROM address generator 16. Eventually, the scan chain data is output to a pad. During test mode, normal operation of the main controller 14 (and the other sub-modules) is halted, and the scan chain serially shifts test data in through the SDI line, and out through the TESTOUT line which eventually leads to the SDO line. In this way, the internal state of the sequencer can be determined.

During normal operation, the main controller 14 sends signals to the data queue 18 via the N, INV, and SKIP lines. By asserting the N line, the main controller 14 informs the data queue 18 that it is to release another test vector (with data bit). The state of the INVline at this time determines whether or not the data bit output from the data queue 18 is to be inverted. It is inverted at times during RUT marches (described later). If the SKIP line is asserted, the data queue 18 is allowed to skip unnecessary RUT test vectors as it sees fit. The main controller 14 only asserts this line during normal background operations, when not in parallel mode. The data queue 18 returns status signals on the QRDY and DIFF lines. DIFF is asserted by the data queue 18 if the current data bit is different from the data bit that is loaded in the RUT at the current address location. The main controller 14 uses this information to decide if the data bit should be inverted or not. If the data queue 18 has a test vector ready to be sent to the RUT address generator 20, then QRDY is asserted. QRDY will deassert when the data queue 18 is initializing and/or retrieving the next RUT test vector. In this way, the N signal acts as a request for the data queue 18 to output its current test vector, and fetch the next one.

The main controller 14 must also communicate with the RUT address generator 20. It sends four different signals to the RUT address generator 20 on the R/W, ALLONES, WAIT, and DONE lines. R/W and WAIT apply to the current test vector. These lines indicate whether the test vector data bit is to be written or read and compared with the RUT data. The WAIT signal represents the main controller 14's vote for a wait state on the current test vector. This internal WAIT signal may be overridden by the RUT address generator 20. ALLONES is asserted when the main controller 14 requires the RUT address generator 20 to reset its address counter. Finally, DONE is asserted by the main controller 14 when the current RUT test sequence is completed. In order for the main controller 14 to realize when it has reached the final address of the RUT, the RUT address generator 20 sends a signal called LASTRUTADDR to the main controller 14.

Another task of the main controller 14 is to oversee parallel mode operation. After loading the current code location record from PROM memory, the main controller 14 determines whether or not it is to run in parallel mode. If it is, it changes its operation accordingly to allow it to operate without skipping and thereby run in lock-step with the other parallel sequencer chips.

Table 2 contains descriptions of most of the interconnection lines between the chip sub-modules. The lines which do not appear in table 2 are described later since they don't involve the main controller 14.

Figure 14:
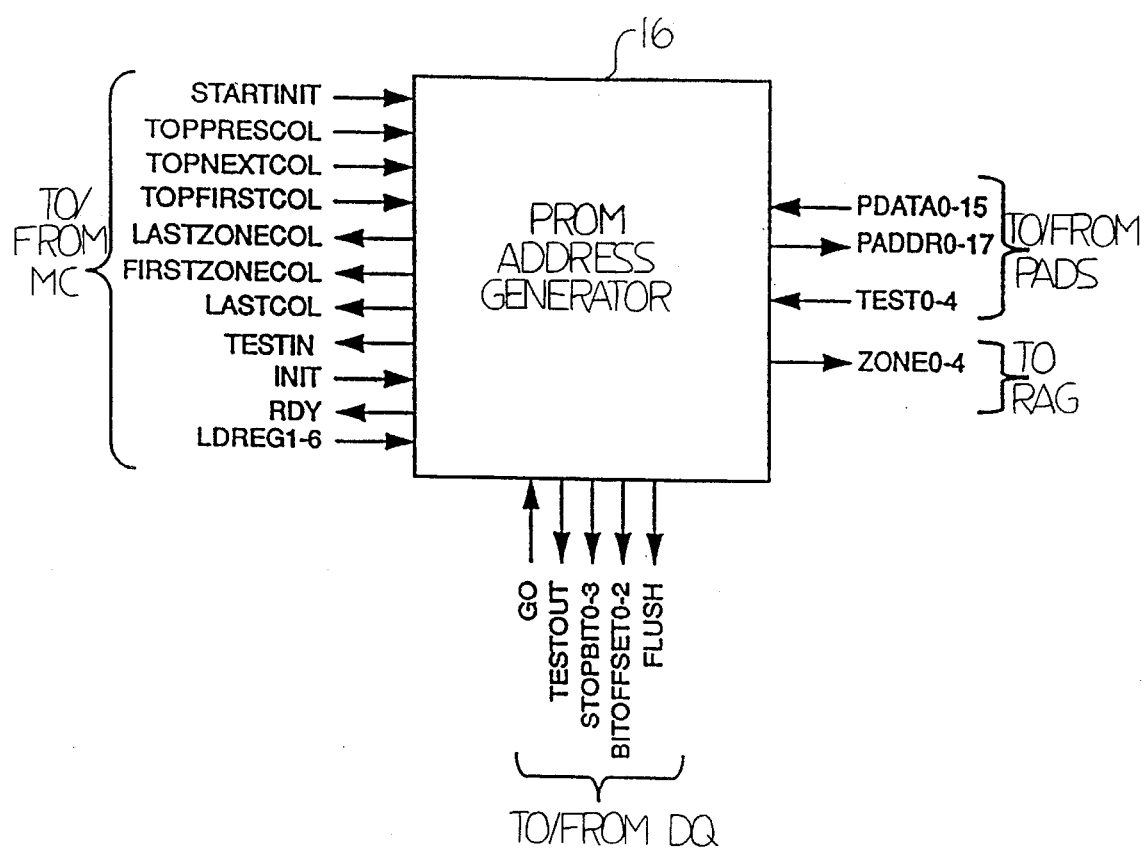
FIG. 14 shows a PROM address generator connection diagram for use with the apparatus of FIG. 1.

The PROM address generator 16 generates PROM addresses which fetch data that is used by the data queue 18 to form the test vectors. A maximum of 8 test vectors can be formed by each PROM fetch. This limitation is a result of the way code matrices are stored in the PROM look-up table. At most one test vector can be produced for each new bit in a PROM word. Since there is duplication of code matrix storage in the PROM 12, there are only 8 new bits in each 16 bit PROM word. The PROM address generator 16 sub-module is shown in FIG. 14.

The PROM address generator 16 is operable in four states. Four states are necessary to allow the PROM 12 enough time to fetch its data when running at 36 MHz, assuming that each access requires approximately 120 ns. Reduction of the PROM 12 access time, reduces the amount of time the chip spends in a wait state. However, the improvement in performance would not be significant since typically only 0.5% of the clock cycles are spent in a wait state.

When in its initialization phase, the PROM address generator 16 loads the code location record pointed to by 8×TEST0-4. The record is loaded one 16-bit word at a time, and therefore takes 8 clock periods to complete. This operation is synchronized with the main controller 14 to allow the rest of the sub-modules to be able to latch in the record data which is pertinent to their operation.

The PROM address generator 16 primarily communicates with the data queue 18. Occasionally (at the start or finish of a column) the main controller 14 sends particular signals to the PROM address generator 16 (see main controller 14 description above). The data queue 18 signals the PROM address generator 16 that it has latched the current PROM data word by asserting the GO line. This indicates to the PROM address generator 16 that it can now calculate the next PROM address (PADDR0-17), and wait for 4 clock cycles to allow the PROM data lines to settle. The data queue 18 will not assert the GO line, however, until it recognizes that the PROM data lines are settled, which is indicated by the PROM address generator 16 asserting the RDY line. The PROM address generator 16 is constantly trying to keep ahead of the data queue 18 by prefetching the addresses, so before the GO line is even asserted, the PROM address generator 16 attempts to have the next PROM address ready to be sent out on the PADDR lines. Rarely, except at the beginning of a new column, is the PROM address generator 16 ever caught without having a PROM address pre-computed. In Table 3 the signals which did not appear in table 2 are described.

Figure 15:
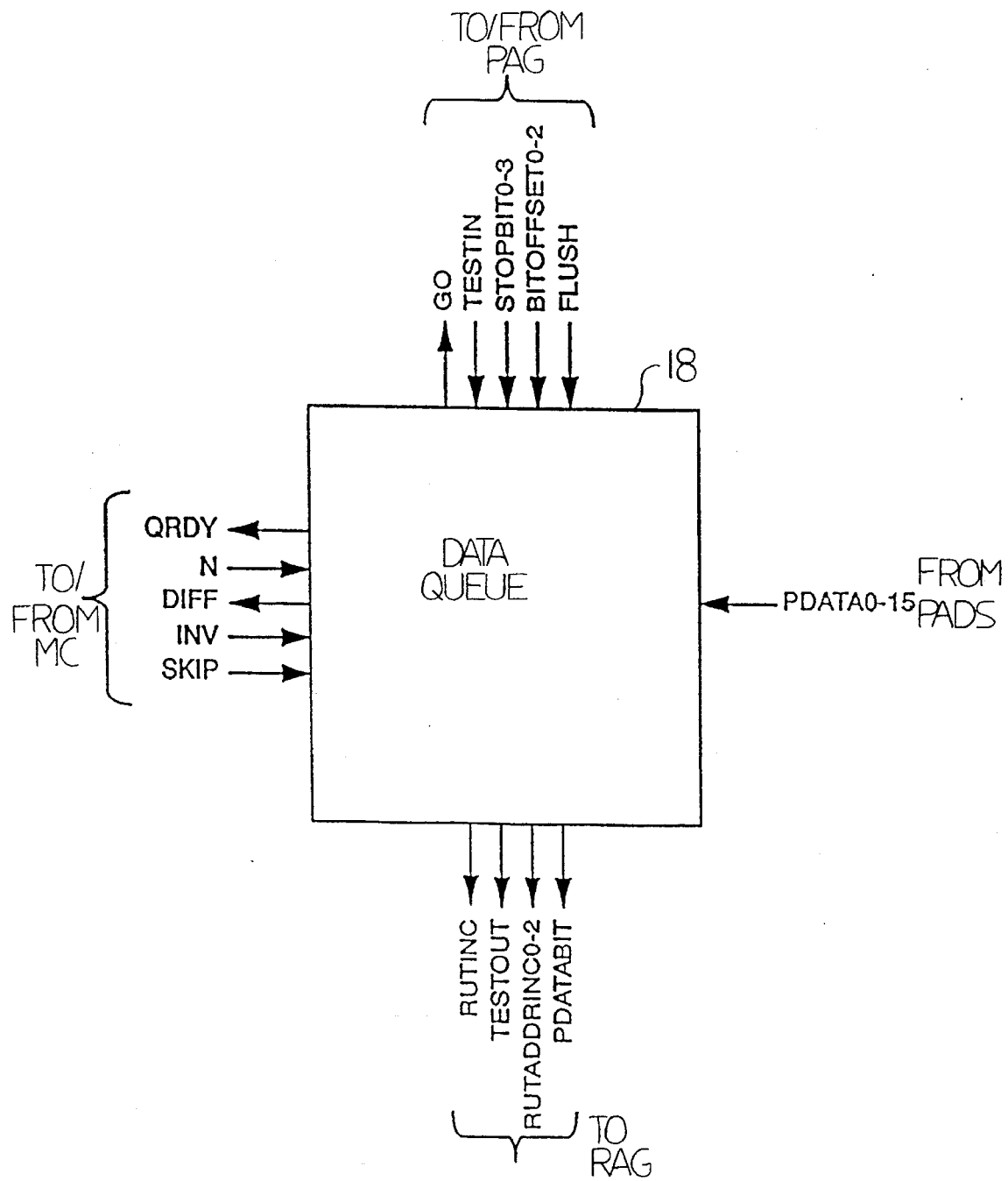
FIG. 15 shows a data queue connection diagram for use with the apparatus of FIG. 1.

The conversion of raw PROM data words into test vectors usable by the RUT address generator 20 is the job of the data queue 18. The name data queue 18 suggests the way in which 16 bit words of data are latched from the PROM 12, and then released as requested by the main controller 14. By latching the entire data word into a queue register, the data queue 18 allows the PROM address generator 16 to change the PADDR lines to fetch what it expects to be the next data word. The data queue 18 sub-module is shown in FIG. 15.

The data queue 18 consists mainly of a complex state machine. When the main controller 14 asserts the N line, the data queue 18 responds by outputting a data bit and an associated RUT address increment value to be used by the RUT address generator 20; it also asserts the QRDY line. This task becomes difficult when "skipping" is introduced. By loading information about the last background operation at the same time as the current background data, the data queue 18 is able to calculate which bits of the current data word do not need to be rewritten to the RUT since they match the previous bit. That is, if the current state of a particular RUT bit is zero, and the new background operation requires the bit to be set to zero, then that operation can be skipped. This optimization is largely responsible for the considerable complexity of the data queue 18.

In general, the data queue 18 starts forming test vectors by starting at the beginning of the current data word, and proceeds one bit at a time until all 8 new bits are exhausted. At that time, the GO line is asserted as soon as the RDY line goes high. As the GO line is asserted, a new data word is loaded, and the process continues. Those signals not included in Tables 2 and 3 are included in Table 4.

Figure 16:
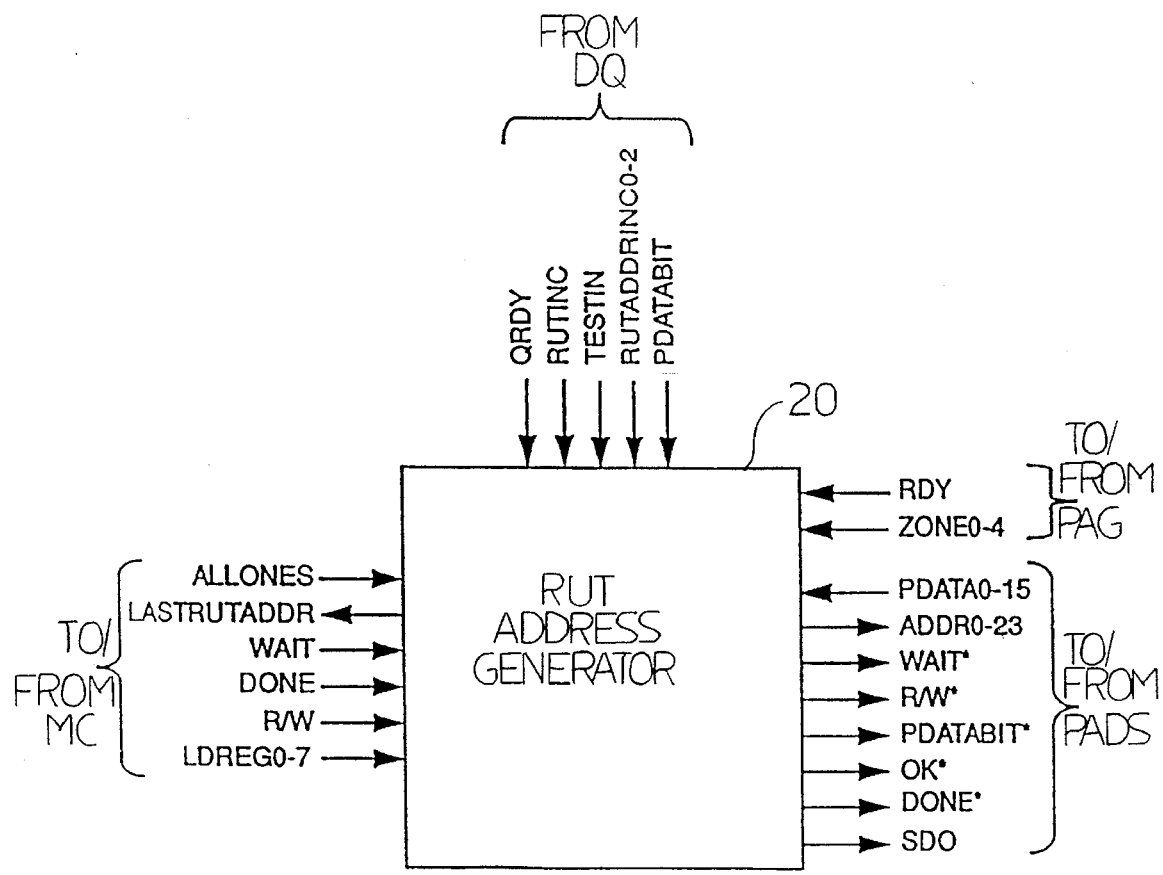
FIG. 16 shows a RUT address generator connection diagram for use with the apparatus of FIG. 1.

The RUT address generator 20 compiles test vector information from the main controller 14 and the data queue 18, and outputs a valid test vector to the pads. To do this, the RUT address generator 20 must keep track of the RUT address, and increment it as requested by the data queue 18 (via the RUTINC, RUTADDRINC lines). The RUT address generator 20 sub-module is shown in FIG. 16.

A final test vector that is output to the pads consists of: a 24 bit RUT address, data value, R/W indicator, and a wait state signal. The address is formed by adding the value of the RUTADDRINC lines to the current RUT address. The data value is obtained from the data queue 18. The R/W indicator is given by the main controller 14. The external WAIT state signal must be generated by the RUT address generator 20 by checking the main controller 14's WAIT vote, and its own wait state circuitry. The RUT address generator 20 asserts its WAIT line if it detects that the current test vector being output is not valid, and/or the main controller 14 requests a wait state.

The tests described above can be made transparent by the application of Nicolaidis' transformation. FIG. 17C shows the result of transforming the test from FIG. 17B when it is assumed that cells 0, 1, 2 and 3 initially contain data values 0, 1, 1 and 0, respectively. The initialization sequence has been dropped, and the number of write operations to each cell is even. Essentially, the data backgrounds that are used in the transformed test are the bit-wise exclusive OR of the initial cell data values (first current values of the cells) and the corresponding data backgrounds in the original test (which are the columns of the underlying binary code). The transparent self-test consists of two phases: In the first phase, only the read operations of the transformed test are applied; e.g., only the horizontal sequence of vertical bars in FIG. 17C. In the second phase, the full transformed test, including all of the read and write operations, is applied. After both phases have been applied, the contents of a fault-free RAM are restored to the initial values by an additional background change sequence that returns to the first background. The length of the transparent test can be shown to be approximately $(7.5m+2)n$.

The example in FIGS. 17A, 17B and 17C illustrates the situation when an n×1 RAM is tested. When the RAM words have width k>1, the sequence of data words is more complex since one must also detect V-coupling faults involving different bits of the same word. The required modification involves the data background changes and the marches as follows: Data backgrounds can be changed one word at a time, with the old word being read before a new word is written. The operations of the march sequence, however, must be repeated k times to allow each bit to be read and toggled separately.

There has thus far been described a test pattern generator that is suitable for a testing chip. However, the size of the PROM makes it unsuitable for built in testing. There is now described a testing circuit (BIST RAM) that can be built into a RAM.

Figure 18A:
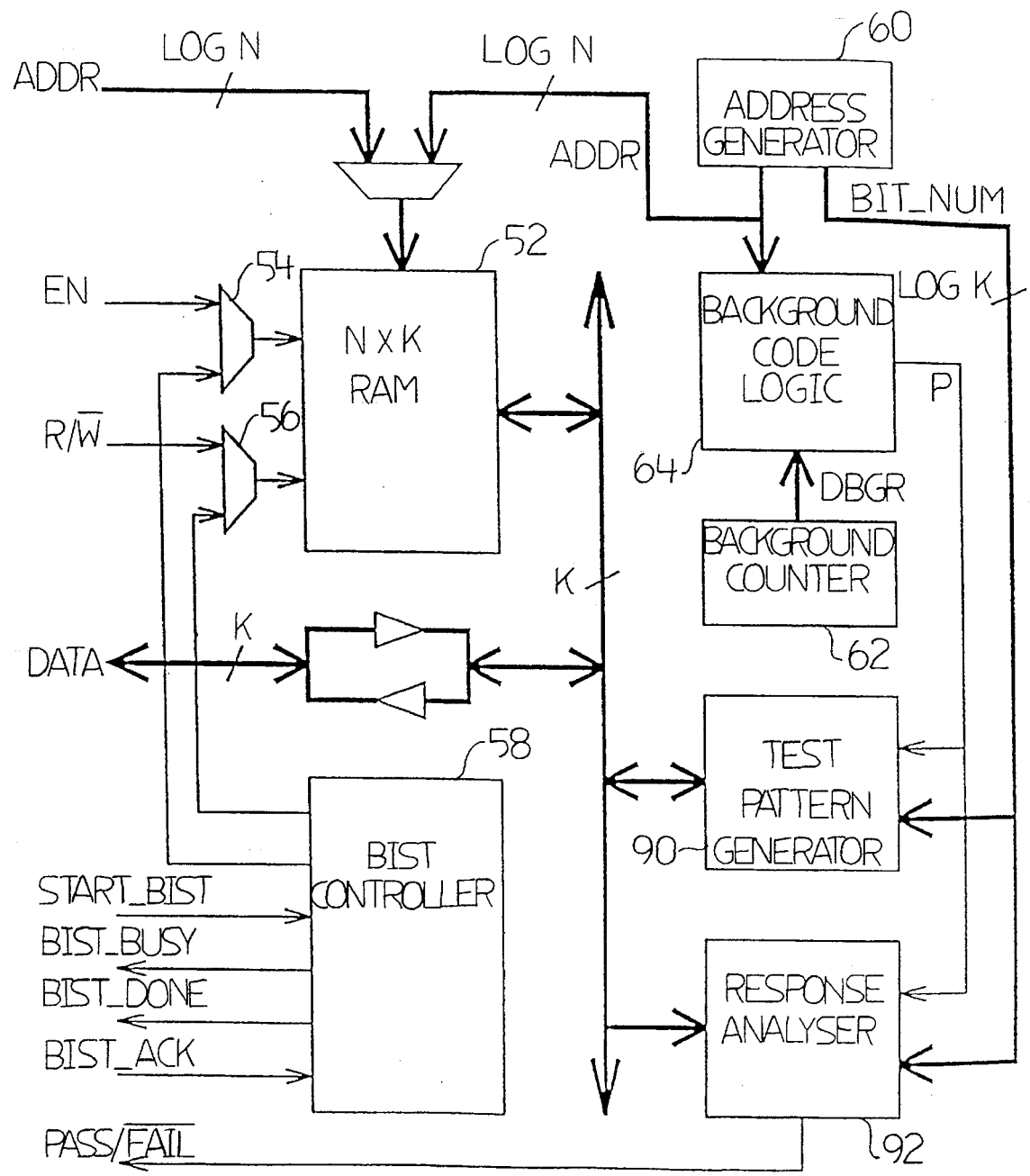
FIG. 18A is a simplified schematic of the system architecture for an exemplary 8 k×8 BIST RAM according to the invention.
Figure 18B:
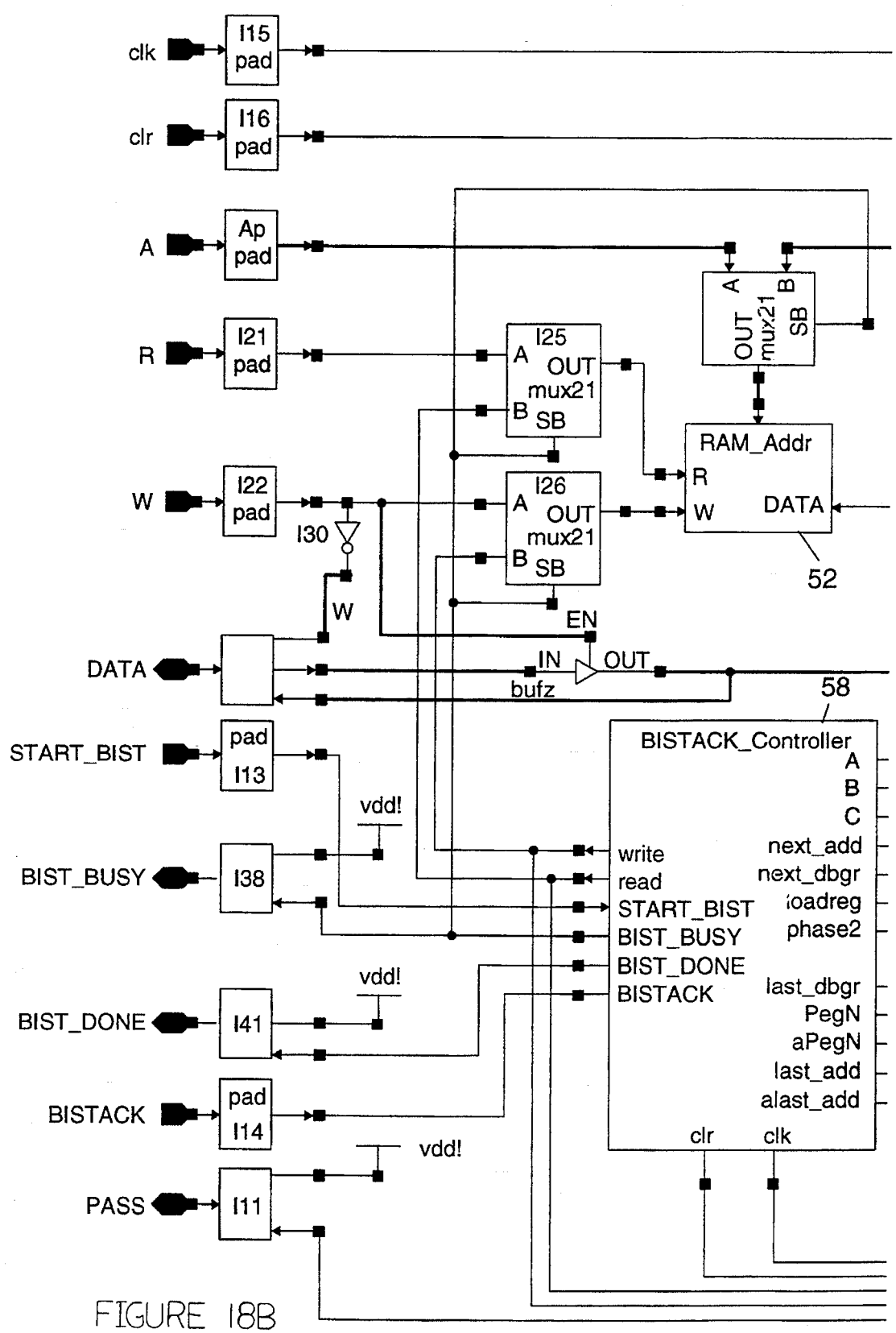
FIG. 18B is a version of FIG. 18A showing detailed inputs and outputs for the examplary BIST RAM.
Figure 18C:
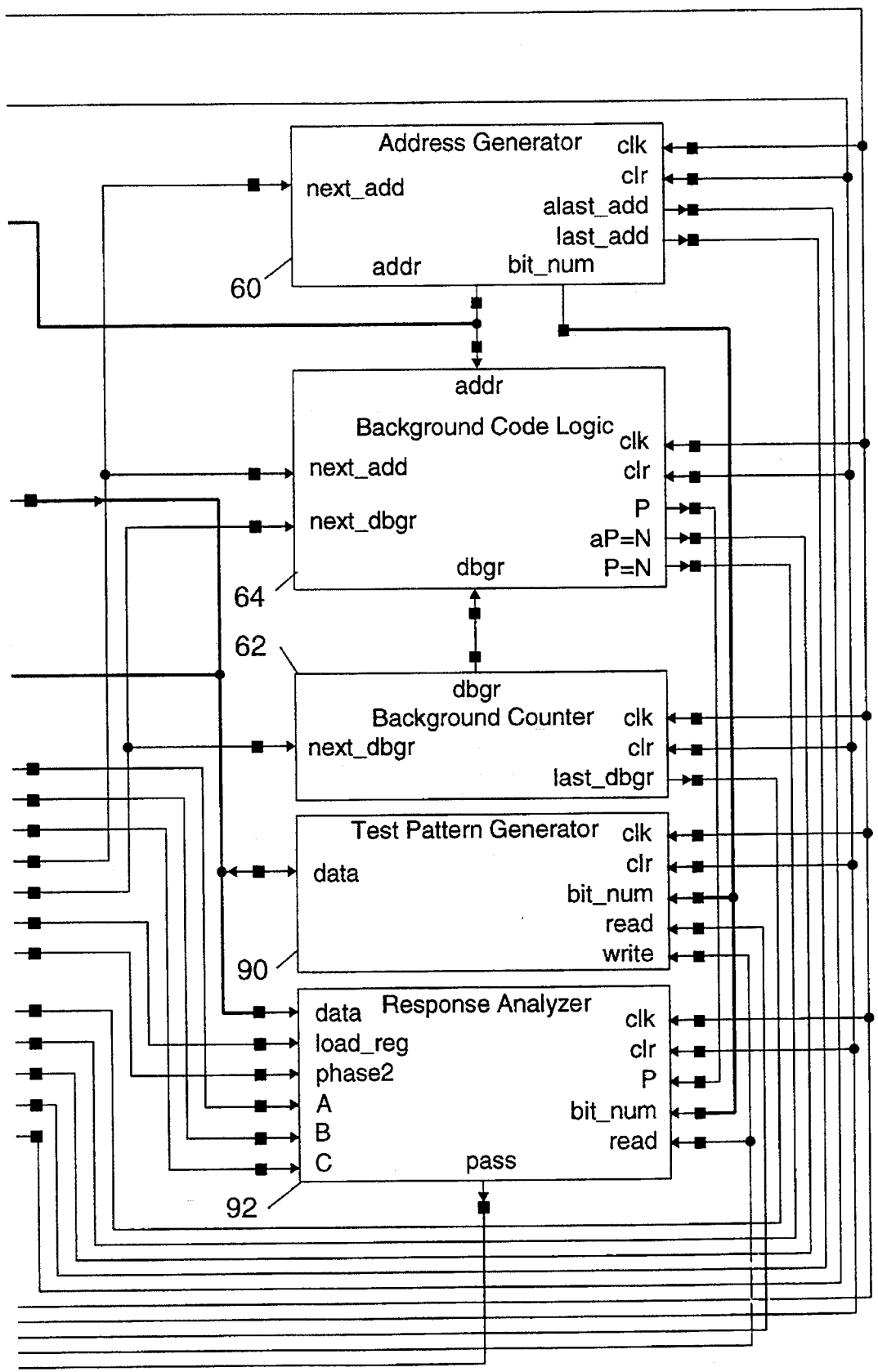

The architecture of the proposed BIST RAM scheme is illustrated in FIGS. 18A and FIGS. 18B and 18C. A brief description of the BIST RAM will first be given in relation to FIG. 18A, and then a more detailed description will be given in relation to FIGS. 18B and 18C and 22–50. At the core of the system is a standard n×k random-access memory 52. This RAM is assumed to have an enable input EN, a read/write input R/W, $e=\log_2 n$ address inputs ADDR0, ... ,ADDRe, and a k-bit-wide bi-directional data bus DATA0, . . . ,DATA(k−1). Multiplexers 54, 56 are used to isolate the RAM from the external environment during the execution of the self-test. Surrounding the RAM are the added BIST sub-systems which are now described.

The BIST controller 58 sequences the operations of the BIST data path (sub-systems on the right-hand-side), receives internal status signals, and interfaces with external test control signals. Eight states and two flip-flop flags, called test and done_read, are used to produce the required controller behavior, which is illustrated by the state diagram in FIG. 19. The controller behavior is described later in more detail.

The address generator (AG) 60 is a $(\log_2 n + \log_2 k)$-bit-wide up-counter in this implementation. The upper $\log_2 n$ bits from the AG form the word address (addr) that is used to address RAM words, and the lower $\log_2 k$ bits form the bit number (bit_num) that is used to select a bit within the currently addressed word. The upper $\log_2 n$ bits could equally well be generated using a more compact linear feedback shift register (LFSR), a linear cellular automata register (LCAR), or any other $(\log_2 n)$-bit-wide state machine with a maximum length exhaustive state sequence. A control input next_addr is used by the BIST controller 58 to increment the address generator 60. A status output last_addr is asserted by the address generator 60 when the last value of addr is reached in the count sequence.

The background counter (BC) 62 records the number dbgr of the data background currently being used, where $0 \le dbgr \le m-1$ and m is the total number of backgrounds present in the test. A control input next_dbgr is used by the BIST controller 58 to increment dbgr. A status output last_dbgr is asserted by the BC when dbgr=m−1. The current data background number dbgr is routed to the background code logic (BCL) 64, which is a combinational block that computes the binary value P of the (dbgr)th code bit for the (addr)th codeword, where addr is the current word address from the address generator 60. A status signal P=N is asserted when bit P is equal in value to the bit N of the (dbgr+1)st bit of the (addr)th codeword.

Figure 20:
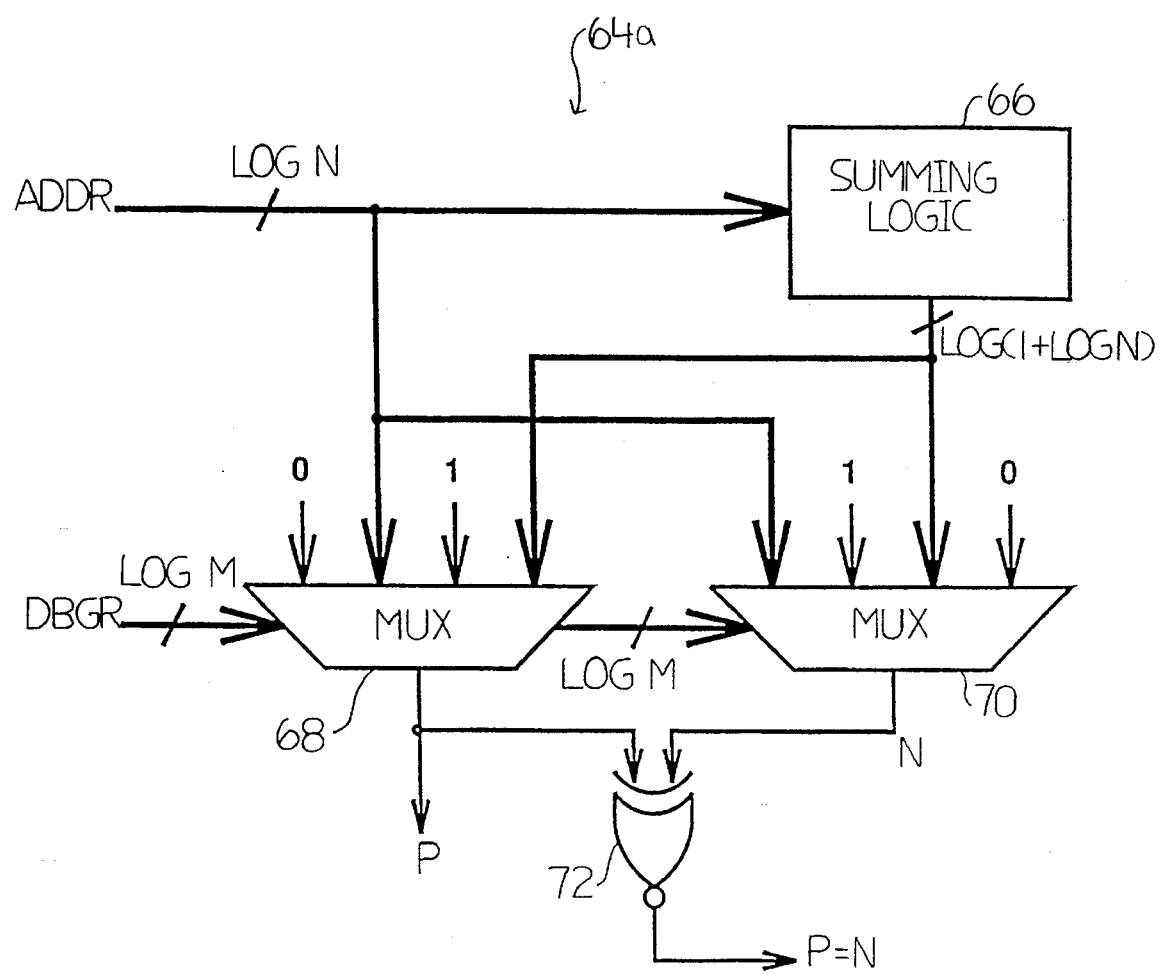
FIG. 20 shows a first exemplary background code logic bit generator for use with the apparatus of FIG. 18A.

FIG. 20 illustrates an exemplary background code logic generator 64a that is used to generate the (n,2)-exhaustive code of length $\lceil \log_2 n \rceil + \lceil \log_2(1+\lceil \log_2 n \rceil) \rceil + 2$. This code is required by the BIST design to generate a near-deterministic test for detecting single 3-coupling faults. The block labelled Summing Logic 66 counts the number of 0s appearing in the word address addr. The two multiplexers 68, 70 are used to select the present background code logic bit P and the next code bit N from among logic 0, logic 1 the bits of addr, and the bits of the binary number computed by the summing logic 66. An XNOR gate 72 is used to generate the P= N status signal. Assuming a RAM cycle time of 100 ns, this self-test runs for 56 ms, 1.14 s and 21.4 s for n×1 memories of size 4K, 64K and 1M, respectively.

Figure 21:
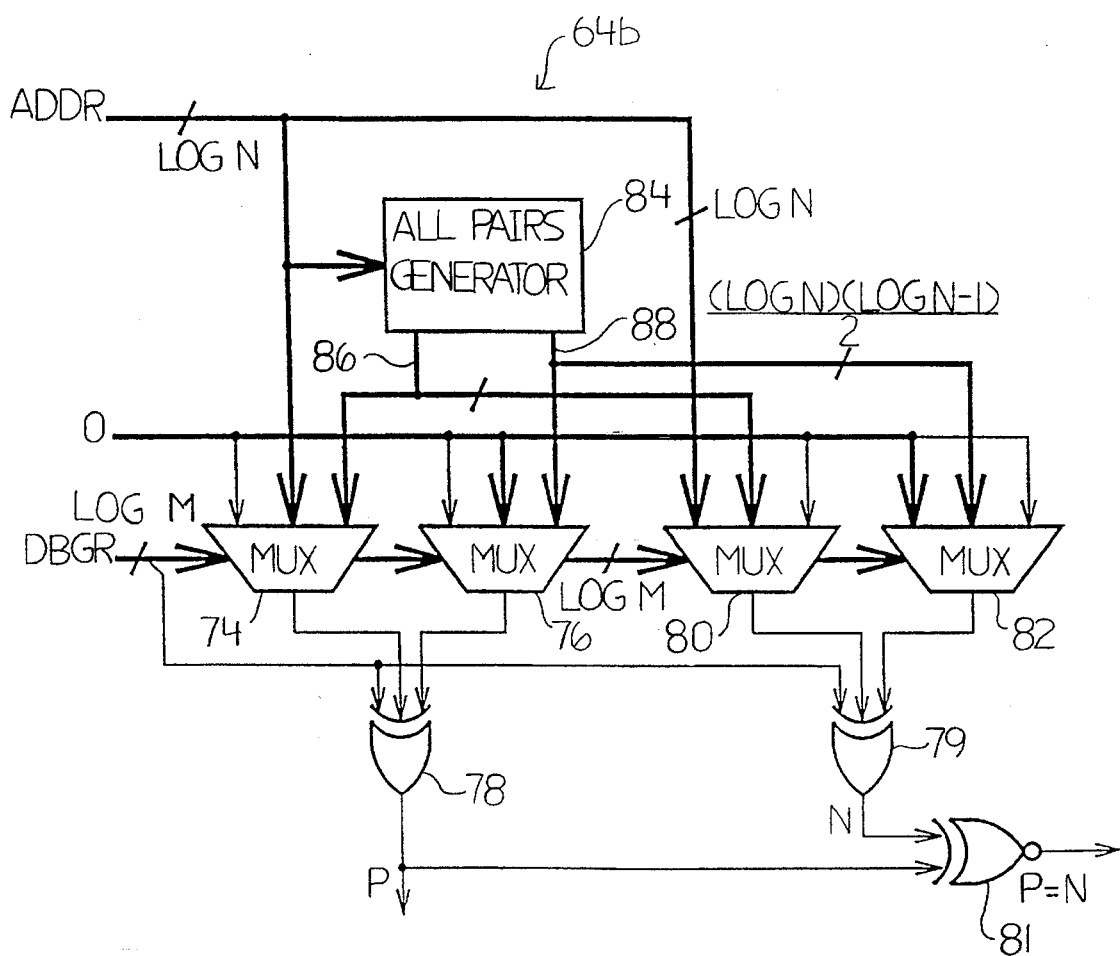
FIG. 21 shows a second exemplary background code logic bit generator for use with the apparatus of FIG. 18A.

FIG. 21 illustrates a more complex background code logic generator 64b that generates an (n,3)-exhaustive code of length $([(\log_2 n)])^2 + [(\log)_2 n] + 2$. This code is suitable for producing near-deterministic, transparent tests that detect single 4-coupling faults. The two left-most multiplexers 74, 76 select two single bit inputs to be routed to a 3-input XOR gate 78 that drives P; the third gate input to the XOR gate 78 is a signal, possibly the MSB of dbgr, that is 1 for the last m/2 data backgrounds. The two right-most multiplexers 80, 82 are used to produce the next bit N under control of the data background. To produce the next bit N, output from the multiplexers 80, 82 is supplied to XOR gate 79 along with the databackground. P and N are sent to XNOR gate 81, which produces a signal indicative of P= N, such that, in the case P=N, the next background code logic bit need not be updated, thus saving in computation. An all pairs generator 84 contains connections to all pairs of lines in the address addr. Exiting the all pairs generator 84 are two buses 86, 88 that carry left and right members of each address bit pair to corresponding inputs of different multiplexers 74, 76, 80, 82. The resulting code is (n,3)-exhaustive. Assuming a RAM cycle time of 100 ns, this self-test runs for 486 ms, 13.5 s, 332 s and 126.3 min for n×1 memories of size 4K, 64K, 1M and 16M, respectively.

It is possible to reduce the size of the background code logic, at the cost of longer test time, by not providing circuitry dedicated to calculating the next background code logic bit N. The circuitry for calculating the current background code logic bit would then have to be used two separate times, to calculate P and then N.

Probabilistic tests result if the background code logic generators 64, 64a, 64b implement a hashing function that reduces the word address addr and data background dbgr down to a single bit P. A simple parity function would not be satisfactory for this application since the corresponding code matrix would be a checkerboard with only two distinct data backgrounds. A more suitable hashing function would be some prefix of either the (n,3)- or (n,4)-exhaustive codes. This way the data backgrounds would all be different from each other.

Referring to FIG. 18A, the test pattern generator (TPG) 90 produces k-bit-wide test data words that are written into the RAM 52 during the execution of the BIST routine. In cases where a transparent test is applied to the RAM 52, the data bus must be bi-directional so that each new test data word can be derived by toggling bits in a data word previously read from the RAM 52. The test pattern generator 90 requires the current bit number bit_num from the address generator 60, and the current code bit P from the background code logic generator 64.

The response analyzer 92 contains a 16-bit multiple input feedback shift register (MISR), not shown, a 16-bit register, and a 16-bit comparator. The MISR is used to compute the two signatures required in a transparent test. Data words must be bit-wise complemented before being input to the MISR for all read operations that expect data complemented with respect to the originally stored data. A control input clrsig is used by the BIST controller 58 to clear the signature. The register is used to store the signature from phase 1 when a control signal load_reg is asserted by the controller. After the second signature is computed at the end of the test, the two signatures are compared. If they are the same, which would be the case in a good memory, then the PASS/FAIL status output signal is asserted high to indicate that the BIST routine detected no failures; otherwise the signal is asserted low, and the RAM under test may be discarded or repaired as desired. An alternative method for detection of cell coupling faults is to compare the values of each cell each time it is read with the cell content of a known perfect RAM.

Figure 19:
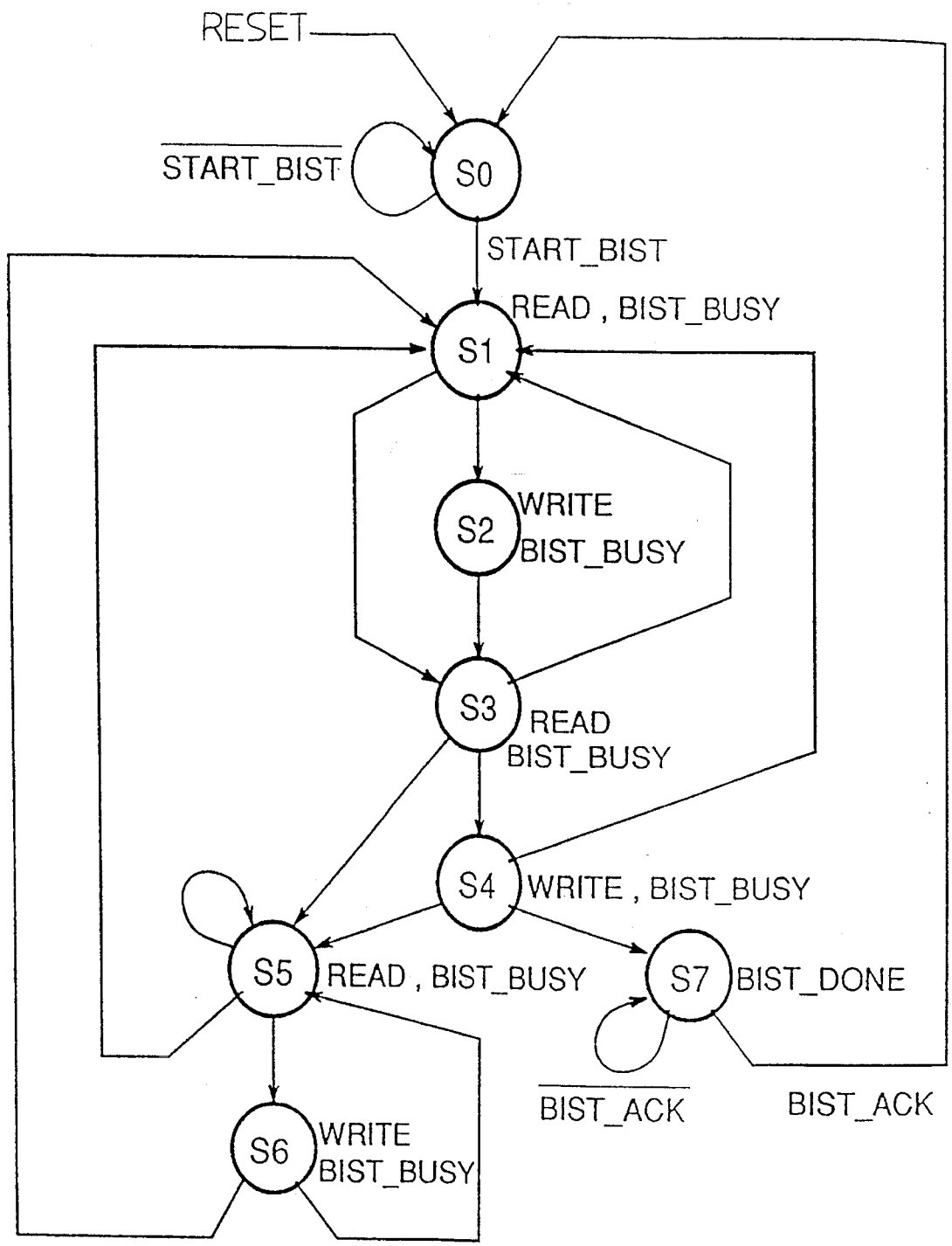
FIG. 19 shows a simplified state diagram for the apparatus of FIG. 18A.

FIG. 19 shows a simplified state diagram that specifies the behavior of the BIST controller 58 (not all signals have been shown). In normal operation, the controller 58 remains in state S0 while system outputs BIST_BUSY and BIST_DONE are deasserted. In state S0 the BIST RAM 52 behaves like a regular RAM accessible via the external address lines ADDR, the enable line EN, the read/write line R/W, and the k-bit-wide bidirectional data bus DATA. When system input START_BIST is asserted by the environment, the BIST controller 58 enters state S1 and begins executing the self-test routine, which is sequenced by states S1–S6. While in these states, the BIST controller 58 asserts the system output BIST_BUSY and disables externally initiated memory accesses.

The self-test routine computes a signature in each of two phases. Flip-flop test is cleared during phase 1 and set during phase 2. When test is cleared, the controller 58 is constrained to the three states S1, S3 and S5, which are states that generate only read operations. States S1 and S3 generate the read operations extracted from the marches, and state S5 generates the read operations extracted from the background changes. At the end of the first phase, load_reg and clr_sig are asserted in state S3 to store the signature and to clear the MISR in the response analyzer. Also, flag test is set to enable entry into states S2 and S4, which generate write operations.

In phase 2, the BIST controller 58 is constrained to states S1–S6. States S1–S4 generate the march sequences, while states S4 and S5 generate the background changes. As read and write operations are applied to the RAM 52, a second signature is computed by the MISR in the response analyzer 92.

Once phase 2 of the self-test routine has completed, the controller 58 enters state S7 and asserts the BIST_DONE system output while the response analyzer 92 drives the PASS/FAIL signal to reflect whether or not the signature computed in phase 2 equals the signature computed in phase 1. The BIST controller 58 remains in this state until the environment acknowledges by asserting the BIST_ACK system input, whereupon the controller 58 returns to state S0 to re-enable normal memory operation.

There has thus been described a transparent BIST scheme that detects single V-coupling faults in RAMs. For the cases when V∈{2, 3, 4}, it is possible to base the transparent tests on deterministic tests that have 100% fault coverage, The resulting transparent near deterministic tests have very high, but less than 100%, fault coverage because of the finite probability of aliasing inherent in the method. Nevertheless, the defect coverage of the resulting tests is high because the probability of aliasing can be reduced by using longer signatures. To reduce the test time, it is possible to sacrifice fault coverage and base the transparent tests on the probabilistic tests for V-coupling faults obtained by constructing the tests using pseudorandom codes as opposed to (n, V−1)-exhaustive codes.

Area overhead resulting from the added BIST circuitry is expected to be approximately 17% for a 64K RAM and under 2% for a 1M RAM when using the (n, 2)-exhaustive code described earlier. As with most other BIST RAM designs, the overhead decreases with larger RAM sizes since the area of the BIST circuit grows slowly with RAM size. The precise overhead of the proposed scheme also varies depending on the code generating circuit underlying the particular test. In general, larger values of V require more complex background code logic and hence lead to larger BIST overhead.

The BIST may also include means (not shown) responsive to an external signal to abort the BIST routine at any time and safely restore the RAM data. This would facilitate the periodic running of the BIST routine in an on-line memory subsystem. There may also be means to provide more than one BIST routine to the user; for example, a relatively long (and extremely thorough) test and a relatively short (but less thorough) test may be provided according to a selection made by the user. The transparency property may also be sacrificed in favor of providing guaranteed 100% fault coverage; this could be done by using a deterministic BIST routine that overwrites the stored data.

The architecture of the proposed BIST RAM system is illustrated in FIG. 18B assuming an 8K×8 RAM size. The interface signals with the external environment, which are shown at the left side of FIG. 18B, are as follows: The clk and clr signals are the system clock and system reset signals, respectively, that are routed to the various synchronous subsystems, including the BIST controller 58, the address generator 60, the background code logic 64, the background counter 62, the test pattern generator 90, and the response analyzer 92. When the BIST RAM is operated in normal mode, inputs A12, . . . ,A0 supply the RAM address, input R supplies the read signal, input W supplies the write signal, and bi-directional signals DATA7, . . . ,DATA0 convey 8-bit data words to and from storage cells in the RAM. The BIST RAM design shown may be modified to accept a read/write and an enable input rather than separate read R and write W inputs. The START_BIST input is asserted by the external environment to initiate the self-test routine. The BIST_BUSY output is asserted to inform the external environment that the self-test routine is currently executing and that normal RAM read and write operations are disabled. The BIST_DONE output is asserted by the BIST controller 58 to inform the external environment that the BIST routine has completed, and that normal RAM operation is still disabled until the BISTACK input is asserted. The PASS output, which originates from the response analyzer 92 as the pass signal, indicates whether or not the self-test routine detected a fault in the RAM.

At the core of the BIST RAM system shown in FIG. 18B is an n×k random-access memory (RAM) 52. This RAM 52 is assumed to have a read input RAM_R, a write input RAM_W, 13 address inputs RAM_Addr12, . . . ,RAM_Addr0, and an 8-bit-wide bi-directional data bus RAM_data7, . . . , RAMdata0. (The number of address lines and data lines must suit the size of the RAM 52.) Multiplexers are used to isolate the RAM 52 from the external environment during the execution of the self-test. Thus multiplexer I25 in FIG. 18B selects the external read signal R from input pad I21 to be sent to the RAM 52 when the BIST RAM is operated in normal mode, and selects the read signal read generated internally by the BIST controller 58 when the BIST RAM is executing the self-test.

Surrounding the RAM 52 are the BIST sub-systems which we now describe in turn. The BIST controller 58 sequences the operations of the BIST data path (sub-systems 60, 64, 62, 90, and 92 on the right-hand-side of FIG. 18B), receives internal status signals, and interfaces with external test control signals. Eight states and two flip-flop flags, called phase2 and done_read, are used to produce the required controller behavior, which is illustrated by the simplified state diagram in FIG. 19. The controller behavior is detailed later. The address generator 60 is a 16-bit wide counter in the current implementation (Note that here $\log\_2 n + \log\_2 k = \log\_2 8K + \log\_2 8 = 16$). The upper $\log\_2 8K = 16$ bits from the address generator 60 form the word address (Addr12, ... ,Addr0) that is used by the RAM 52 to uniquely identify a word to be accessed, and the lower $\log\_2 8 = 3$ bits form the bit number (bit_num2,..,bit_num0) that is used by the background code logic 64, test pattern generator 90 and response analyzer 92 to identify select one bit within the currently accessed word. The address generator 60 could equally well be implemented using a more compact linear feedback shift register (LFSR) as in (Nicolaidis, "Transparent BIST for RAMs," Proc ITC, 1992, pp. 598–607), a linear cellular automata register (LCAR), or any other ($\log\_2 n$)-bit-wide state machine with a maximum length, exhaustive state sequence. A control input next_add is used by the BIST controller 58 to increment the address generator 60. Status outputs last_addr and alast_addr are asserted by the address generator 60 when the last value of Addr is reached in the count sequence. Signal last_addr is the latched variant of signal alast_addr.

Figure 22:
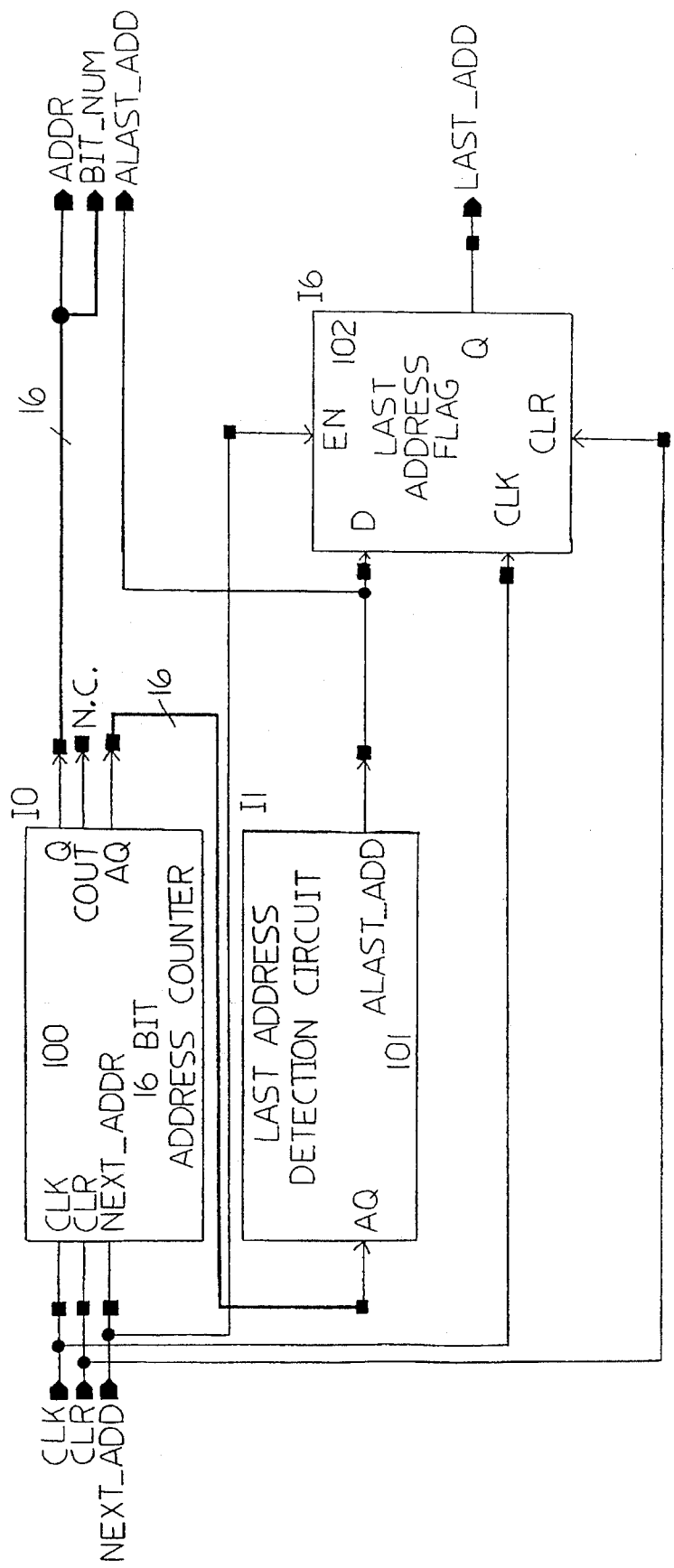
FIG. 22 is a schematic showing an address generator for the BIST RAM of FIG. 18A.
Figure 23:
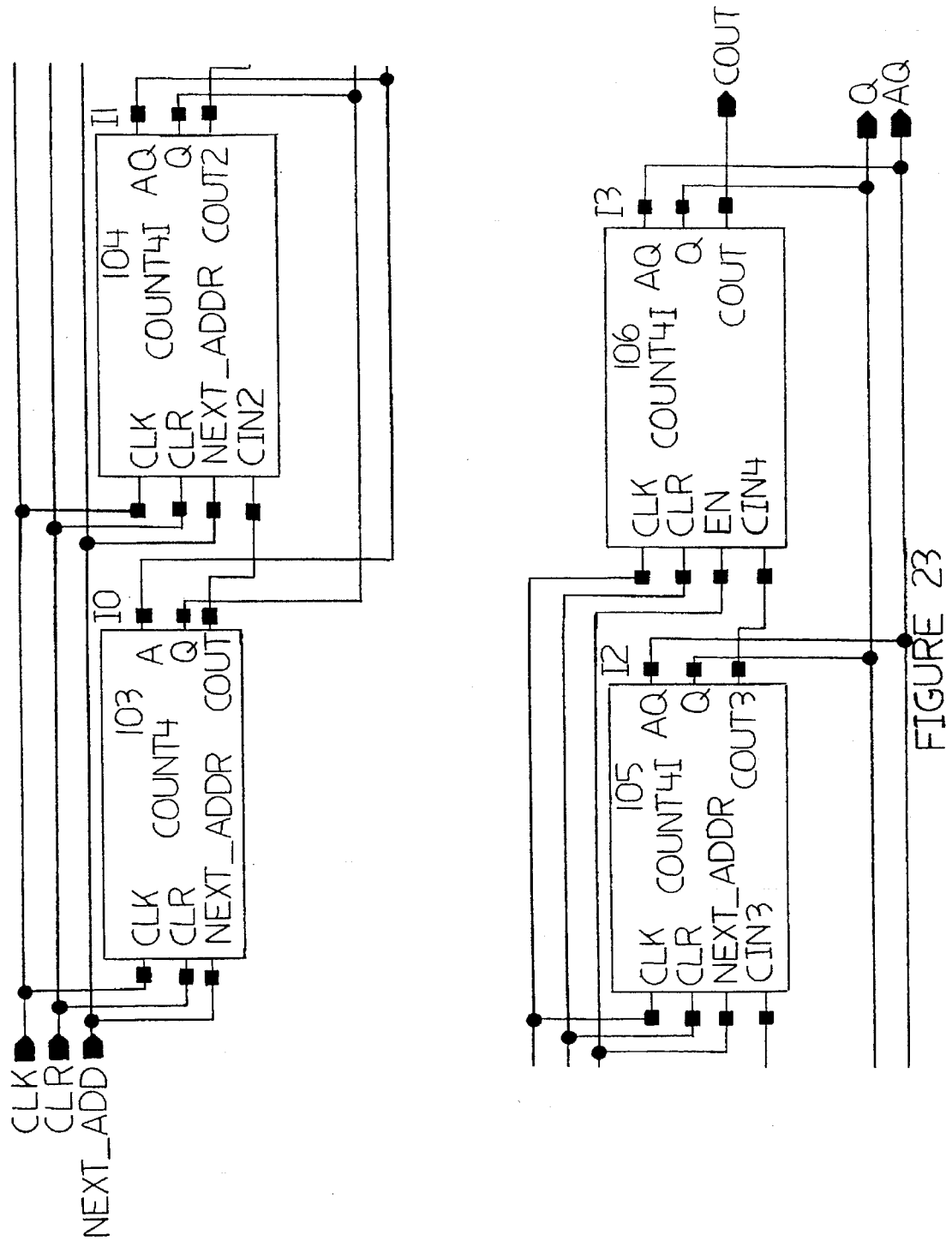
FIG. 23 is a schematic showing an address counter for the address generator of FIG. 22.
Figure 24:
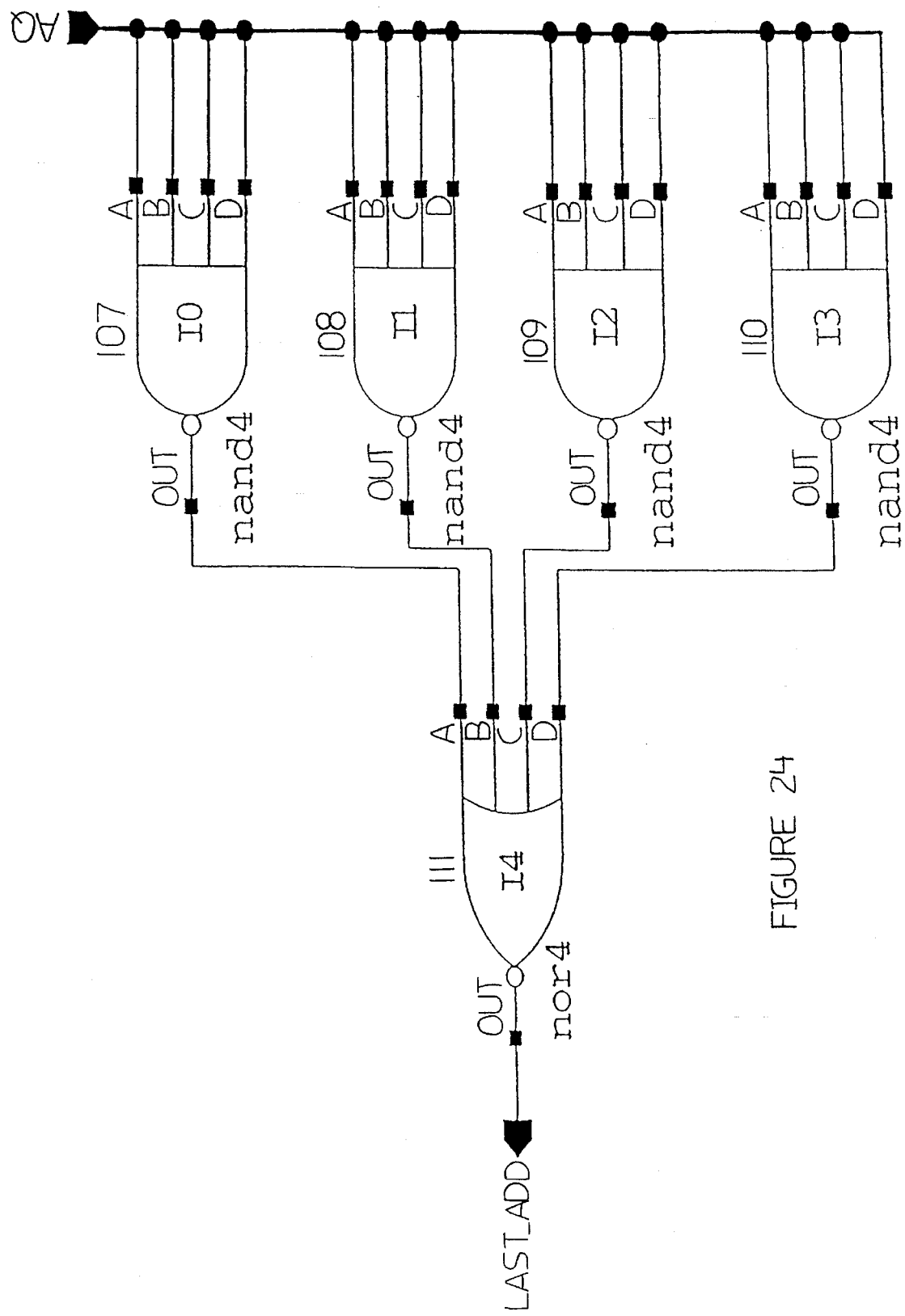
FIG. 24 is a schematic showing a last address detection circuit for the address generator of FIG. 22.

FIGS. 22, 23 and 24 provide internal details of the address generator 60. FIG. 22 shows how the address generator 60 is composed of a 16-bit synchronous address counter 100, a last address detection circuit 101, and a last address flag 102. Counter outputs Q15, ... ,Q0 are the latched variants of asynchronous counter outputs aQ15, ... ,aQ0. FIG. 23 shows how the address counter 100 is composed of four 4-bit counter slices 103, 104, 105, and 106. Counter outputs Q15, ... ,Q0 are separated into two fields: field Q15, ... ,Q3 is used as the word address Addr12, ... ,Addr0; field Q2, . . . ,Q0 is used as the bit number bit_num. FIG. 24 shows how the last address detection circuit 101 is constructed of NAND gates 107, 108, 109 and 110, and NOR gate 111. The output alast_addr of the last address detection circuit 101 is asserted as soon as the address aQ15, ... ,aQ0 is equal to the last total address (word address Addr concatenated with the bit number bit_num )of the RAM 52. For the example 8 k×8 RAM, the last address is given as a 16-bit binary number with all 1s. The last address flag 102 is implemented as a D flip-flop.

Figure 25:
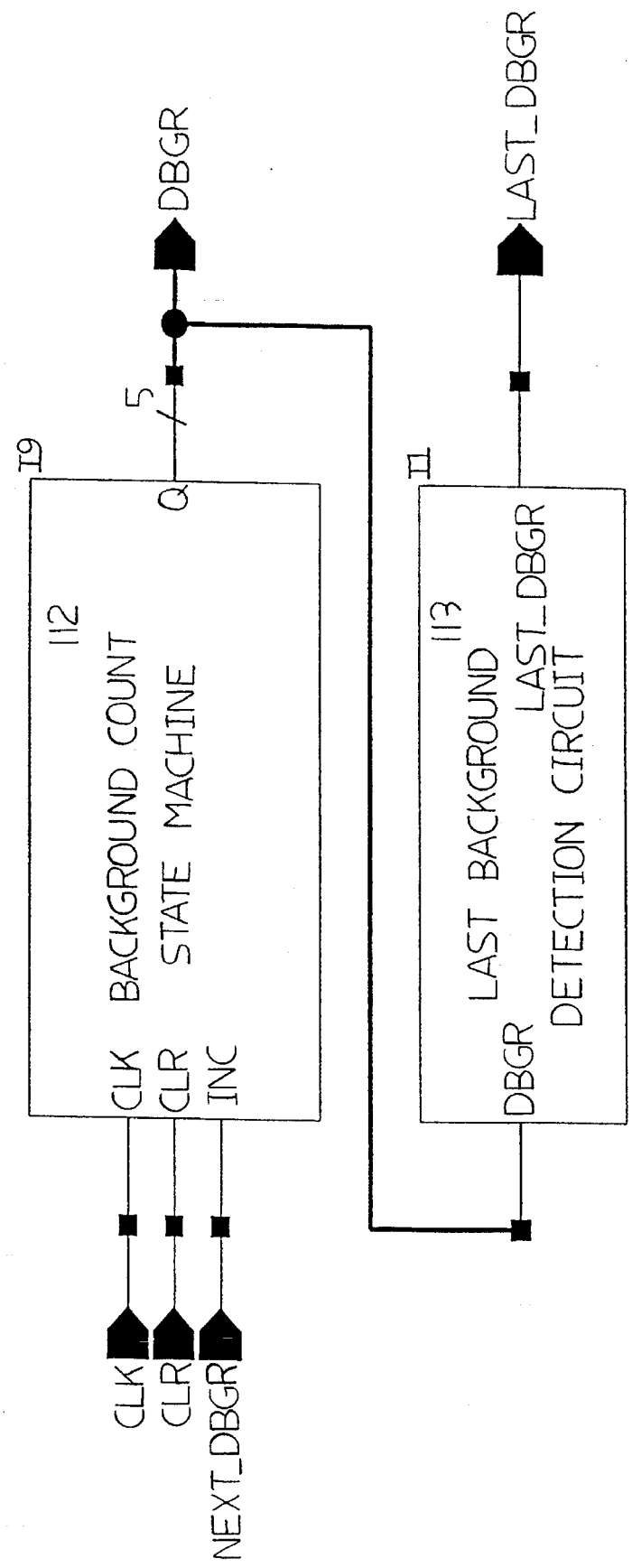
FIG. 25 is a schematic showing a background counter for the BIST RAM of FIG. 18A.

The background counter 62, shown in FIG. 25, records the number dbgr of the data background currently being used, where 0<=dbgr<=m−1 and m is the total number of backgrounds present in the test. In this example BIST RAM, m=19. The control input next_dbgr is used by the BIST controller 58 to increment dbgr by enabling the count function of the background counter 62. The status output last_dbgr is asserted by the background counter 62 when dbgr=m, that is, when the last data background has been reached.

Figure 26:
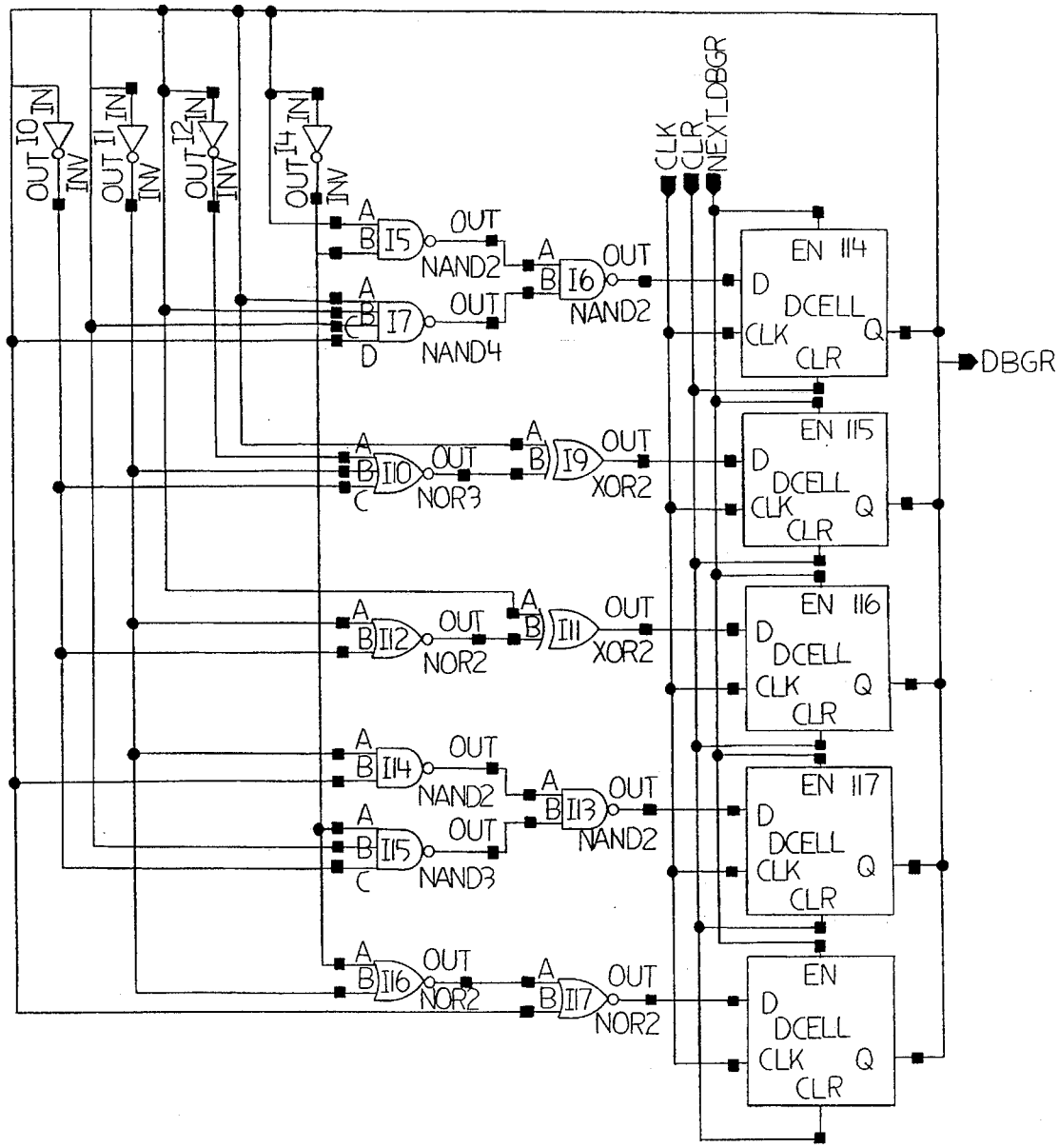
FIG. 26 is a schematic showing a 5-bit background counter for the background counter of FIG. 25.
Figure 27:
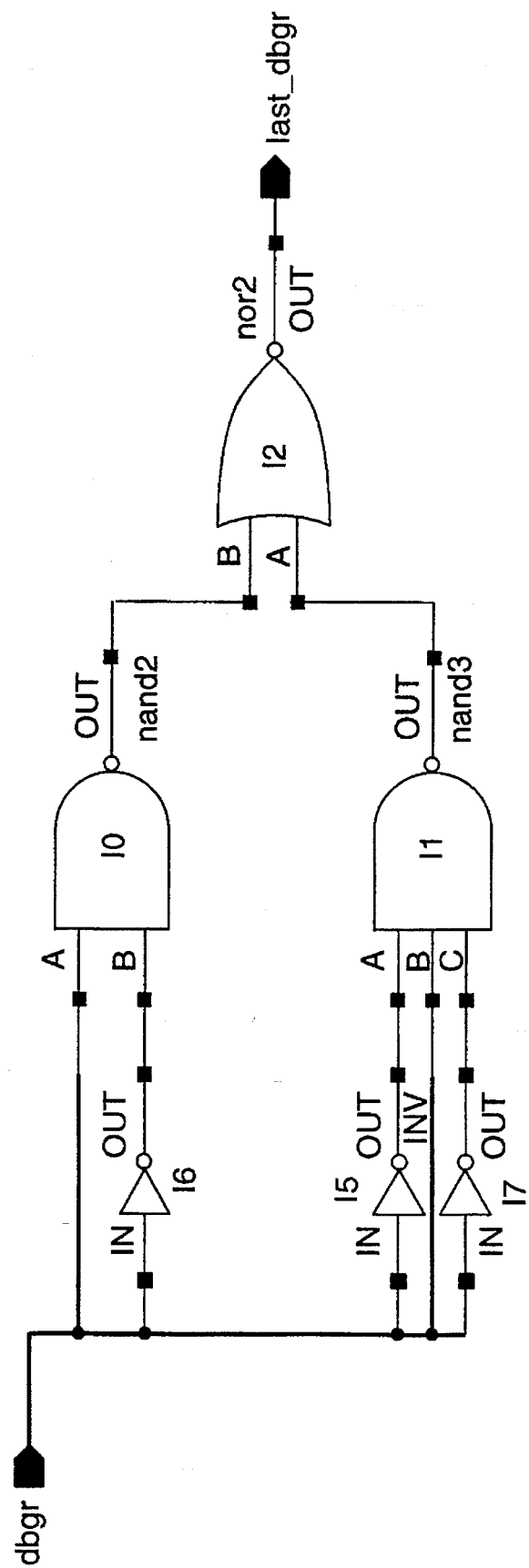
FIG. 27 is a schematic showing a last bit background detection circuit for the background counter of FIG. 25.

FIG. 25 shows how the background counter 62 is composed of the background count state machine 112 and the last background detection circuit 113. The last background detection circuit 113 monitors the data background dbgr and asserts the last_dbgr signal when dbgr reaches the last background m−1=18. FIG. 26 shows how the 5-bit background count state machine 112 is constructed using five D flip-flops 114, 115, 116, 117 and 118, and combinational next state logic implemented using standard logic gates. FIG. 27 shows how the last background detection circuit 113 is implemented using standard logic gates.

Figure 28:
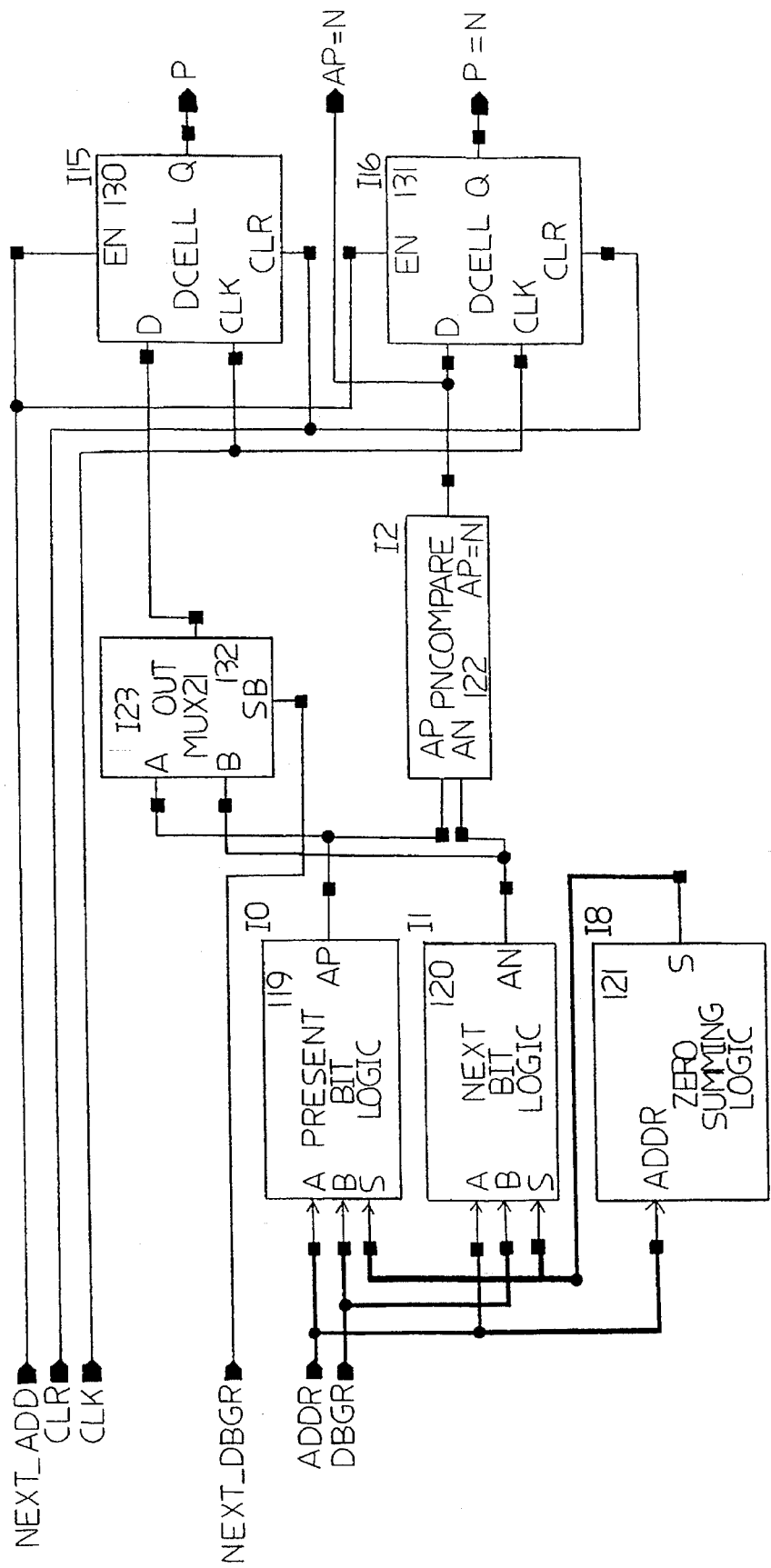
FIG. 28 is a schematic showing a background code logic generator for the BIST RAM of FIG. 18A.

The background code logic 64 receives the word address Addr (and possibly also the bit number bit_num, as explained below) and produces the current background code logic bit P and the P=N and aP=N status signals. FIG. 28 shows how the background code logic 64 is implemented. The signal aP corresponds to the value of the element at the (Addr,bit_num)-th column and the dbgr-th row of the underlying (n,V−1)-exhaustive matrix. By (Addr,bit_num) we mean the number obtained by concatenating the bits of Addr with the bits of bit_num. The signal aN corresponds to the value of the entry at the [((Addr,bit_num)+1) mod m]th column and the (dbgr)-th row of the underlying (n,V−1)-exhaustive matrix. Signals aP and aN are the unsynchronized variants of the current background code logic bit and the next background code logic bit, respectively. Output P is obtained by latching aP using D flip-flop 130. The signal aP=N is asserted as soon as it is determined by the comparator 122 that signals aP and aN have the same logic values. The signal P=N is a latched variant of aP=N implemented using D flip-flop 131. Multiplexer 132 is used to replace aP with aN at the input of D flip-flop 130 when the control input next_dbgr is asserted, indicating the beginning of the next data background.

In the example 8K×8 BIST RAM, the bit number bit_num is not shown communicating from the address generator 60 to the background code logic 64. This will be the case when V-coupling faults are assumed not to involve different bits of the same RAM word (the most general case is that different bits within the same RAM word can in fact be involved in the same V-coupling fault). The descriptions of aN and aP in the preceding paragraph are for this case simplified by replacing all occurrences of (Addr,bit_num) with only Addr. The underlying matrix is also changed to be (n/k,V−1)-exhaustive rather than (n,V−1)-exhaustive. In the example 8K×8 BIST RAM, the underlying matrix is thus (1K,2)-exhaustive.

Figure 29:
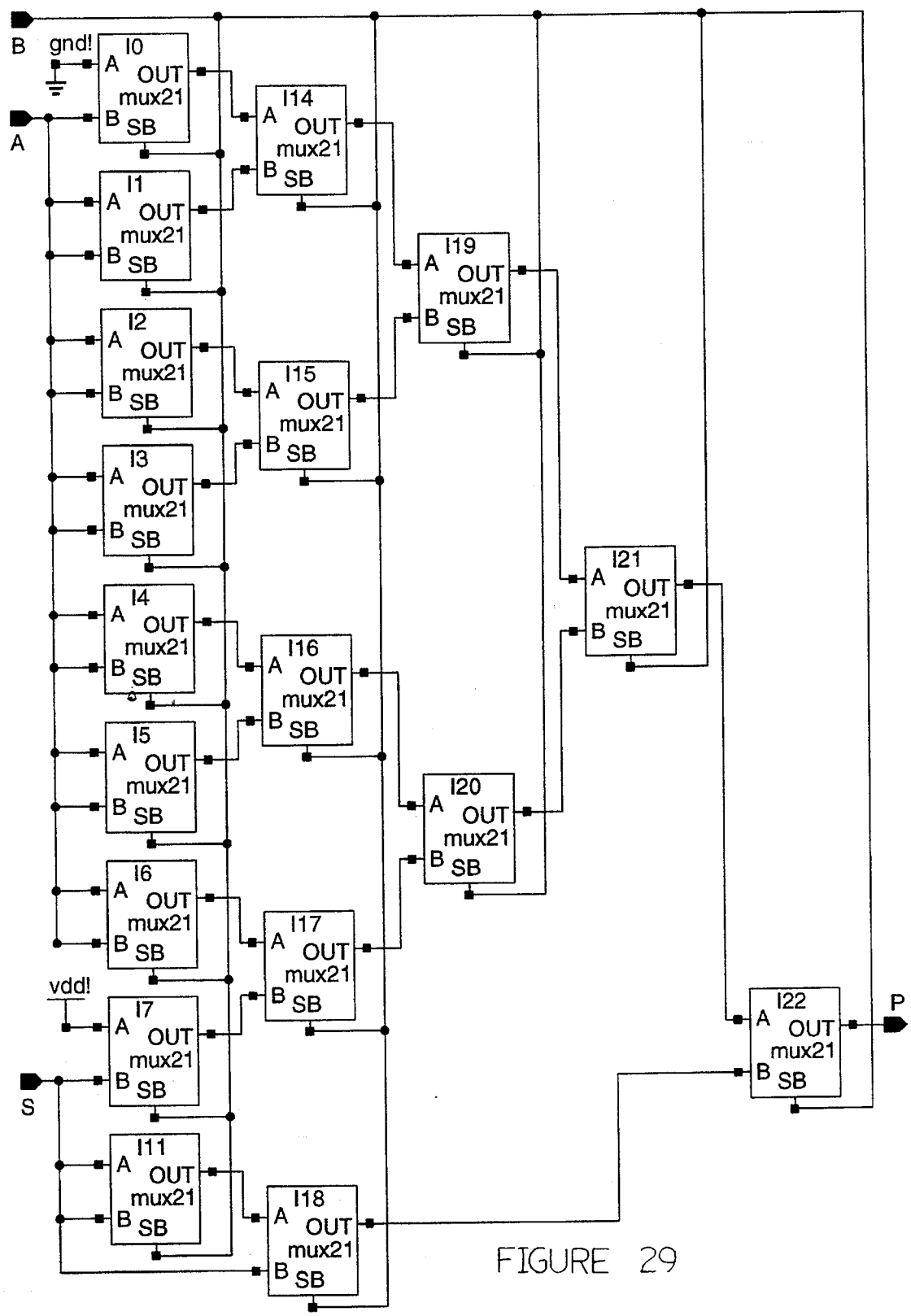
FIG. 29 is a schematic showing present bit logic for the background code logic shown in FIG. 28.
Figure 30:
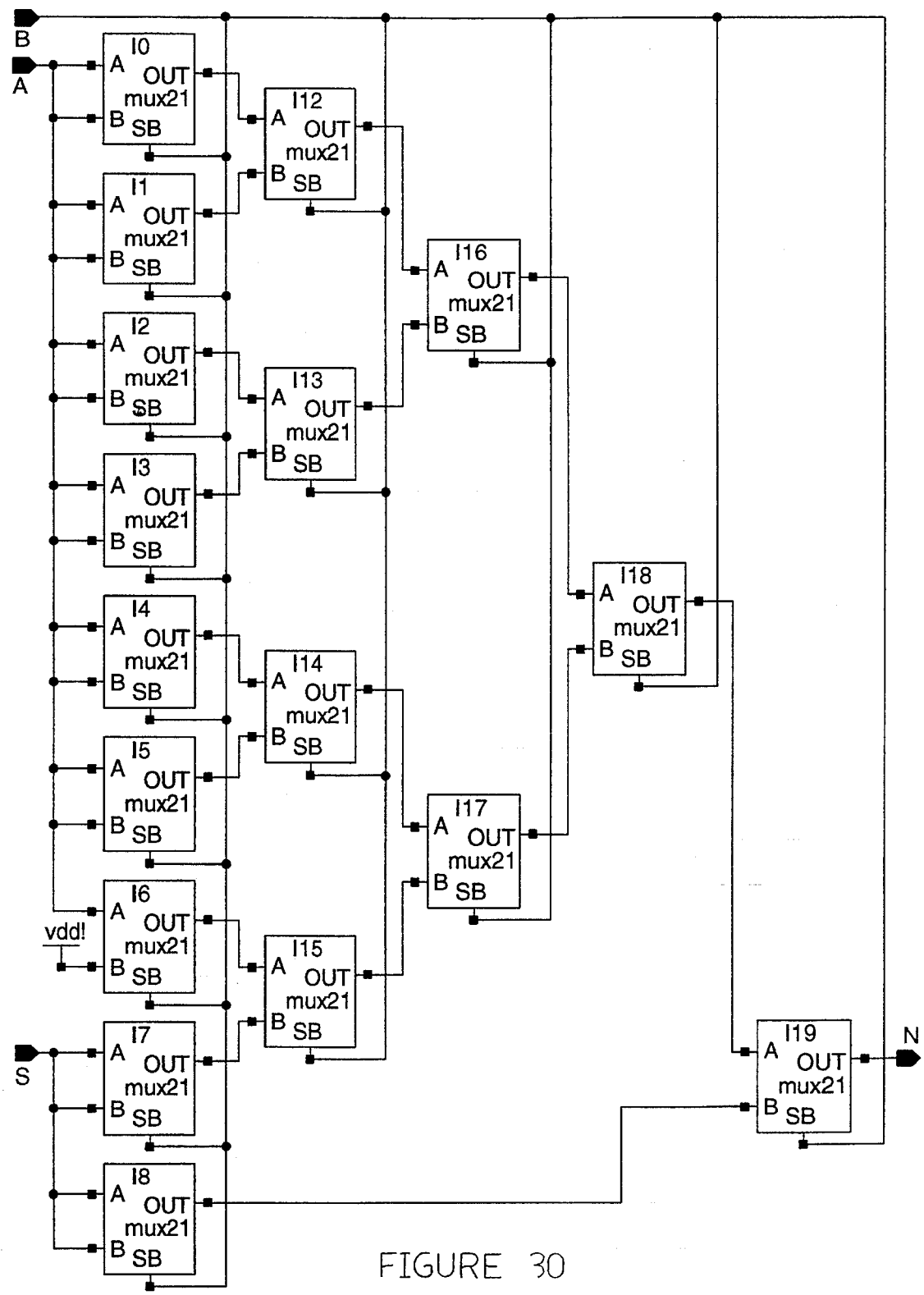
FIG. 30 is a schematic showing next bit logic for the background code logic generator shown in FIG. 28.
Figure 31:
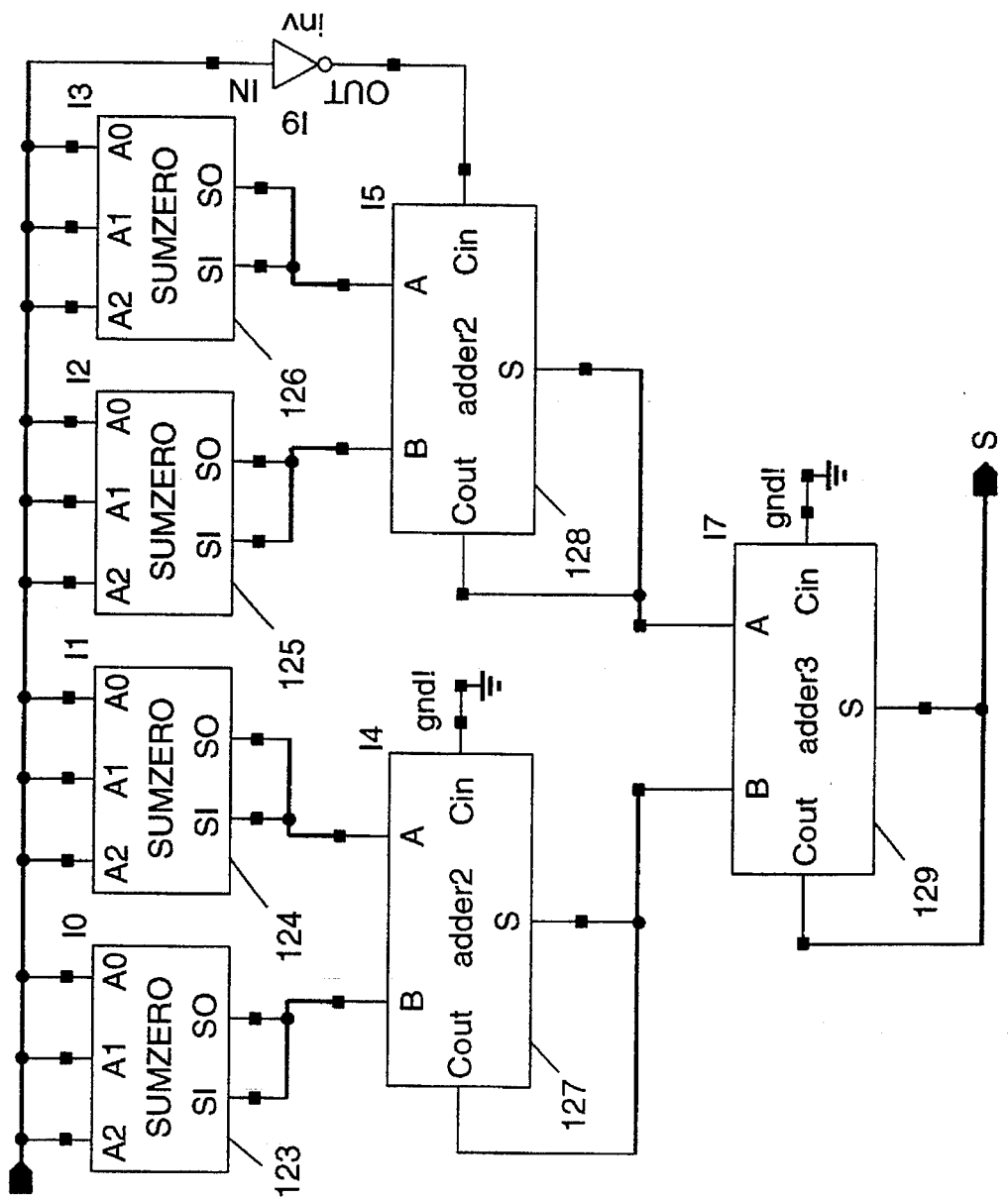
FIG. 31 is a schematic showing zero summing logic for the background code logic generator shown in FIG. 28.
Figure 32:
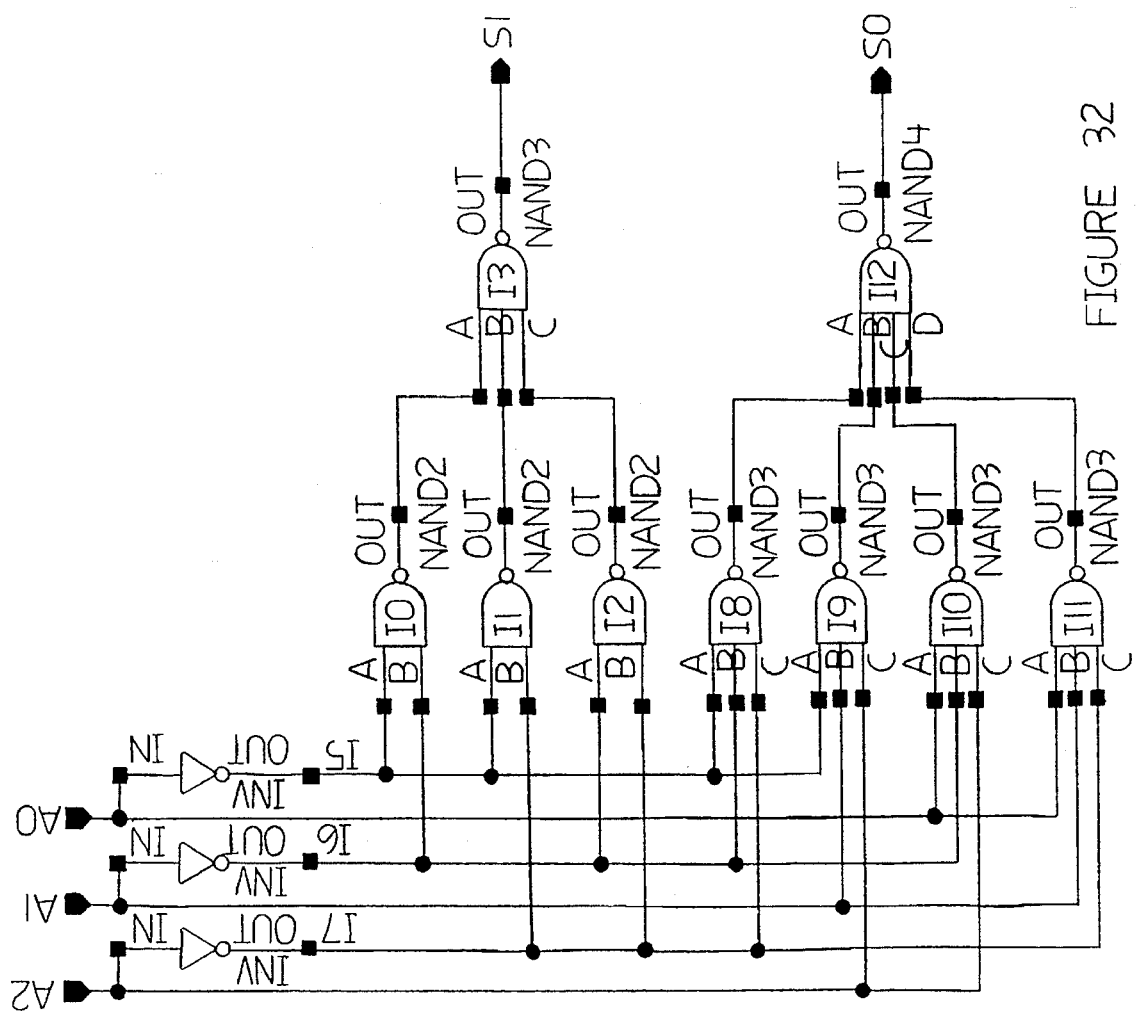
FIG. 32 is a schematic showing a sum zero block for the background code logic generator shown in FIG. 28.

FIG. 28 shows how the background code logic is implemented for an 8K×8 BIST RAM when testing for all 3-coupling faults, i.e., when V=3 and the matrix underlying the generated test is (1K,2)-exhaustive. The present bit logic 119 forms the current background code logic bit. FIG. 29 shows how the present bit logic 119 is implemented in a straight-forward way using 2-to-1 multiplexers. The next bit logic 120 forms the next background code logic bit. FIG. 30 shows how the next bit logic 120 is implemented using 2-to-1 multiplexers. The zero summing logic 121, which is required in this implementation of (n,2)-exhaustive codes, forms a binary number S3, ... ,S0 that expresses the number of 0 bits that appear in the address Addr. (If V-coupling faults can involve different bits of the same RAM word, then the zero summing logic 121 will determine the number of 0 bits that appear in the combined address (Addr,bit_num) obtained by concatenating the bits of Addr and bit_num.) The resulting signals S3, ... ,S0 are then input to the present bit logic 119 and the next bit logic 120. FIG. 31 shows how the zero summing logic 121 is implemented using four sumzero blocks 123, 124, and 126, and adders slices 127, 128 and 129. The sumzero block, whose schematic is shown in FIG. 32, uses combinational logic to determine the number of zeros present in a 3-bit section of the address Addr (or the combined address (Addr,bit_num)). The 2-bit adder slices 127 and 128 and the 3-bit adder slice 129 are all constructed using combinational logic gates.

Probabilistic tests result if the background code logic 64 implements a hashing function that reduces the address Addr (or the combined address (Addr,bit_numb)) and data background dbgr down to a single background code logic bit P. A simple parity function would not be satisfactory for this application since the corresponding code matrix would be a checkerboard with only two distinct data backgrounds. A more suitable hashing function would be some prefix of either the (n,3)- or (n,4)-exhaustive codes. However, other pseudo-random functions would also be satisfactory.

The test pattern generator 90 produces the k-bit-wide, in this example 8-bit-wide, test data words that are written into the RAM 52 during the second phase of the BIST routine. The data bus connection must be bi-directional so that each new test data word can be derived by toggling bits in a data word previously read from the RAM 52. The test pattern generator 90 also requires the present bit number bit_num from the address generator 60, and the read and write signals from the BIST controller 58.

Figure 33:
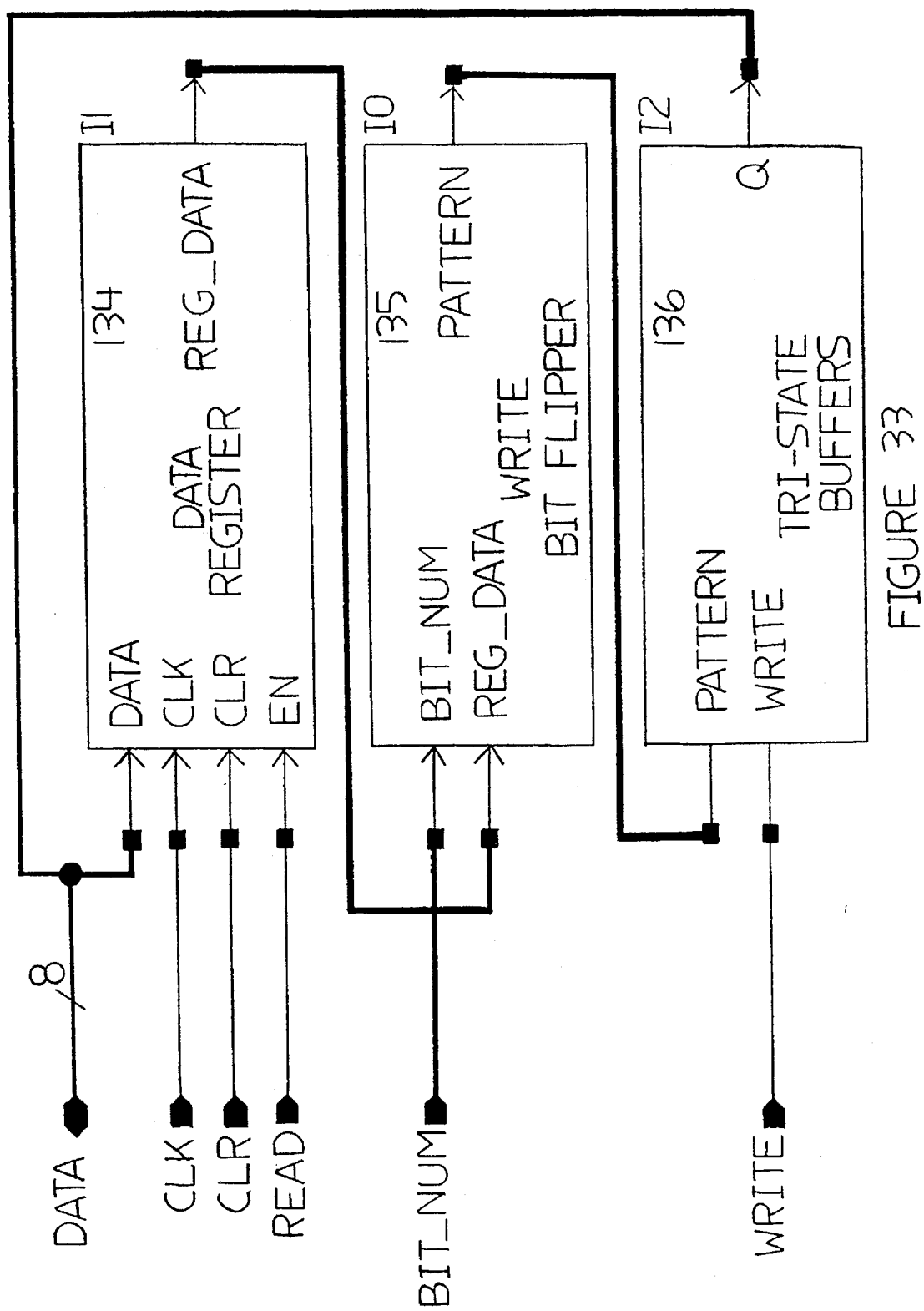
FIG. 33 is a schematic showing a test pattern generator for the BIST RAM of FIG. 18A.
Figure 34:
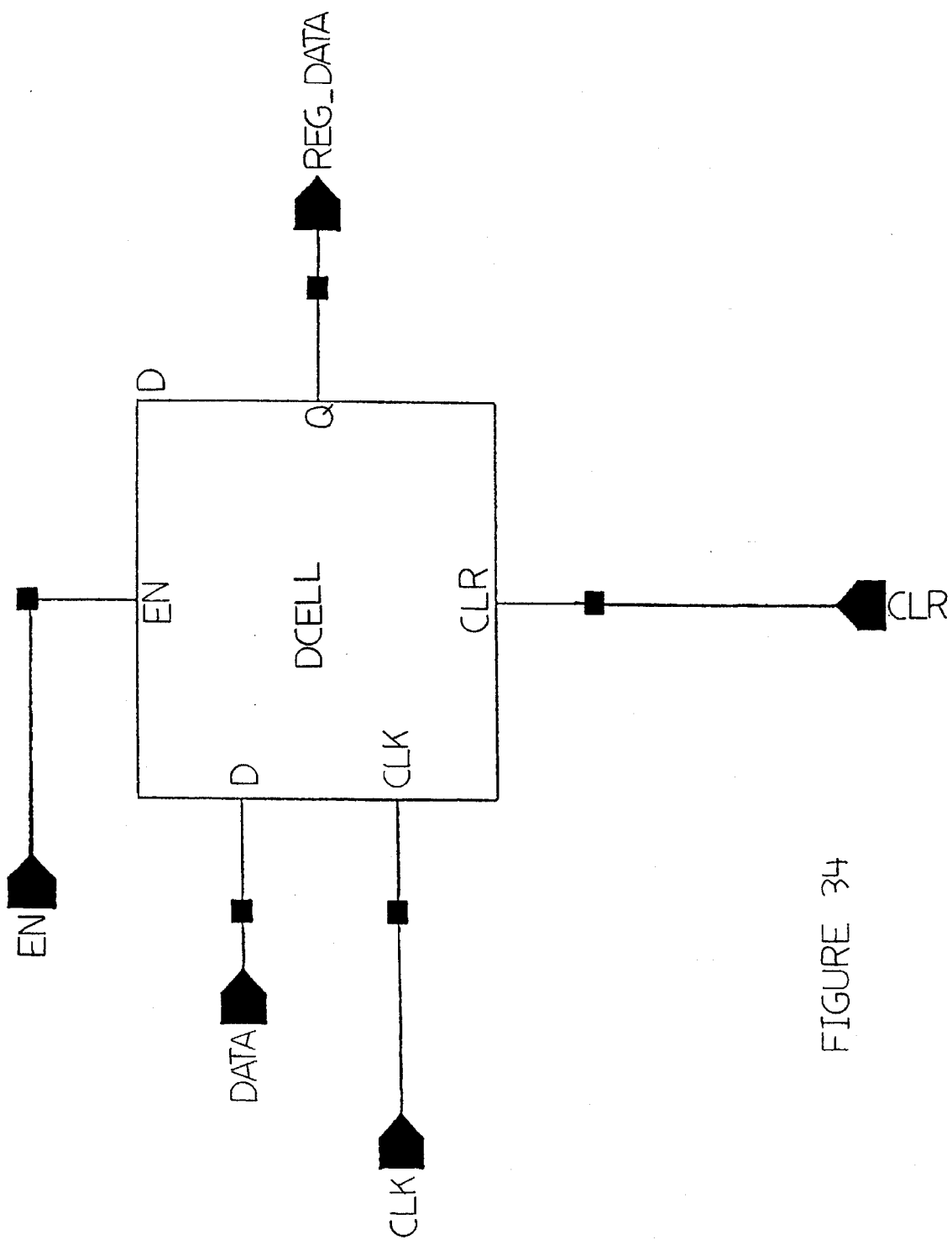
FIG. 34 is a schematic showing a data register for use in the test pattern generator of FIG. 33.
Figure 35:
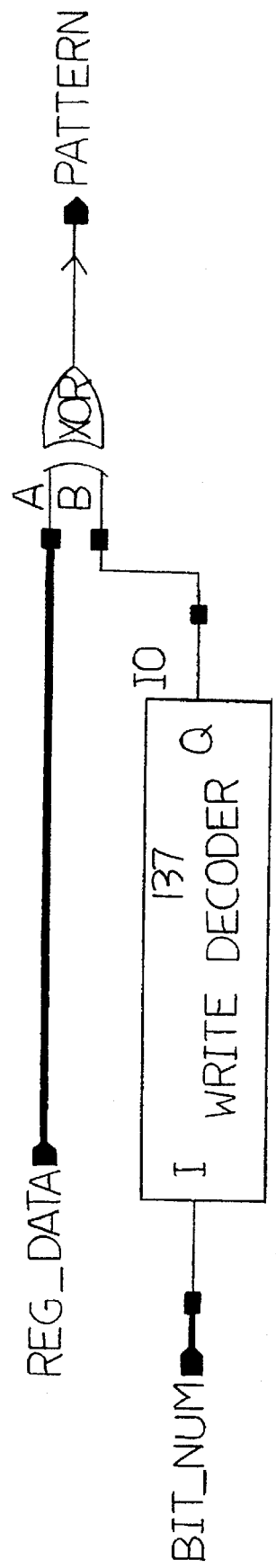
FIG. 35 is a schematic showing a write bit flipper circuit for use in the test pattern generator of FIG. 33.
Figure 36:
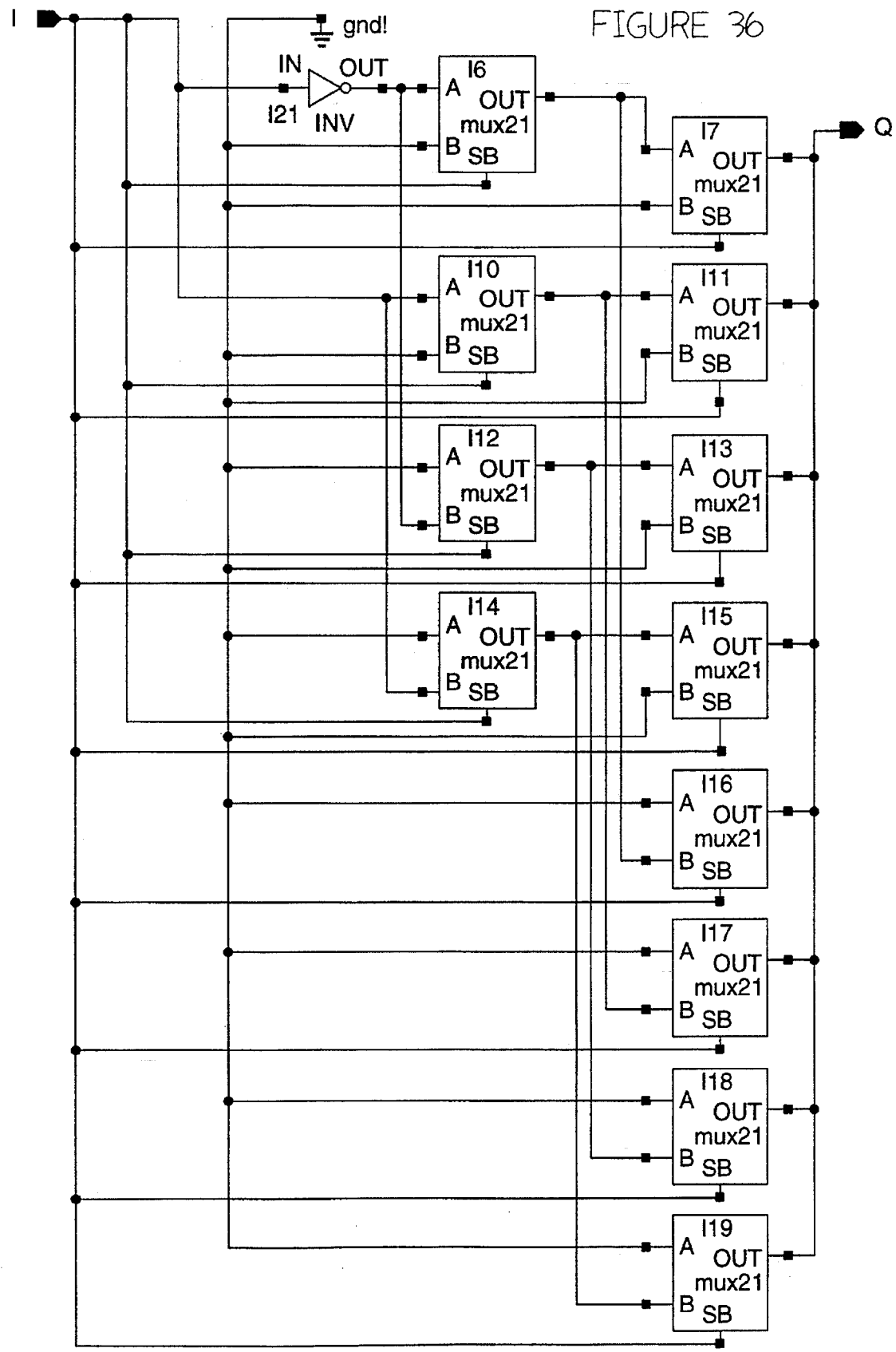
FIG. 36 is a schematic showing a 3-to-8 decoder for use in the test pattern generator of FIG. 33.
Figure 37:
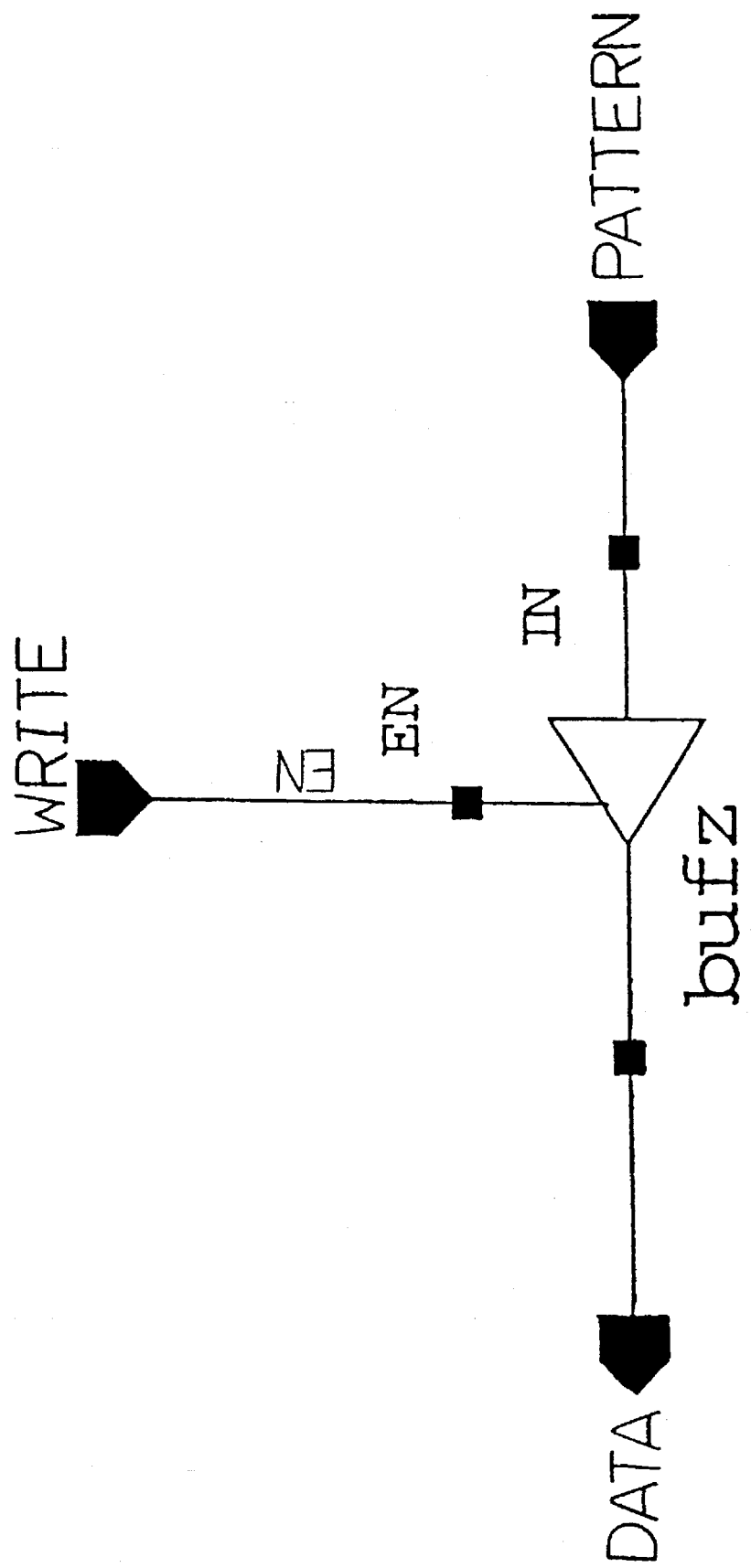
FIG. 37 is a schematic showing tri-state buffers for use in the test pattern generator of FIG. 33.

FIG. 33 shows the implementation of the test pattern generator 90 in terms of a data register 134, a write bit flipper circuit 135, and tri-state drivers 136. The data register 134 is implemented as a stack of k=8 D flip-flops, as shown in FIG. 34. Similarly, the tri-state drivers 136 are implemented as a stack of k=8 single bit tri-state drivers, as shown in FIG. 37. FIG. 35 shows how the write bit flipper circuit 135 is implemented using a 3-to-8 decoder circuit 137 and a stack of k=8 XOR gates. The implementation of the decoder circuit 137 is given in terms of 2-to-1 muliplexers and an inverter in FIG. 36. The write bit flipper circuit 135 inverts one bit in the data word reg_data according to the value of the bit number bit_num.

Figure 38:
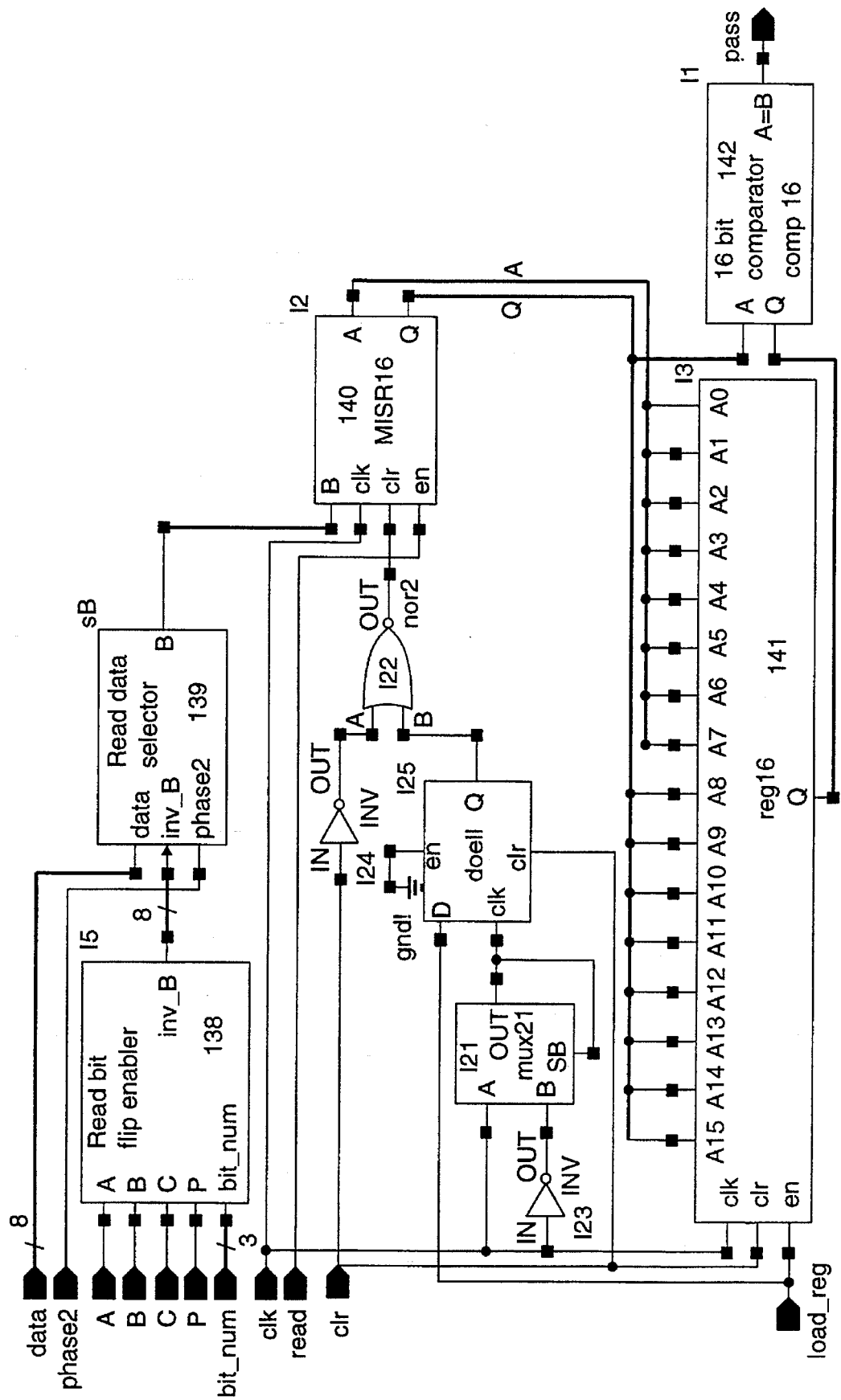
FIG. 38 is a schematic showing a response analyzer for the BIST RAM of FIG. 18A.

As illustrated in FIG. 38, the response analyzer 92 contains a 16-bit multiple input signature register (MISR) 140, a 16-bit register 141, and a 16-bit comparator 142. The MISR 140 is used to compute signatures during each of the two test phases. Data words must be bit-wise complemented before being input to the MISR for all read operations that expect data that is complemented with respect to the first current cell values. A control input load_reg is used by the BIST controller 58 at the end of phase 1 to load the register 141 with the first signature, and to clear the MISR 140 to prepare it to start calculating the second signature during phase 2. At the end of phase 2, the first signature stored in register 141 is compared by the 16-bit comparator 142 with the second signature stored in the MISR 140. If the two signatures are equal, then the pass is asserted high to indicate that the self-test routine detected no failures; otherwise the pass signal is asserted low to indicate that an error was detected.

When the response analyser 92 is accumulating the signature in MISR 140 during phase 1, the data bits read from the RAM 52 must be selectively inverted using the elements of the (1K,2)-exhaustive code so that, in a fault-free memory, the modified data words read into MISR 140 during phase 1 are the same as the unmodified data words passed directly from the RAM 52 to the MISR 140 during phase 2. This operation ensures that the signatures calculated during phases 1 and 2 will be the same in a fault-free memory. The selective inversion operation is accomplished using the read bit flip enabler 138. The outputs inv_B7, . . . ,inv_B0 from the bit flip enabler 138 are used to control the read data selector 139. The structure of one bit slice of the the read data selector 139 is given in FIG. 41. (The 8 k×8 BIST RAM example requires eight instances of the slice in FIG. 41.) When the phase2 signal is asserted by the BIST controller 58 during phase 2 of the test, the 2-to-1 multiplexer 188 passes the RAM data word unchanged to the bus lines B7, . . . ,B0 that lead to the MISR 140. When the phase2 signal is de-asserted by the BIST controller 58 during phase 1 of the test, the 2-to-1 multiplexer 188 selects the output of the second 2-to-1 multiplexer 187. Multiplexer 187 and inverter 186 act together as an XOR gate. The signals inv B7, . . . , inv B0 from the read bit flip enabler select the bits in data7, . . . ,data0 that are to be inverted before being passed on to the MISR 140.

Figure 39A:
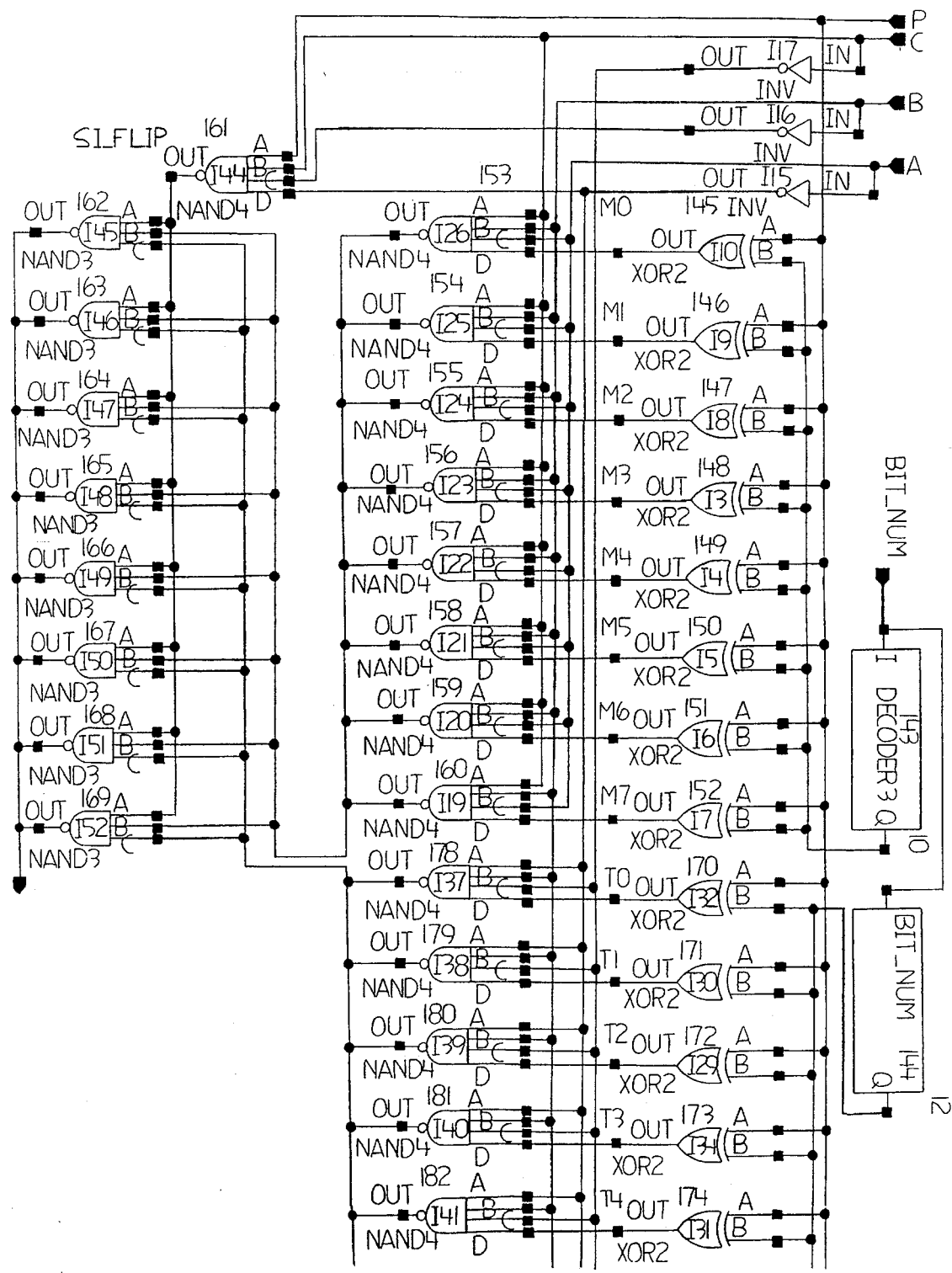
FIG. 39 is a schematic showing a read bit flip enabler for use in the response analyzer of FIG. 38.
Figure 39B:
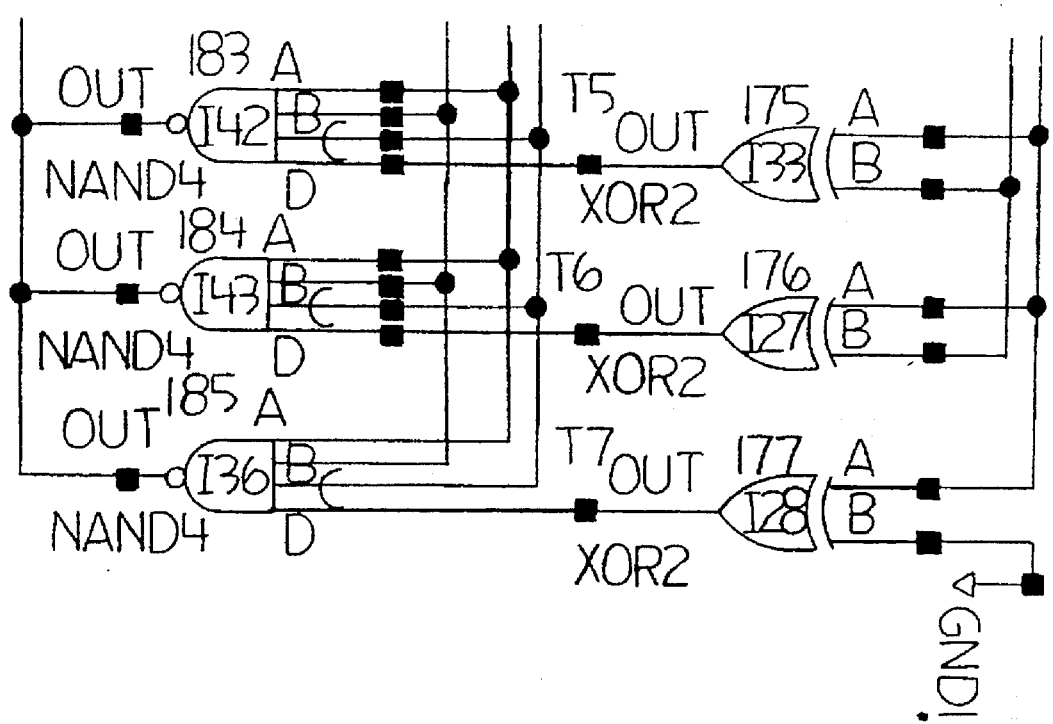
Figure 40:
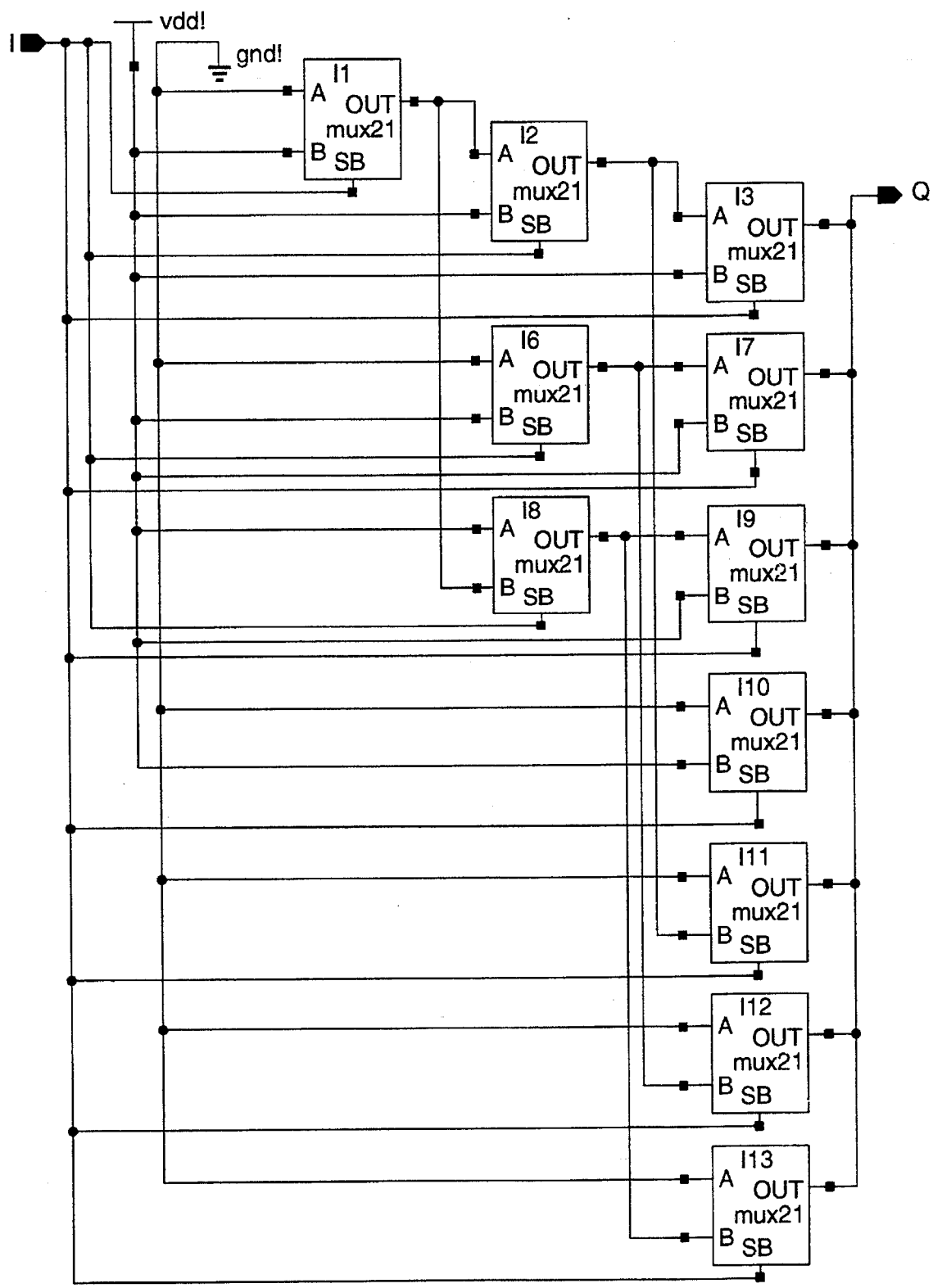
FIG. 40 is a schematic showing a detail of the block invlog2 of FIG. 39.
Figure 41:
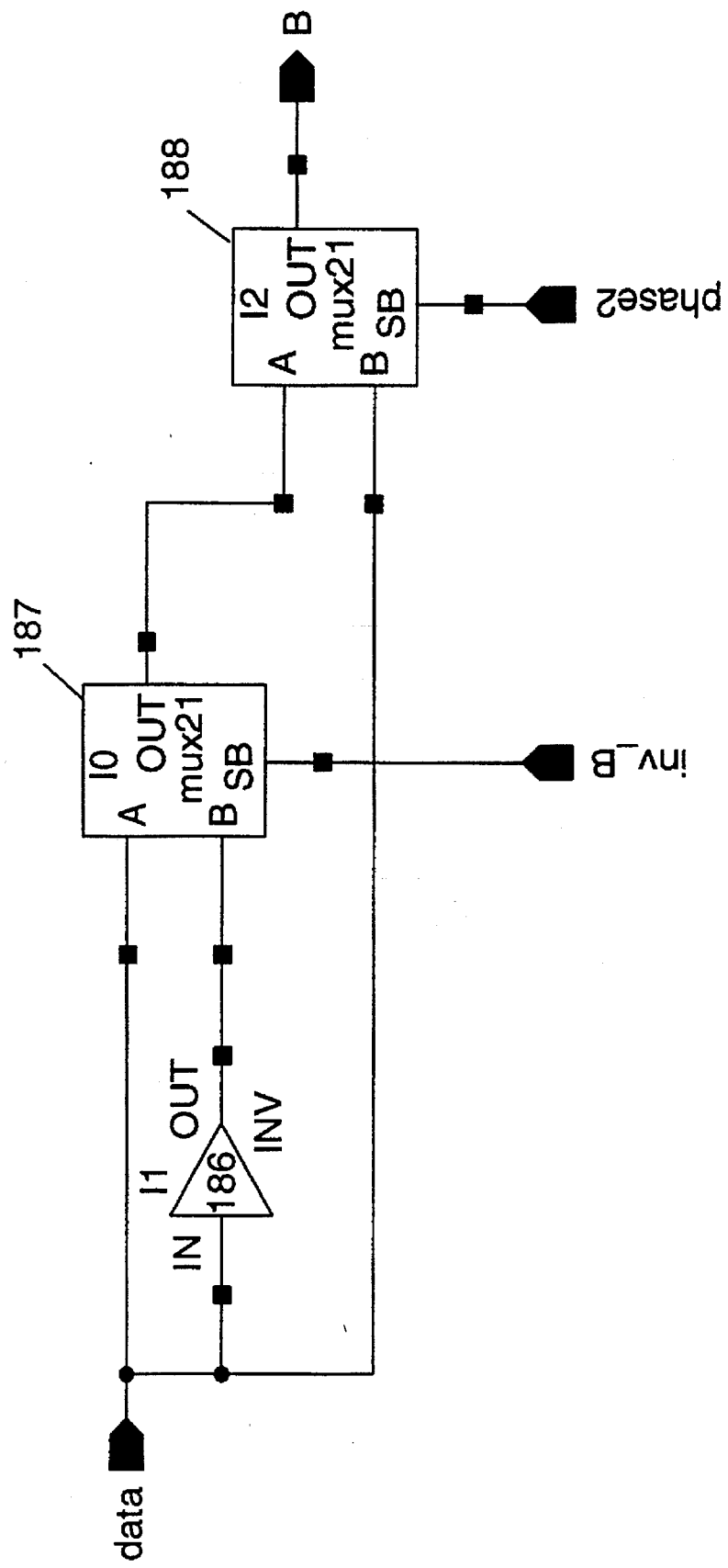
FIG. 41 is a schematic showing a read data selector for use in the response analyzer of FIG. 38.

The implementation of the read bit flipper is illustrated in FIGS. 39A and 39B. The position of the current bit within the current RAM word is decoded by the 3-to-8 decoder 143. XOR gates 145, 146, 147, 148, 149, 150, 151 and 152 are connected to the outputs of decoder 143 and the current background logic code bit P so as to form a mask pattern M7, . . . ,M0 used in state S3 of the BIST controller 58. (State S3 controls the second reads in the march sequence.) If P=0, then exactly one of M7, . . . ,M0 is 1; if P=1, then exactly one of M7, . . . ,M0 is 0. XOR gates 170, 171, 172, 173, 174, 175, 176 and 177 are connected to the outputs Q7, . . . ,Q0 of the invlog2 circuit 144 and the current background code logic bit P to form the mask pattern T7, . . . ,T0 that is used in state S5 of the BIST controller 58. (State S5 controls the reads during the background change operation.) The invlog2 circuit, illustrated in FIG. 40, produces an 8-bit wide bit pattern consisting of bit_num 1s followed by (8 - bit_num) 0s. This pattern allows a left-justified block of bits in the current RAM data word to selected to be inverted by the XOR gates 170, 171, 172, 173, 174, 175, 176 and 177. In the read bit flip enabler 138, NAND gates 153, 154, 155, 156, 157, 158, 159 and 160 are used to unmask bits M7, . . . ,M0 whenever the BIST controller 58 enters state S3. Similarly, NAND gates 178, 179, 180, 181, 182, 183, 184 and 185 are used to unmask bits T7, . . . ,T0 whenever the BIST controller 58 is in state S5. NAND gate 161 asserts an active low signal S1_flip whenever the BIST controller is in state S1. (State S1 controls the first reads in the march sequence.) Finally, NAND gates 162, 163, 164, 165, 166, 167, 168 and 169 are used to OR together (a) M7, . . . ,M0 and (b) T7, . . . , T0 and (c) eight copies of S1_flip to create the bit flip signals inv_B7, . . . ,inv_B0.

Figure 42A:
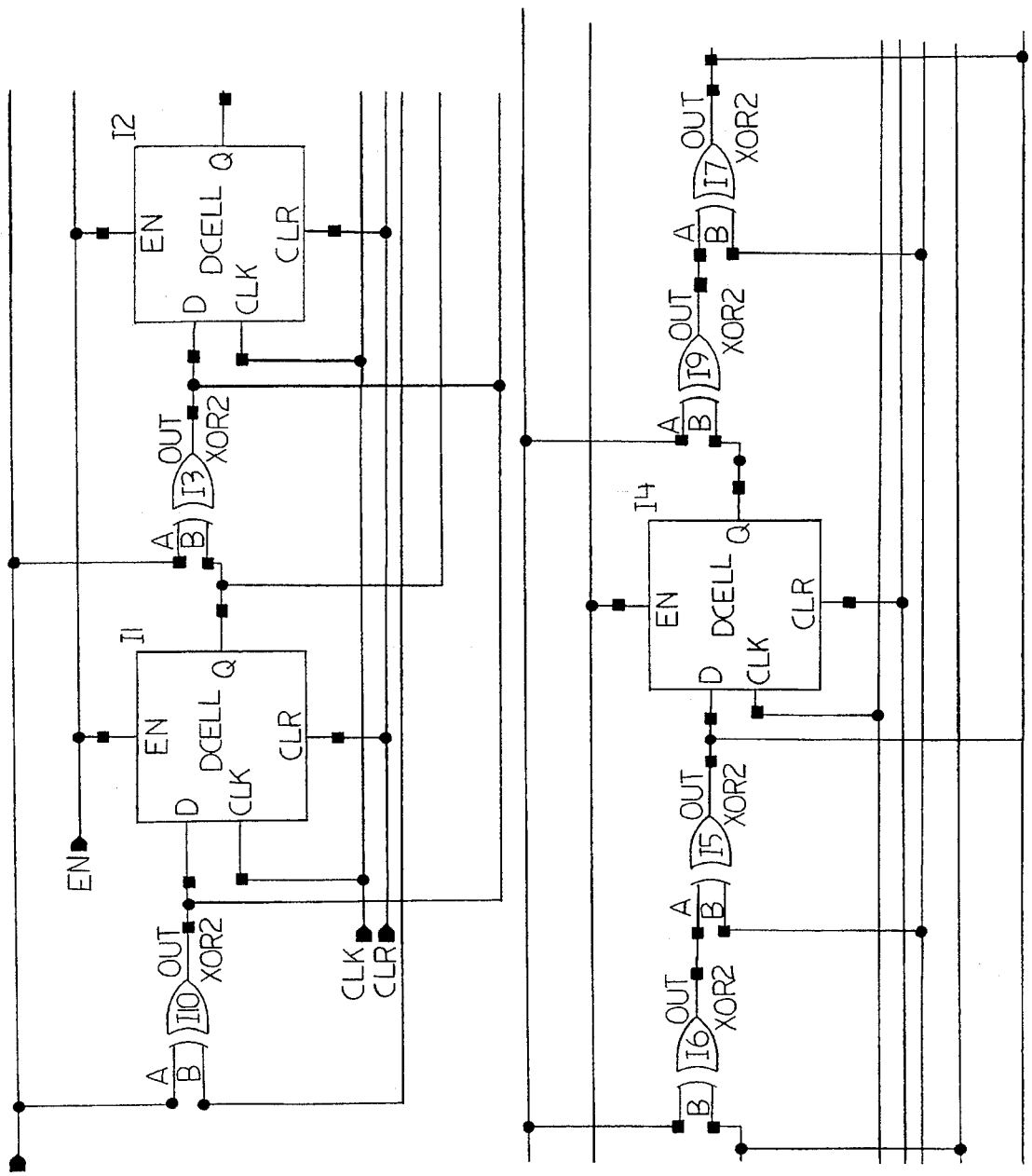
FIG. 42 is a schematic showing a 16-bit wide multiple input signature analyzer for use in the response analyzer of FIG. 38.
Figure 42B:
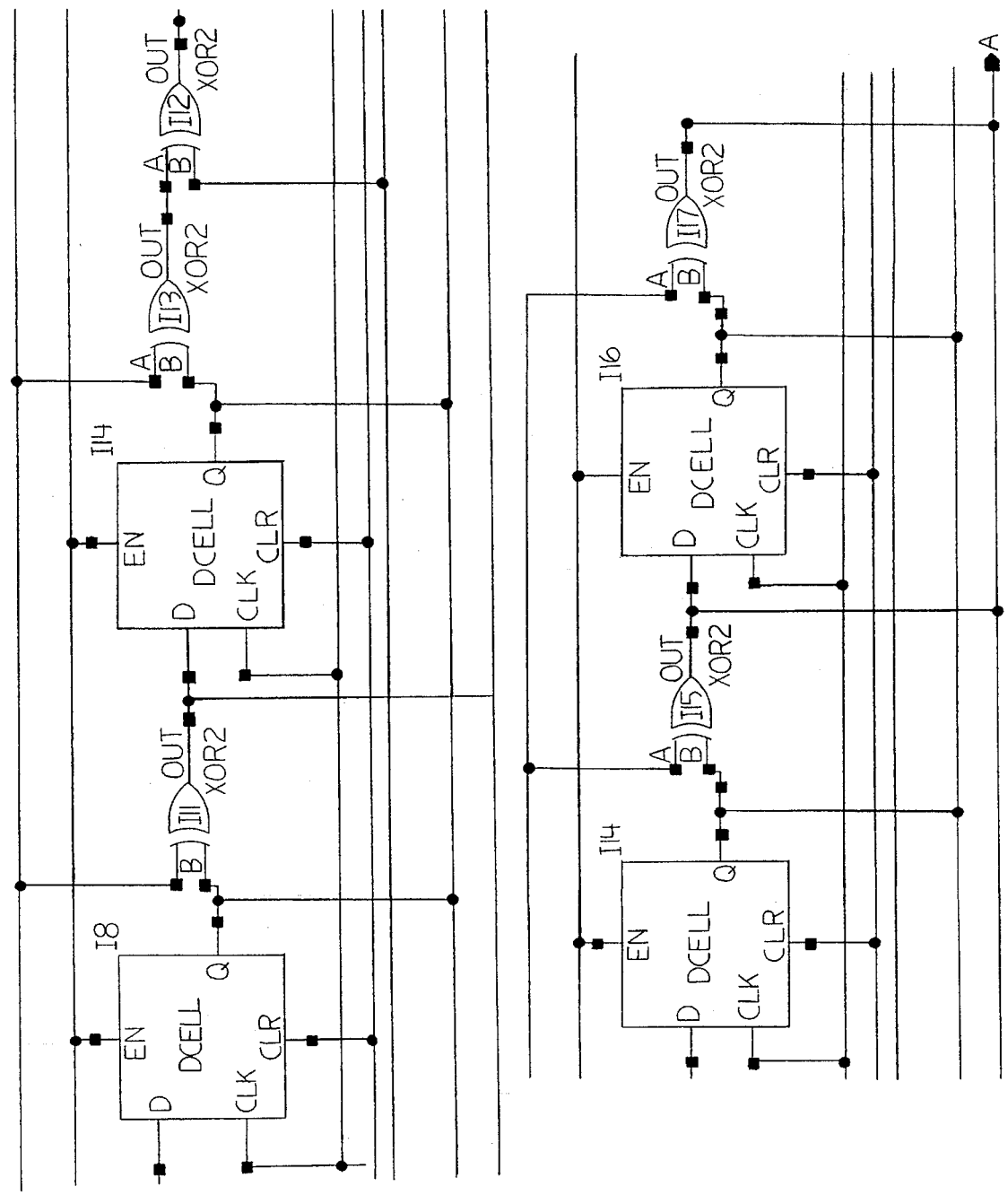
Figure 42C:
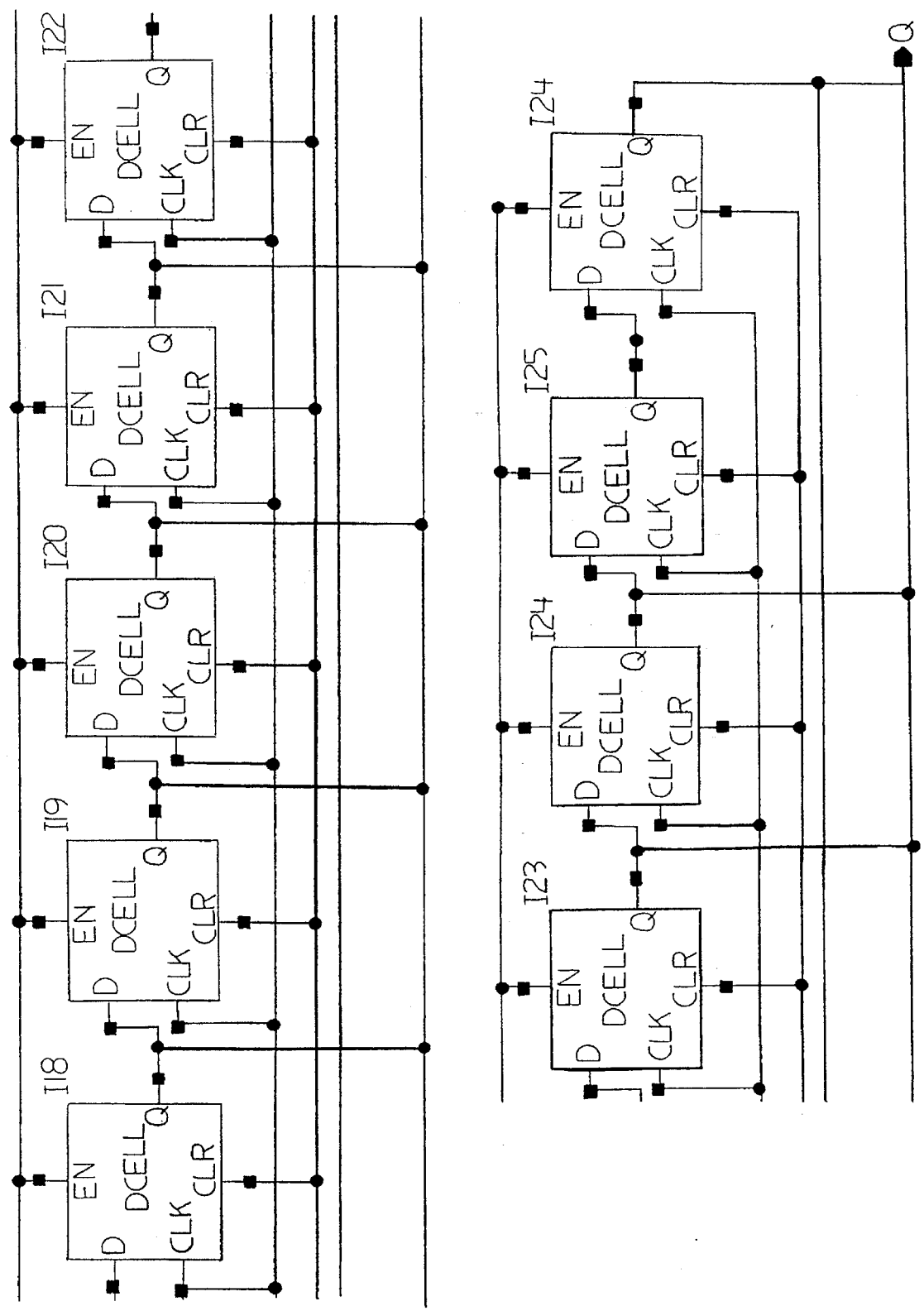
Figure 43C:
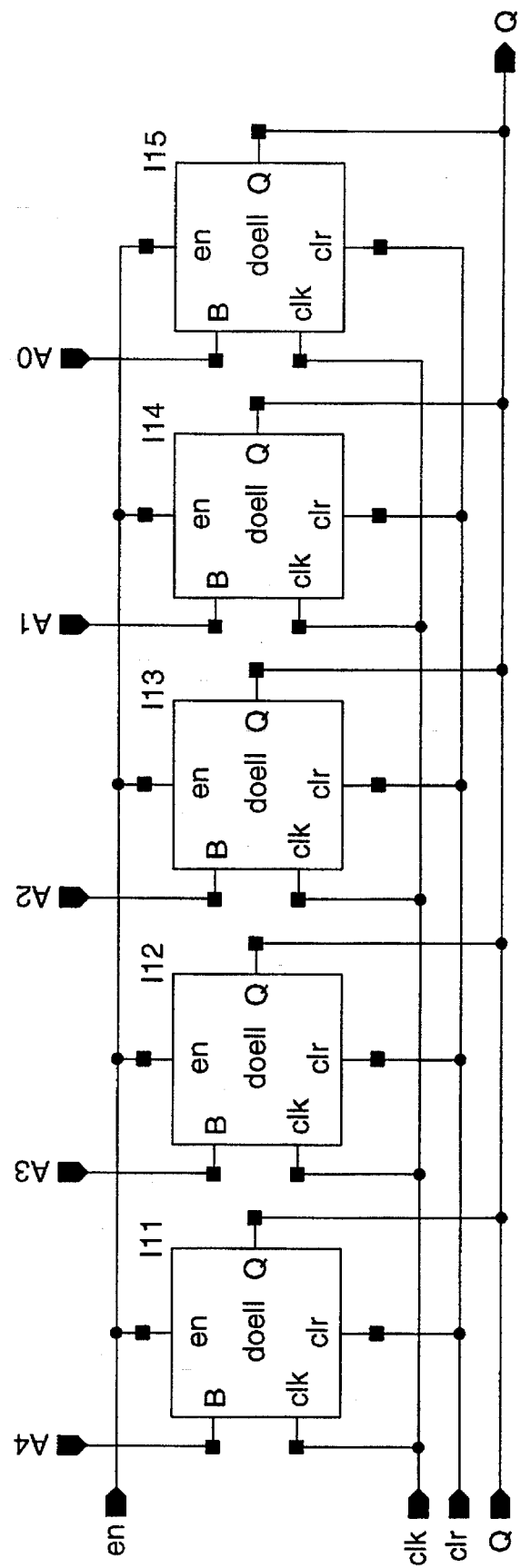
FIG. 43 is a schematic showing a 16-bit register for use in the response analyzer of FIG. 38.
Figure 44:
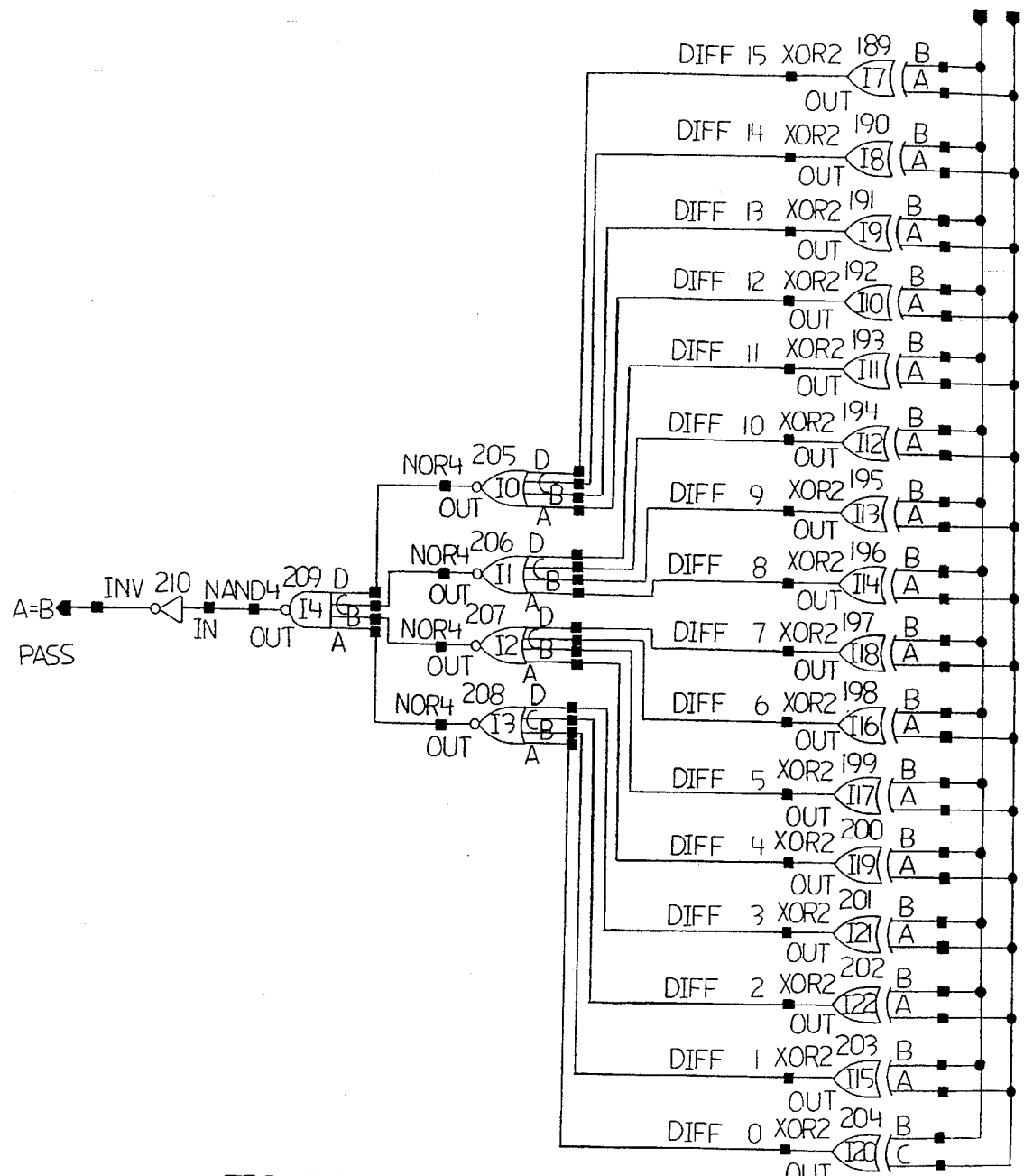
FIG. 44 is a schematic showing a 16-bit comparator for use in the response analyzer of FIG. 38.

FIGS. 42A, 42B, and 42C show respectively an implementation of the 16-bit multiple input signature register MISR 140 using D flip-flops and XOR gates. FIGS. 43A, 43B and 43C show the implementation of the 16-bit register 141 using 16 D flip-flops. FIG. 44 shows an implementation of the 16-bit comparator 142 that uses XOR gates 189, . . . ,204 to detect any bit differences between the MISR 140 outputs A (that is, the second signature) and the register 141 outputs Q (that is, the first signature). NOR gates 205, 206, 207 and 208, NAND gate 209, and inverter 210 together form a 16-input OR gate that receives the bit difference signals diff15, . . . , diff0 and generates the pass output.

Figure 45:
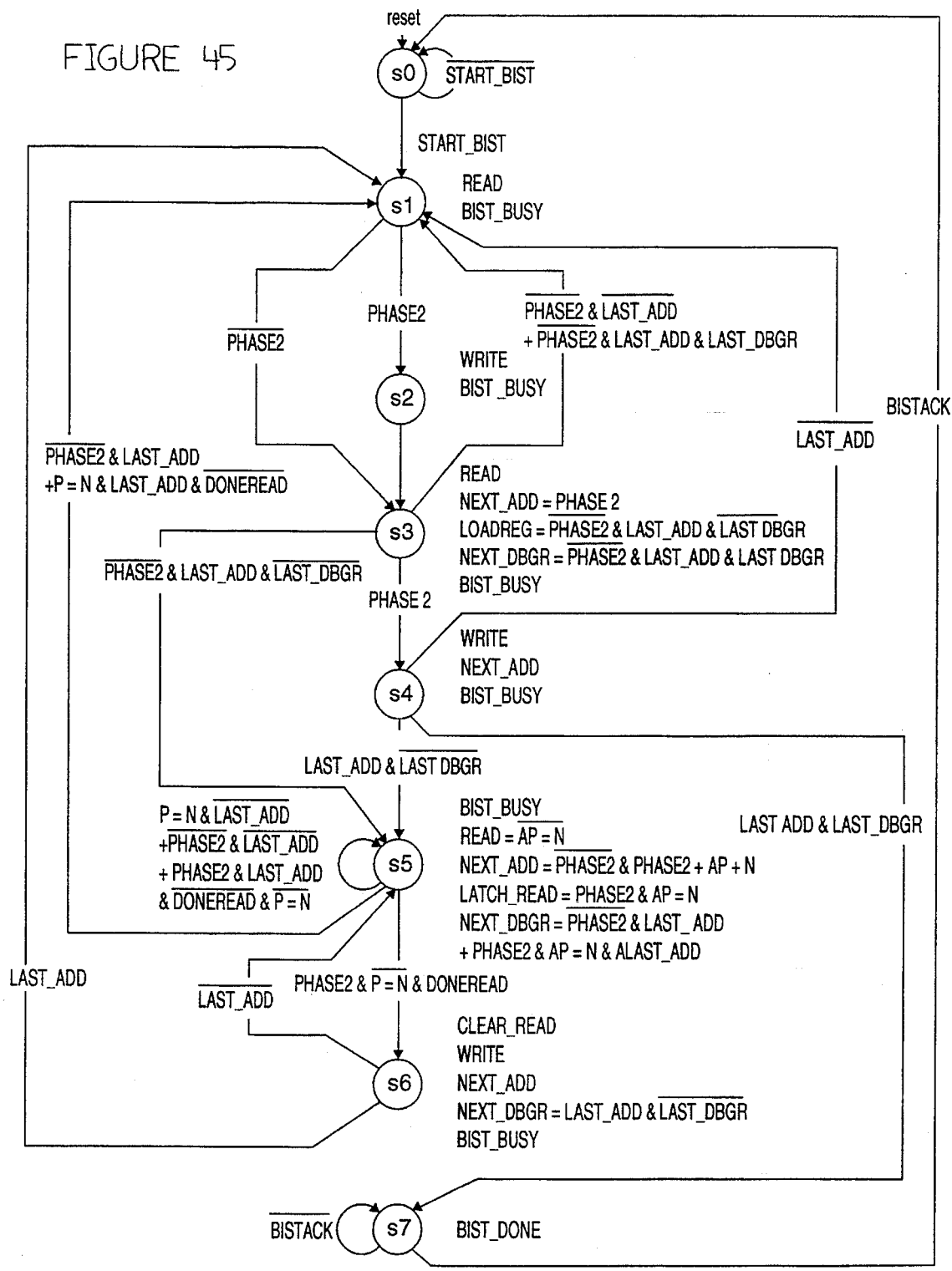
FIG. 45 shows a detailed state diagram for the BIST controller shown in FIG. 18A.

FIG. 19 shows a simplified state diagram that specifies the behavior of the BIST controller 58 (not all signals have been shown). (The full state diagram is shown in FIG. 45 in standard state diagram notation.) In normal operation, the BIST controller 58 remains in state S0 while system outputs BIST_BUSY and BIST_DONE are de-asserted. In state S0 the BIST RAM behaves like a regular RAM accessible via the external address lines A, the enable line EN, the read/write line R/W, and the data bus DATA. When system input START_BIST is asserted by the environment, the BIST controller 58 enters state S1 and begins executing the self-test routine, which is sequenced by states S1, . . . ,S6. While in these states, the BIST controller 58 asserts the system output BIST_BUSY and disables externally initiated memory accesses.

The self-test routine computes a signature in each of two phases. Flip-flop phase2 is cleared during phase 1 and set during phase 2. When phase2 is cleared, the BIST controller 58 is constrained to the three states S1, S3 and S5, which are states that generate only read operations. States S1 and S3 generate the read operations extracted from the marches, and state S5 generates the read operations extracted from the background changes. At the end of the first phase, load_reg and clr_sig are asserted in state S3 to store the signature and to clear the MISR in the response analyzer. Also, flag phase2 is set to enable entry into states S2 and S4, which generate write operations.

In phase 2, the BIST controller 58 is constrained to states S1, . . . ,S6. States S1, . . . ,S4 generate the march sequences, while states S4 and S5 generate the background changes. As read and write operations are applied to the RAM 52, a second signature is computed by the MISR in the response analyzer 92. Once phase 2 of the self-test routine has completed, the BIST controller 58 enters state S7 and asserts the BIST_DONE system output. Meanwhile, the response analyzer 92 drives the PASS signal to reflect whether or not the signatures computed in the two phases are equal. The BIST controller 58 remains in this state until the environment acknowledges by asserting the BISTACK system input, whereupon the BIST controller 58 returns to state S0 to resume normal memory operation.

Figure 46:
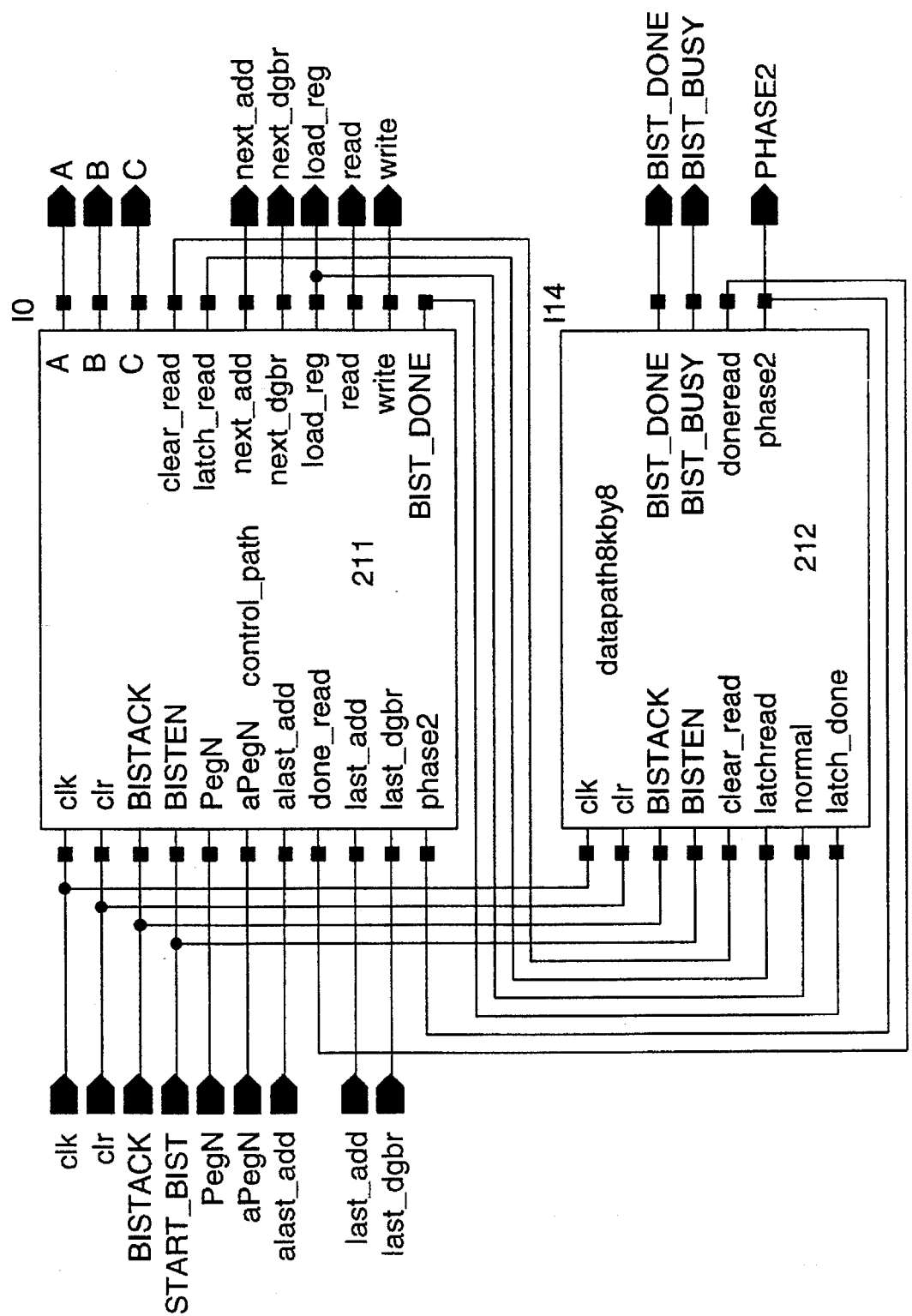
FIG. 46 is a detail showing the inputs and outputs of the BIST controller shown in FIG. 18A.
Figure 47A:
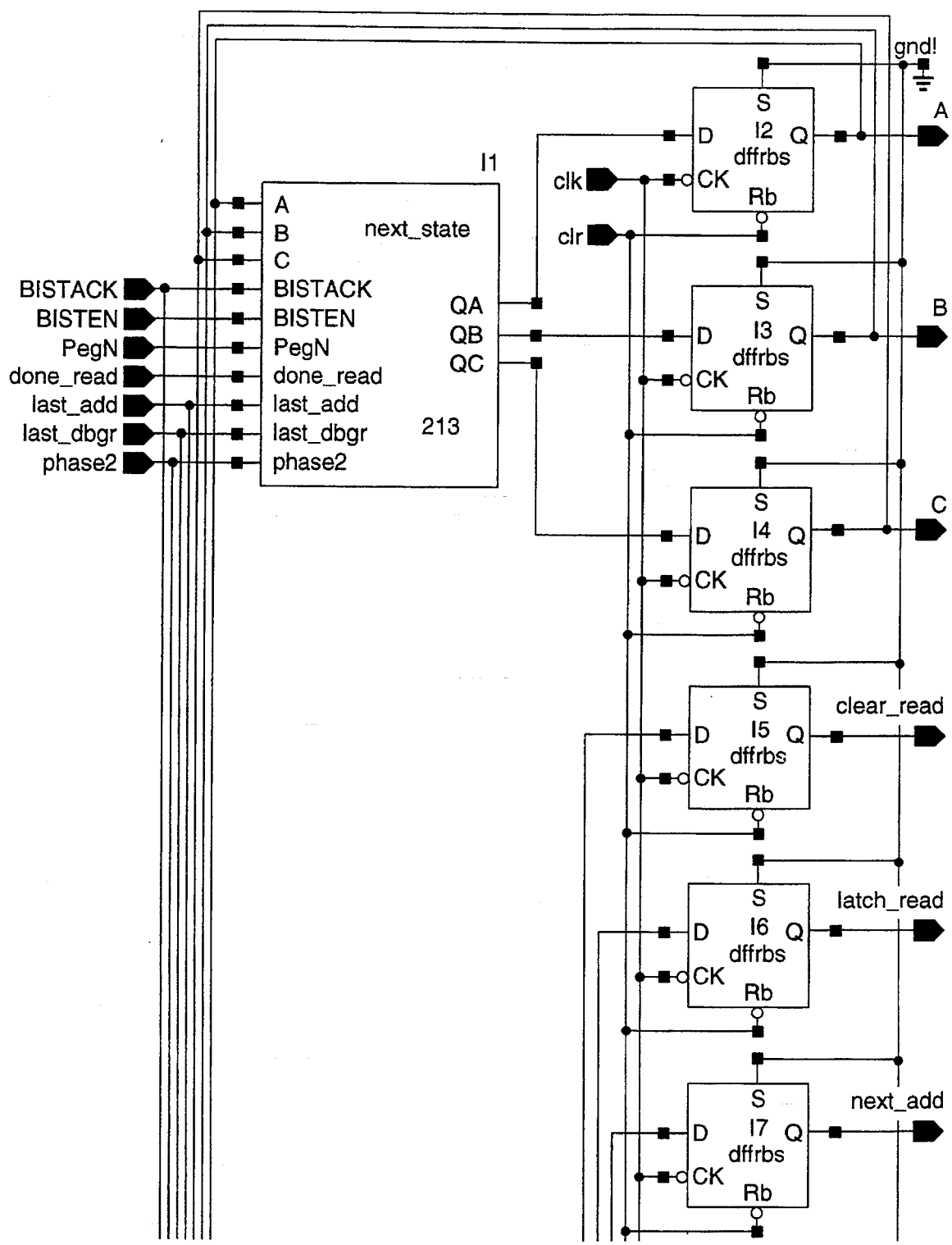
FIG. 47 is a schematic showing the control path of the BIST controller shown in FIG. 18A.
Figure 47B:
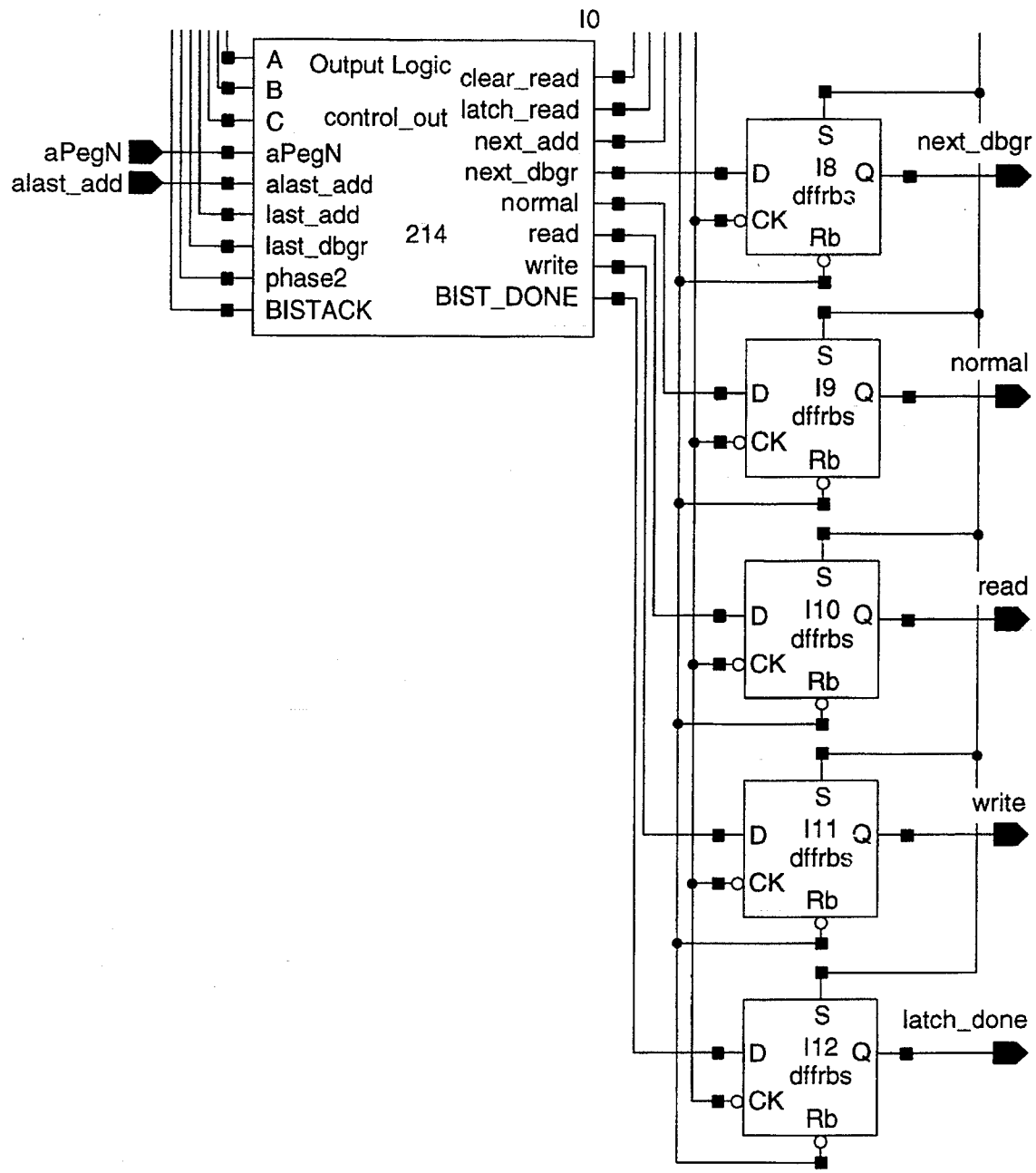
Figure 48A:
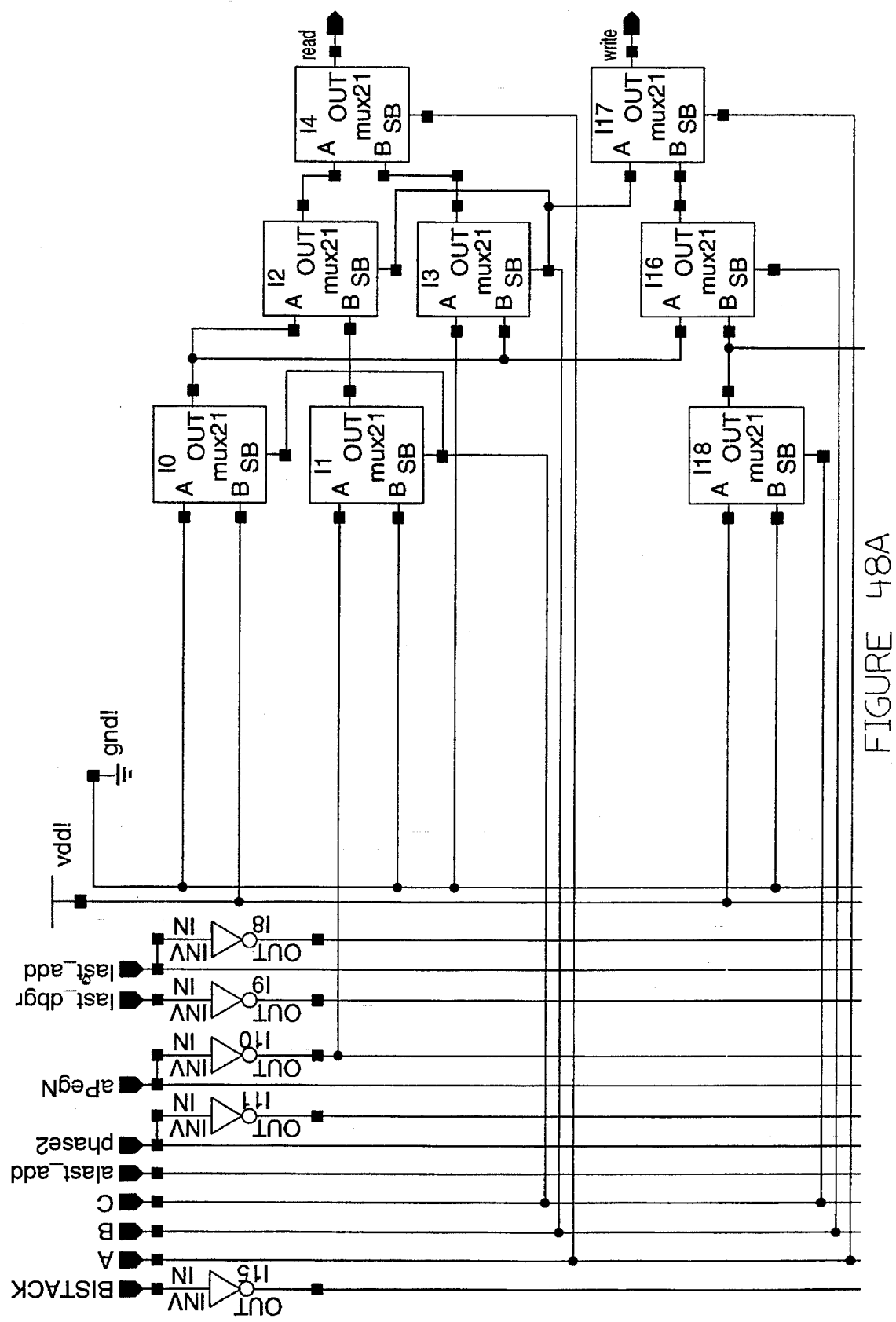
FIG. 48 is a schematic showing output logic for the control path of the BIST controller shown in FIG. 18A.
Figure 48B:
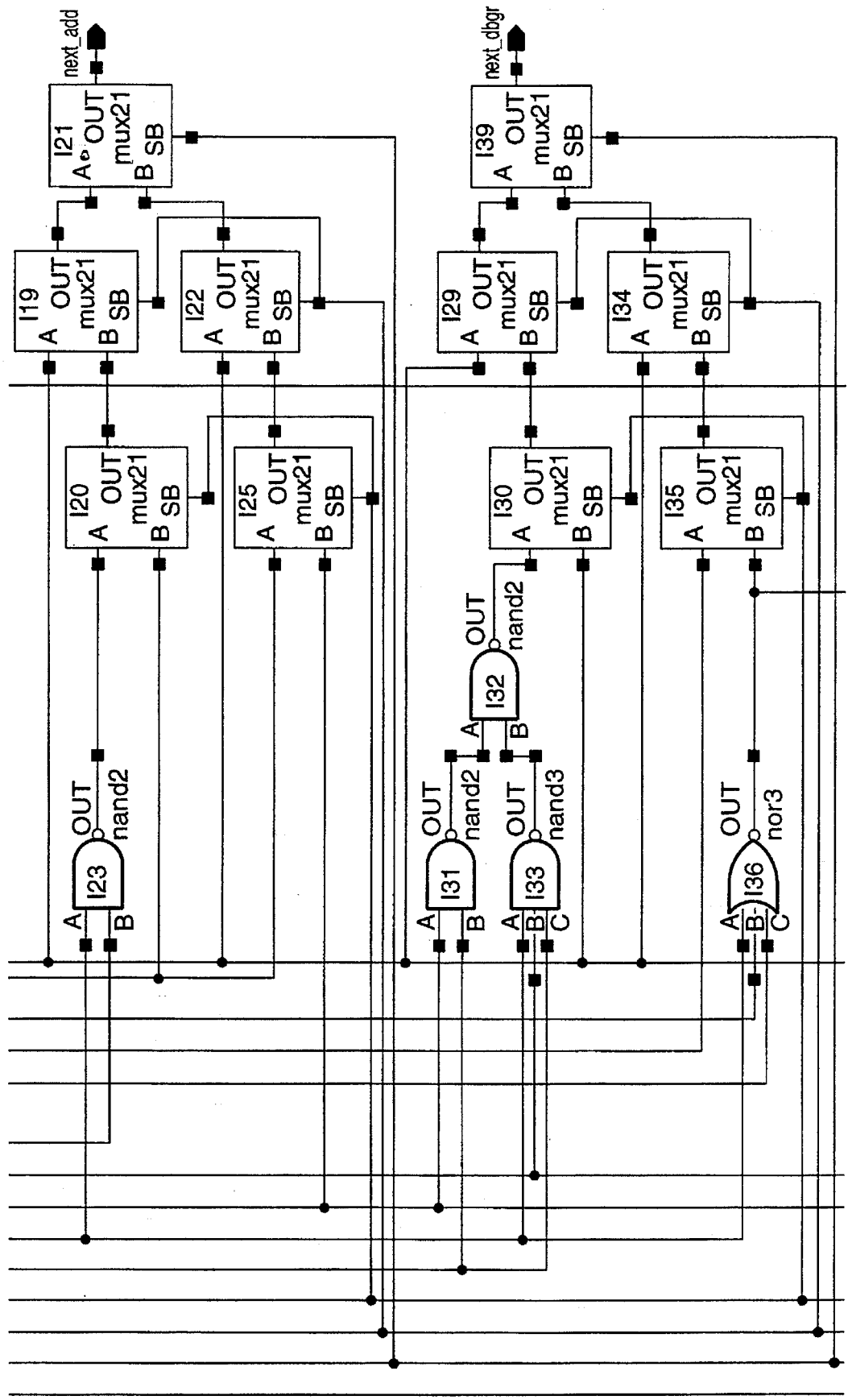
Figure 48C:
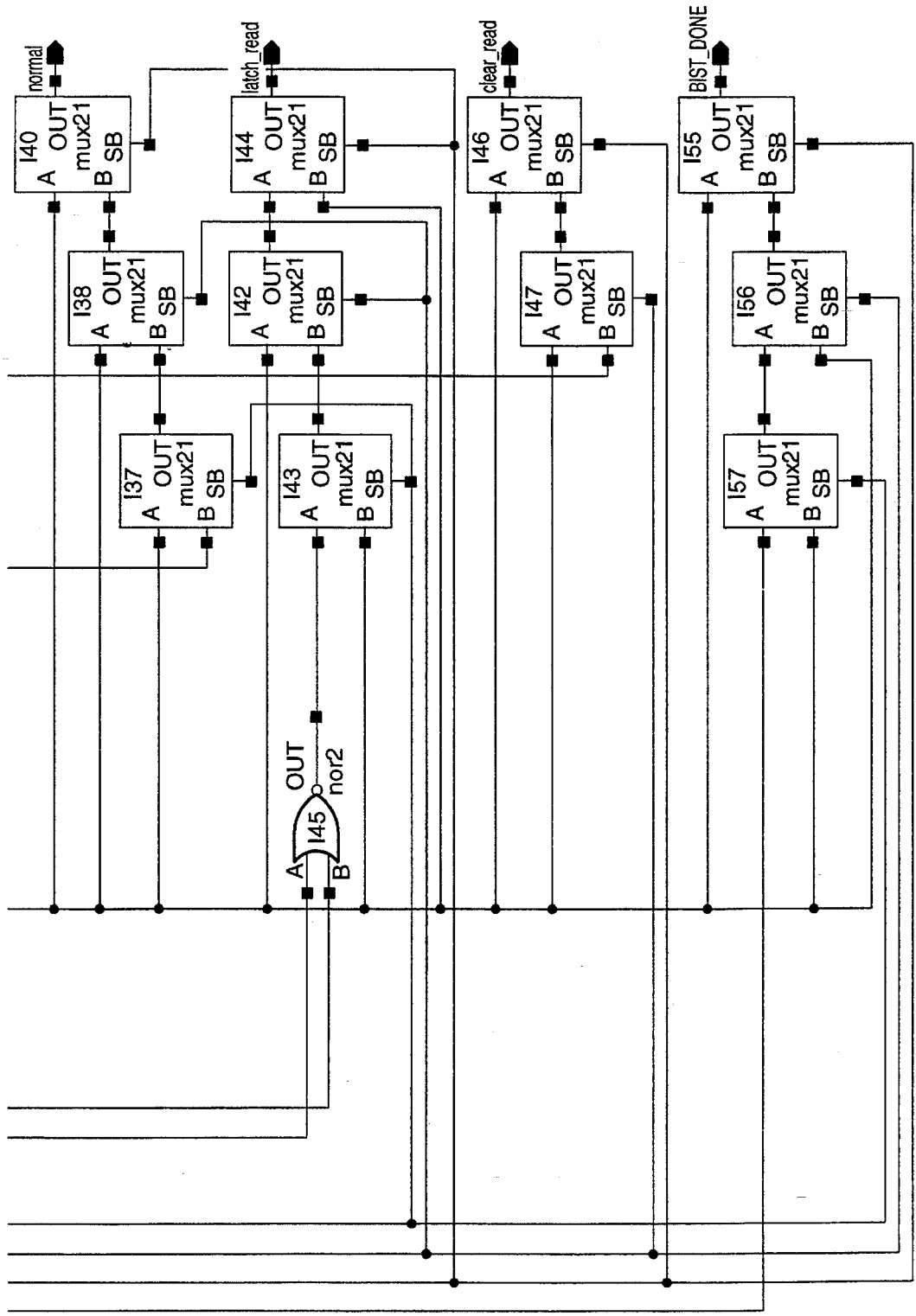
Figure 49A:
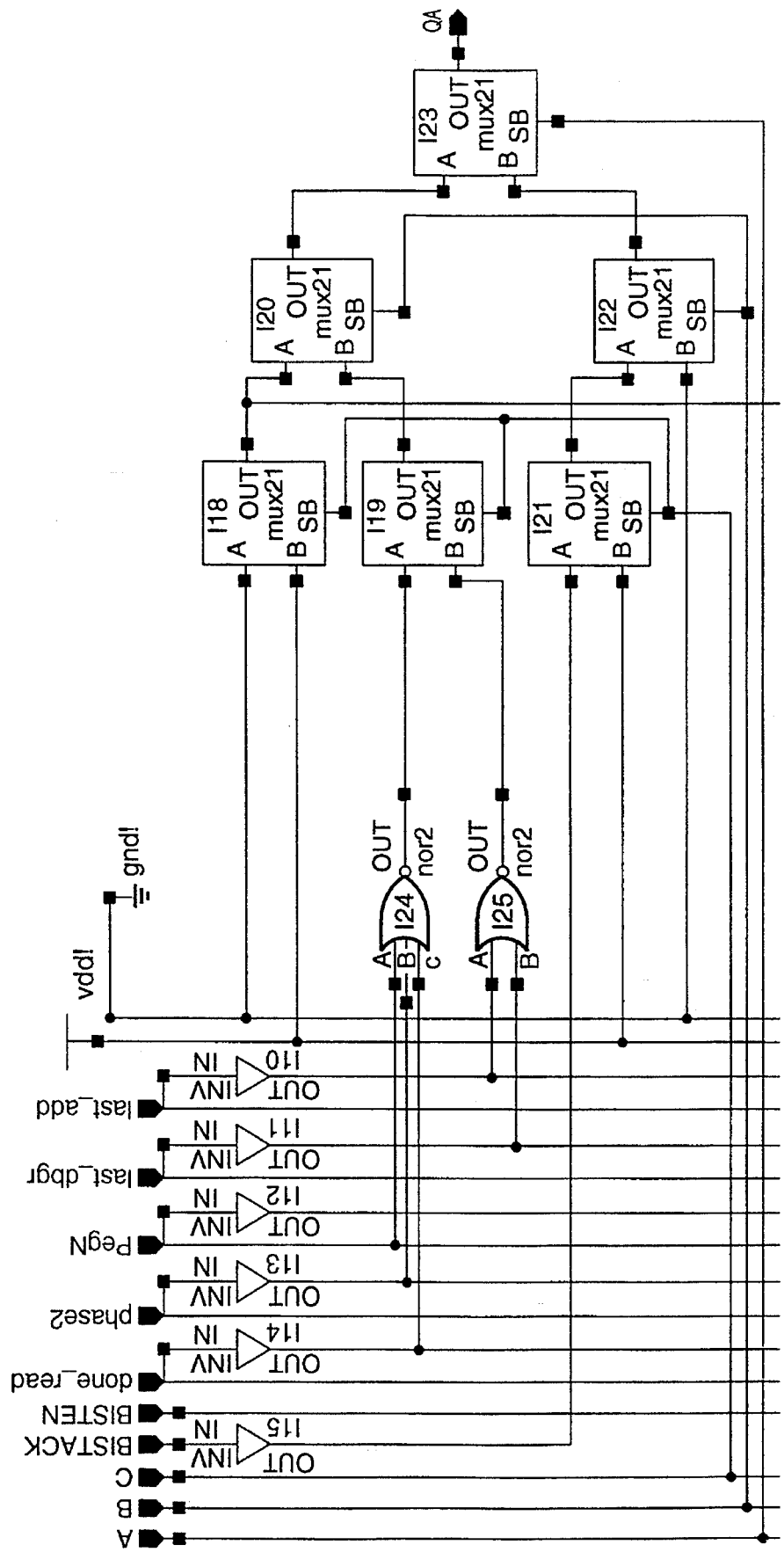
FIG. 49 is a schematic showing next state logic for the control path of the BIST controller shown in FIG. 18A.
Figure 49B:
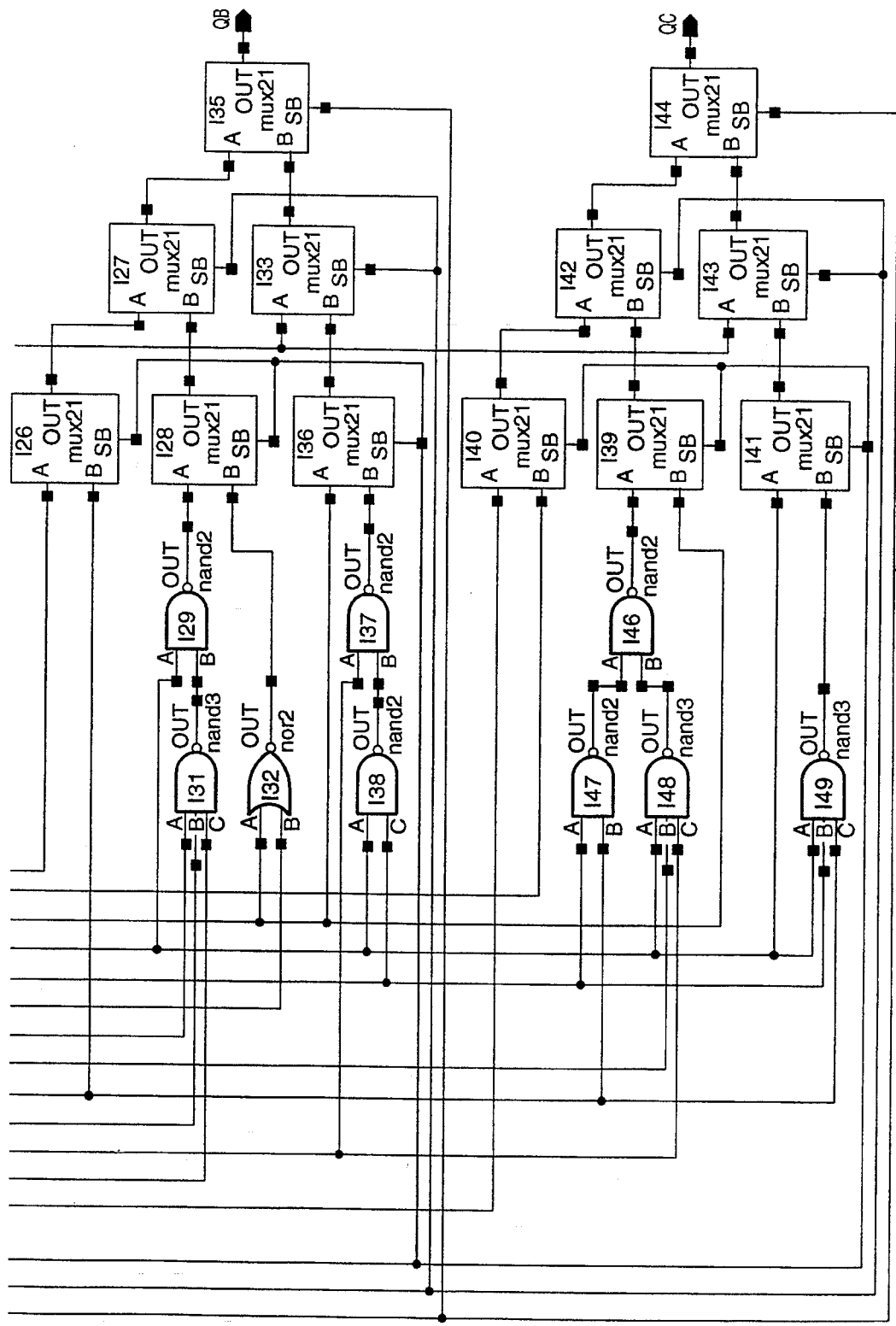
Figure 50:
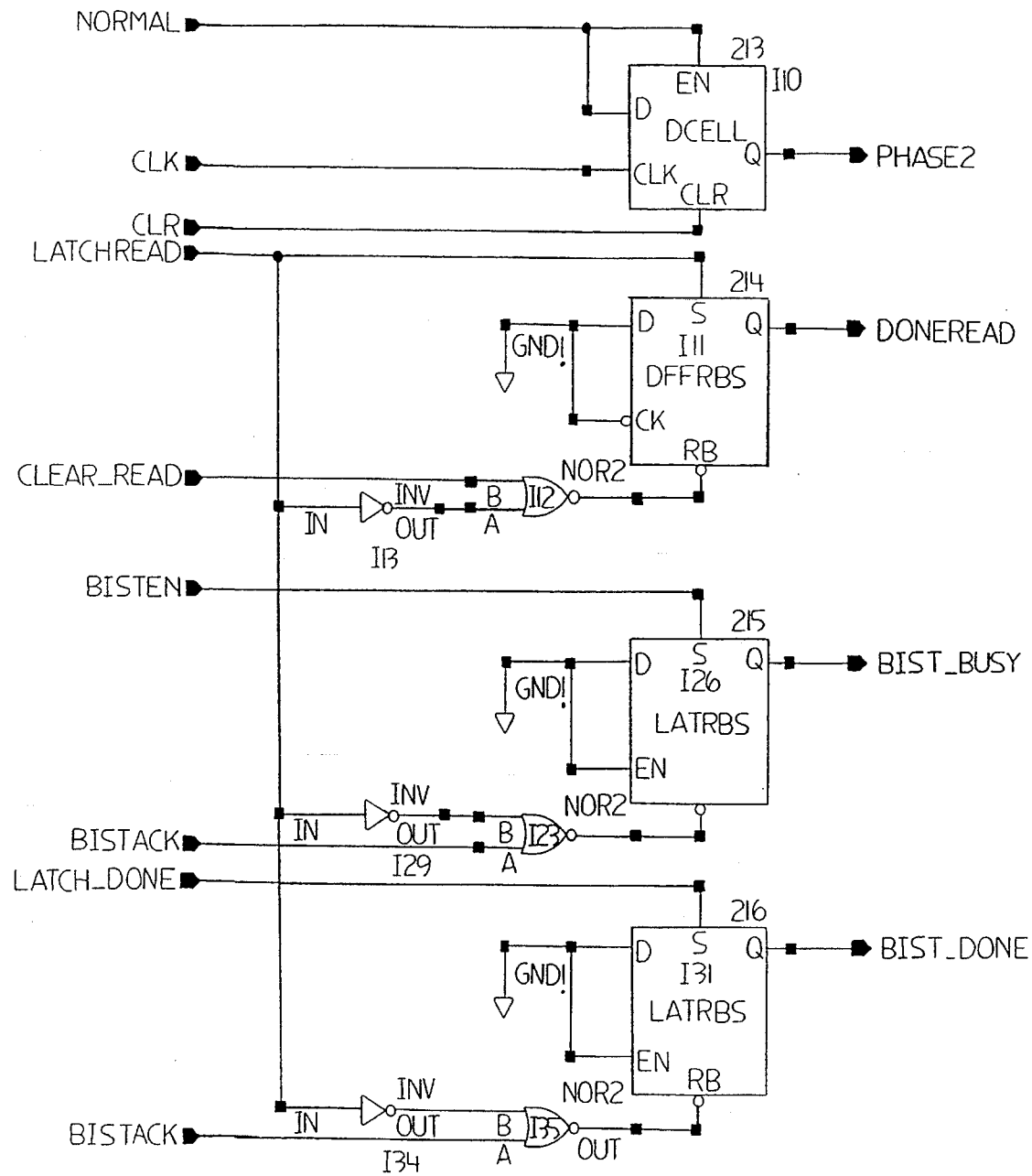
FIG. 50 is a schematic showing the datapath of the BIST controller of FIG. 18A.

FIG. 46 shows the internal structure of the BIST controller 58. The control path 211 produces the state signals A, B and C that are sent to the response analyzer 92. The control path 211 also produces the control signals next_add, next_dbgr, load_reg, read and write that are used in subsystems 60, 64, 62, 90 and 92. The datapath8kby8 circuit 212 generates the additional outputs BIST_DONE, BIST_BUSY and phase2. FIGS. 47 and 47B show how the control path 211 is in turn composed of next state logic 213, output logic 214, and eleven D flip-flops. The flip-flops drive the state bit signals A, B and C, the data path control signals next_addr, next_dbgr, load_reg, read and write, and the signals clear_read, latch_read and BIST_DONE. FIGS. 48A, 48B and 48C show how the output control 214 is implemented using combinational gates and 2-to-1 multiplexers. Similarly, FIGS. 49A and 49B show how the next state logic 213 is implemented using combinational gates and 2-to-1 multiplexers. FIG. 50 shows how the datapath8kby8 circuit 212. The phase2 signal is driven by D flip-flop 213. The doneread signal is implemented using a set-reset latch 214. Thus doneread can be asynchronously set by latchread and asynchronously reset by clear_read. The control interface signals BIST_BUSY and BIST_DONE are in turn implemented using S-R latches 215 and 216, respectively.

A person skilled in the art could make immaterial modifications to the invention described and claimed in this patent without departing from the essence of the invention.

The embodiments of the invention in which an exclusive property or privilege is claimed are defined as follows:

1. A method of testing a random access memory (RAM) having n cells, each cell being identified by an address, and each cell having a value, the value having a complement, for single V-coupling faults where $n \geq V \geq 2$, the method comprising the steps of:

establishing a first current value for each cell;

for each cell and for each of m data backgrounds including an mth background, generating a background code logic bit corresponding to an element of an (n, V−1)-exhaustive matrix including the steps of (a) initially constructing an ($n_0$, V−1)-exhaustive matrix where $n_0 \leq n$, the matrix having $n_0$ rows and $m_0$ columns, and (b) constructing at least a portion of the (n, V−1)-exhaustive matrix from the ($n_0$, V−1)-exhaustive matrix;

for each of m data backgrounds;
(1) applying a sequence to each cell as follows:
(a) reading the current value of the cell,
(b) writing to the cell a logical function of the background code logic bit and the first current value of the cell;
(c) reading the cell to determine the value of the cell after the writing operation in step b;
(d) writing the complement of the value of the cell determined in step b to the cell; and
(2) for each background except the mth background, updating the current value of all cells according to the background code logic bits corresponding to that cell;

reading each cell of the RAM; and discarding or repairing the RAM if a cell coupling fault is apparent from the values read from the cells of the RAM during steps 1(a) and 1(c).

2. The method of claim 1 in which the logical function is for each cell a bit corresponding to the complement of the element of the (n, V−1)-exhaustive matrix irrespective of the current value of the cell.

3. The method of claim 1 in which detection of cell coupling faults is carried out at the time each cell is read by comparison with cell content of a known perfect RAM.

4. The method of claim 1 in which the logical function is an exclusive-or of the complement of the background code logic bit and the first current value of the cell.

5. The method of claim 4 in which detection of cell coupling faults is carried out by comparing values read from the cell at different parts of the test where the same value should be returned in a good memory.

6. The method of claim 1 in which generating a bit corresponding to an element of an (n, V−1)-exhaustive matrix includes row rotating the stored ($n_0$, V−1)-exhaustive matrix according to the background and cell address.

7. The method of claim 6 in which generating a background code logic bit corresponding to an element of the (n, V−1)-exhaustive matrix includes:

integer dividing the background by $m_0$ to produce a value i;

integer dividing the cell address by $n_0$ to produce a value j; and row rotating the ($n_0$, V−1) matrix by the product of i and j modulo $n_0$.

8. Apparatus for testing a random access memory (RAM) having n cells, each cell being identified by a cell address, for V-coupling faults where $n \geq V \geq 2$, the apparatus comprising:

a PROM containing background code logic bits corresponding to an ($n_0$, V−1)-exhaustive matrix where $n_0$ is less than n, the matrix having $n_0$ rows and $m_0$ columns; and generator means to generate a background code logic bit corresponding to an element of an (n, V−1)-exhaustive matrix on the fly from the background code logic bits in the PROM and to selectively apply the generated background code logic bit to the RAM.

9. The apparatus of claim 8 in which the PROM forms a replaceable element separate from the generator means.

10. The apparatus of claim 8 further including multiple PROMS arranged in parallel.

11. The apparatus of claim 8 in which the generator means includes means to row rotate the stored $(n_0, V-1)$-exhaustive matrix according to the cell address.

12. The apparatus of claim 11 in which the generator means includes means to integer divide the background by $m_0$ to produce a value i; integer divide the cell address by $n_0$ to produce a value j; and row rotate the $(n_0, V-1)$ matrix by the product of i and j modulo $n_0$.

13. Built in apparatus for testing a random access memory (RAM) having n cells, each cell being identified by an address, for single V-coupling faults where $n \geq V \geq 2$, the apparatus comprising:

a RAM;

a RAM address generator;

a background code logic generator connected to receive RAM addresses from the address generator and having pseudo-random background code logic bit output;

the background code logic generator including means to select the background code logic bit for application to a cell from a hashing function of the RAM address of the cell to reduce the address of the cell to a single bit;

a test pattern generator connected to receive RAM addresses from the RAM address generator and connected to receive output from the background code logic generator and having test pattern output forming an (n, V–1)-exhaustive code including m data backgrounds for each cell of the RAM;

a controller for sequentially writing the test pattern output to the RAM and reading the cells of the RAM; and a response analyzer connected to receive the read content of the cells of the RAM.

14. The apparatus of claim 13 in which the background code logic generator includes:

means to select the background code logic bit for application to a cell from a hashing of the RAM address of the cell.

15. The apparatus of claim 13 in which the means to select the background code logic bit is responsive to the value of the data background.

16. The apparatus of claim 13 in which the means to select the background code logic bit forms an XOR of at least two address bits.

17. The apparatus of claim 13 in which the means to select the background code logic bit includes:

an all bit generator for generating all bit pairs in the address of the cell, each bit pair including a left bit and a right bit;

a first multiplexer having a first output, the first multiplexer being connected to receive the left bit, logical 0 and the cell address;

a second multiplexer having a second output, the second multiplexer being connected to receive the right bit, logical 0 and the cell address; and an XOR gate connected to receive the first output and the second output.

18. The apparatus of claim 17 in which the first and second multiplexers are controlled by the data background, and a hashing of the data background is applied to the XOR gate.

19. A method of testing a random access memory (RAM) having n cells, each cell being identified by an address, and each cell having a value, the value having a complement, for single V-coupling faults where $n \geq V \geq 2$, the method comprising the steps of:

establishing a first current value for each cell;

for each cell and for each of m data backgrounds including an mth background, generating a background code logic bit corresponding to an element of an (n, V–1)-exhaustive matrix including the step of pseudo-randomly selecting a background code logic bit by applying a hashing function to the address of the cell to reduce the address of the cell to a single bit binary value;

for each of m data backgrounds;

(1) applying a sequence to each cell as follows:
(a) reading the current value of the cell,
(b) writing to the cell a logical function of the background code logic bit and the first current value of the cell;
(c) reading the cell to determine the value of the cell after the writing operation in step b;
(d) writing the complement of the value of the cell determined in step b to the cell; and (2) for each background except the mth background, updating the current value of all cells according to the background code logic bits corresponding to that cell;

reading each cell of the RAM; and discarding or repairing the RAM if a cell coupling fault is apparent from the values read from the cells of the RAM during steps 1(a) and 1(c).

20. The method of claim 19 in which pseudo-randomly selecting a background code logic bit includes selecting the background code logic bit under control of the data background.

21. The method of claim 19 in which the logical function is for each cell a bit corresponding to the complement of the element of the (n, V–1)-exhaustive matrix irrespective of the current value of the cell.

22. The method of claim 19 in which detection of cell coupling faults is carried out at the time each cell is read by comparison with cell content of a known perfect RAM.

23. The method of claim 19 in which the logical function is an exclusive-or of the complement of the background code logic bit and the first current value of the cell.

24. The method of claim 19 in which hashing the address of the cell includes summing bits in the cell address.

25. The method of claim 19 in which the hashing of the address of the cell includes:

forming the XOR of at least two address bits.

26. The method of claim 25 in which forming the XOR of at least two address bits includes:

generating bit pairs in the address of the cell, each bit pair including a left bit and a right bit;

applying the left bit, logical 0 and the cell address to a first multiplexer having a first output;

applying the right bit, logical 0 and the cell address to a second multiplexer having a second output; and applying the first output and the second output to an XOR gate.

27. The method of claim 26 in which the first and second multiplexers are controlled by the data background, and output of a hashing function over the data background is also applied to the XOR gate.

* * * * *